US010696845B2

(12) United States Patent
Noda et al.

(10) Patent No.: US 10,696,845 B2
(45) Date of Patent: Jun. 30, 2020

(54) ENERGY-SENSITIVE RESIN COMPOSITION

(71) Applicant: TOKYO OHKA KOGYO CO., LTD., Kawasaki-shi (JP)

(72) Inventors: Kunihiro Noda, Kawasaki (JP); Hiroki Chisaka, Kawasaki (JP); Dai Shiota, Kawasaki (JP)

(73) Assignee: TOKYO OHKA KOGYO CO., LTD., Kawasaki-Shi (JP)

( * ) Notice: Subject to any disclaimer, the term of this patent is extended or adjusted under 35 U.S.C. 154(b) by 132 days.

(21) Appl. No.: 15/558,434

(22) PCT Filed: Mar. 24, 2016

(86) PCT No.: PCT/JP2016/059427
§ 371 (c)(1),
(2) Date: Sep. 14, 2017

(87) PCT Pub. No.: WO2016/158679
PCT Pub. Date: Oct. 6, 2016

(65) Prior Publication Data
US 2019/0225804 A1 Jul. 25, 2019

(30) Foreign Application Priority Data

Mar. 27, 2015 (JP) ................................ 2015-067031
Apr. 24, 2015 (JP) ................................ 2015-089214
Aug. 7, 2015 (JP) ................................ 2015-157747
Oct. 13, 2015 (JP) ................................ 2015-202460

(51) Int. Cl.

| | |
|---|---|
| C08L 79/08 | (2006.01) |
| C08K 5/3445 | (2006.01) |
| C08G 12/06 | (2006.01) |
| C08L 79/04 | (2006.01) |
| G03F 7/038 | (2006.01) |
| C08G 73/10 | (2006.01) |
| C08K 5/101 | (2006.01) |
| C08K 5/3415 | (2006.01) |
| C08L 77/06 | (2006.01) |

(52) U.S. Cl.
CPC ............ *C08L 79/08* (2013.01); *C08G 12/06* (2013.01); *C08G 73/105* (2013.01); *C08G 73/1042* (2013.01); *C08G 73/1071* (2013.01); *C08G 73/1078* (2013.01); *C08K 5/101* (2013.01); *C08K 5/3415* (2013.01); *C08K 5/3445* (2013.01); *C08L 77/06* (2013.01); *C08L 79/04* (2013.01); *G03F 7/0387* (2013.01); *C08L 2203/16* (2013.01)

(58) Field of Classification Search
None
See application file for complete search history.

(56) References Cited

U.S. PATENT DOCUMENTS

| | | | |
|---|---|---|---|
| 9,410,055 B2 | 8/2016 | Honda | |
| 9,768,328 B2 | 9/2017 | Komatsu et al. | |
| 2013/0079490 A1 | 3/2013 | Matsumoto et al. | |
| 2013/0324662 A1 | 12/2013 | Honda | |
| 2014/0224318 A1 | 8/2014 | Komatsu et al. | |
| 2014/0234784 A1 | 8/2014 | Chisaka et al. | |
| 2015/0086753 A1 | 3/2015 | Matsumoto et al. | |
| 2017/0313821 A1 | 11/2017 | Oka et al. | |
| 2017/0342215 A1 | 11/2017 | Oka et al. | |
| 2018/0194930 A1* | 7/2018 | Noda | ................... C08K 5/3445 |
| 2018/0223045 A1* | 8/2018 | Noda | .................. C08G 73/1085 |
| 2019/0062503 A1* | 2/2019 | Komatsu | .................... C08J 5/18 |

FOREIGN PATENT DOCUMENTS

| | | |
|---|---|---|
| EP | 3228641 A1 | 10/2017 |
| JP | S59-223725 A | 12/1984 |
| JP | S61-267030 A | 11/1986 |
| JP | H06-234668 A | 8/1994 |

(Continued)

OTHER PUBLICATIONS

Wong et al (New Investigation of 1-Substituted Imidazole Derivatives as Thermal Latent Catalysts for Epoxy-Phenolic Resins, Journal of Applied Polymer Science, vol. 104, 3292-3300 (2007)) (Year: 2007).*
Kusama et al., Soluble Polyimides with Polyalicydic Structure. 3.[1] Polyimides from (4arH,8acH)-Decahydro-lt,4t:5c,8c-dimethanonaphthalene-2t ,3t,6c, 7 c-tetracarboxylic 2,3:6,7-Dianhydride Macromolecules, vol. 27, 1994, p. 1117.
Engineering plastic, Kyoritsu Shuppan, 1987, p. 88.
Supplementary European search report issued in European Patent Application No. 16835145.0, dated Sep. 18, 2018.
Office Action issued in U.S. Appl. No. 15/749,921, dated Aug. 2, 2019.

(Continued)

*Primary Examiner* — Rachel Kahn
(74) *Attorney, Agent, or Firm* — Knobbe Martens Olson & Bear LLP

(57) ABSTRACT

An energy-sensitive resin composition with which it is possible, even if the precursor polymer is heat-treated at low temperatures, to produce a film or molded article comprising an imide ring-containing polymer having excellent heat resistance, tensile elongation and chemical resistance with a low dielectric constant, or a film or molded article comprising an oxazole ring-containing polymer having excellent heat resistance, tensile elongation and chemical resistance. A method of manufacturing the film or molded article; a method of forming a pattern using the energy-sensitive resin composition; and a permanent film having excellent heat resistance, tensile elongation and chemical resistance. The energy-sensitive resin composition includes an imidazole compound, a resin precursor component, and a solvent, the resin precursor component being at least one of a monomer component including a diamine compound, a dicarbonyl compound and/or a tetracarboxylic acid dianhydride; and a precursor polymer having a repeating unit.

17 Claims, No Drawings

(56) References Cited

FOREIGN PATENT DOCUMENTS

| JP | H10-330615 A | 12/1998 | | |
|---|---|---|---|---|
| JP | H04-085363 A | 1/2000 | | |
| JP | 2006-189591 A | 7/2006 | | |
| JP | 2008-216988 A | 9/2008 | | |
| JP | 2009-019113 A | 1/2009 | | |
| JP | 2014-157297 A | 8/2014 | | |
| JP | 2014-157310 A | 8/2014 | | |
| JP | 2015-227990 A | 12/2015 | | |
| JP | 2016-102147 A | 6/2016 | | |
| JP | 2017-005026 A | 1/2017 | | |
| WO | WO-2011010619 A1 * | 1/2011 | ........... | C07D 233/61 |
| WO | WO 2011/099518 A1 | 8/2011 | | |
| WO | WO 2012/137840 A1 | 10/2012 | | |
| WO | WO 2013/021942 A1 | 2/2013 | | |
| WO | WO 2013/168691 A1 | 11/2013 | | |
| WO | WO 2015/080158 A1 | 6/2015 | | |
| WO | WO 2016/063988 A1 | 4/2016 | | |
| WO | WO 2016/063993 A1 | 4/2016 | | |
| WO | WO 2016/093254 A1 | 6/2016 | | |

OTHER PUBLICATIONS

"Sun Guishu Guide to High School Chemistry. Revised Edition", Sun Guishu, Educational Sciences Press, p. 320, published Jun. 30, 1995.

"Basic Chemistry", choi Kin-wah, guangxi People Publishing House, pp. 120-123, published date Aug. 31, 2014.

Office Action issued in Chinese Patent Application No. 201680046226.2, dated Feb. 3, 2020.

* cited by examiner

ENERGY-SENSITIVE RESIN COMPOSITION

This application is the U.S. National Phase under 35 U.S.C. § 371 of International Application PCT/JP2016/059427, filed Mar. 24, 2016, designating the U.S., and published in Japanese as WO 2016/158679 on Oct. 6, 2016, which claims priority to Japanese Patent Application No. 2015-067031, filed Mar. 27, 2015; Japanese Patent Application No. 2015-089214, filed Apr. 24, 2015; Japanese Patent Application No. 2015-157747, filed Aug. 7, 2015; and Japanese Patent Application No. 2015-202460, filed Oct. 13, 2015, the entire contents of which are incorporated herein by reference.

TECHNICAL FIELD

The present invention relates to an energy-sensitive resin composition comprising a precursor polymer of an imide ring- and/or oxazole ring-containing polymer such as a polyimide resin and a polybenzoxazole resin as well as/or a monomer component of the precursor polymer, a method of manufacturing a film or a molded article using the energy-sensitive resin composition, a method of forming a pattern using the energy-sensitive resin composition, as well as a permanent film.

BACKGROUND ART

Since a polyimide resin has characteristics such as excellent heat resistance, mechanical strength and insulation property, and low dielectric constant, a polyimide resin is used widely as an insulating material or protective material in electric or electronic parts including various elements or electronic substrates such as multilayered wiring board. Also, in order to selectively insulate or protect a minute point in precision electric or electronic parts, polyimide resin which has been provided with patterning to a desired shape is used.

Generally, a polyimide resin is an imide ring-containing polymer formed by subjecting polyamic acid obtained by polymerizing a tetracarboxylic dianhydride component and a diamine component in a polar organic solvent to heat treatment at a high temperature of approximately 300° C. Therefore, polyimide products for an electronic material are often supplied as a solution of a polyimide precursor, such as polyamic acid. In producing electric or electronic parts, a solution of a polyimide precursor is supplied to a site where an insulating material or protective material is to be formed by a method such as coating or injection, etc. and thereafter the solution of the polyimide precursor is subjected to heat treatment at a high temperature of approximately 300° C. to form the insulating material or protective material.

Conventional methods for forming an insulating material or protective material made of a polyimide resin from a polyimide precursor have problems in which such conventional methods are not applicable to material which is weak to heat, because the conventional methods require heat treatment at a high temperature. Accordingly, a polyimide precursor composition which is capable of forming a polyimide resin by the treatment at a low temperature, for example, approximately 200° C., has been developed (for example, Patent Document 1).

On the other hand, since polybenzoxazole resin has excellent heat resistance, mechanical strength, insulation property, dimensional stability, and the like, they are used as not only fiber or film, but also as an insulating material or a protective material in electric or electronic parts including various elements or electronic substrates such as multilayered wiring board.

Generally, polybenzoxazole resin is an oxazole ring-containing polymer formed by subjecting a precursor polymer obtained by polymerizing an aromatic diamine diol having an amino group and a hydroxyl group on the adjacent carbon atoms in the aromatic ring, a dialdehyde compound, and a dicarbonyl compounds such as dicarboxylic acid dihalide, in organic solvent such as N-methyl-2-pyrrolidone (NMP), dimethylacetamide (DMAc) and dimethylformamide (DMF) to heat treatment at a high temperature of approximately 300° C.

Specific examples of the thus produced oxazole ring-containing polymer include polybenzoxazole resin formed by subjecting a solution of a precursor obtained by reacting aromatic diamine diol having an amino group and a hydroxyl group on the adjacent carbon atoms in the aromatic ring with di(4-formylphenyl)alkane or di(4-halocarbonyl phenyl)alkane in dimethylformamide to heat treatment at a high temperature, in which the temperature is increased from 200° C. to finally 300° C. (for example, Patent Document 2).

Furthermore, use of a polymer including both an imide ring and an oxazole ring for a positive photosensitive resin composition has been proposed (for example, Patent Document 3).

Patent Document 1: Japanese Unexamined Patent Application, Publication No. 2009-19113
Patent Document 2: PCT International Publication No. WO2012/137840
Patent Document 3: Japanese Unexamined Patent Application, Publication No. 2014-157297

DISCLOSURE OF THE INVENTION

Problems to be Solved by the Invention

However, there is a problem that in a case where a precursor polymer is heated at a low temperature such as lower than 200° C., heat resistance, tensile elongation, as well as chemical resistance of the resulting imide ring- and/or oxazole ring-containing polymer may be damaged. There is also a problem that the dielectric property of polyimide resin may be increased.

The present invention has been made in view of the above-mentioned problems and aims to provide an energy-sensitive resin composition with which it is possible, even if the precursor polymer is heat-treated at low temperatures, to produce a film or molded article comprising an imide ring-containing polymer having excellent heat resistance, tensile elongation and chemical resistance and having a low dielectric constant, or a film or molded article comprising an oxazole ring-containing polymer having excellent heat resistance, tensile elongation and chemical resistance. Also provided are a method of manufacturing the film or the molded article; a method of forming a pattern using the energy-sensitive resin composition; and a permanent film having excellent heat resistance, tensile elongation and chemical resistance.

Means for Solving the Problems

The present inventors have conducted intensive research to solve the above-mentioned problems. As a result, the inventors found that the above-mentioned problems can be solved by adding a new imidazole compound to a composition comprising a precursor polymer of an imide ringand/or oxazole ring-containing polymer such as polyimide resin, polybenzoxazole resin, and the like, and/or a monomer component of the precursor polymer. Specifically, the present invention provides the following.

The first aspect of the present invention relates to an energy-sensitive resin composition comprising an imidazole compound (A) represented by the following formula (1a), a resin precursor component (B), and a solvent (S), wherein the resin precursor component (B) is at least one selected from the group consisting of a diamine compound represented by the following formula (2), a monomer component comprising a dicarbonyl compound represented by the following formula (3a) and/or a tetracarboxylic dianhydride represented by the following formula (3b), and a precursor polymer having a repeating unit represented by the following formula (4):

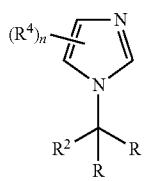
(1a)

(Wherein R each independently represents a monovalent organic group, $R^2$ represents an optionally substituted aromatic group, $R^4$ each independently represents a halogen atom, a hydroxyl group, a mercapto group, a sulfide group, a silyl group, a silanol group, a nitro group, a nitroso group, a sulfonato group, a phosphino group, a phosphinyl group, a phosphonato group, or an organic group, n is an integer from 0 to 3; and the above-mentioned R may be bonded to the other R or $R^2$ to form a cyclic structure.)

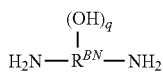
(2)

(Wherein $R^{BN}$ represents an organic group having a valence of (2+q), and q is an integer from 0 to 2.)

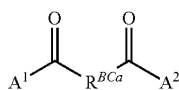
(3a)

(Wherein $R^{BCa}$ represents a divalent organic group, and $A^1$ and $A^2$ each independently represents a hydrogen atom or a halogen atom.)

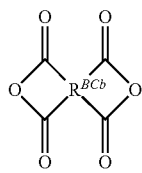
(3b)

(Wherein $R^{BCb}$ represents a tetravalent organic group.)

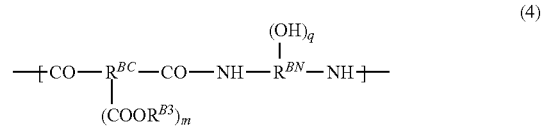
(4)

(Wherein $R^{BN}$ and q are as defined above, $R^{BC}$ represents an organic group having a valence of (2+m), $R^{B3}$ represents a hydrogen atom or a monovalent organic group having 1 to 20 carbon atoms, and m is an integer from 0 to 2, wherein m+q>0 is satisfied.)

The second aspect of the present invention is a method of manufacturing a film or a molded article comprising an imide ring- and/or oxazole ring-containing polymer, the method comprising: a formation step of forming a coating film or a molded article comprising the energy-sensitive resin composition of the first aspect of the present invention, and a ring closure step of ring-closing a resin precursor component (B) in the coating film or the molded article by subjecting the coating film or the molded article to exposure or heating.

The third aspect of the present invention is a method of forming a pattern, and the method includes: a formation step of forming a coating film or a molded article comprising the energy-sensitive resin composition of the first aspect of the present invention; an exposure step of selectively exposing the coating film or the molded article; a development step of developing the coating film or the molded article after the exposing, and a heating step of heating the coating film or the molded article after the developing.

The fourth aspect of the present invention is a permanent film comprising: an imidazole compound (A) represented by formula (1a); and an imide ring- and/or oxazole ring-containing polymer obtained by ring-closing a precursor polymer including a repeating unit represented by the following formula (4) as a main component:

(1a)

(Wherein R each independently represents a monovalent organic group, $R^2$ represents an optionally substituted aromatic group, $R^4$ each independently represents a halogen atom, a hydroxyl group, a mercapto group, a sulfide group, a silyl group, a silanol group, a nitro group, a nitroso group, a sulfonato group, a phosphino group, a phosphinyl group, a phosphonato group, or an organic group, and n is an integer from 0 to 3; and the R may be bonded to the other R or $R^2$ to form a cyclic structure.)

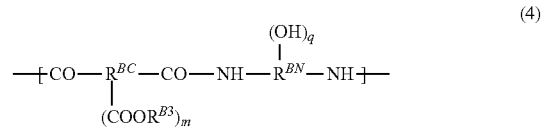
(4)

(wherein $R^{BN}$ represents an organic group having a valence of (2+q); q is an integer from 0 to 2; $R^{BC}$ represents an organic group having a valence of (2+m); $R^{B3}$ represents a hydrogen atom or a monovalent organic group having 1 to 20 carbon atoms; and m is an integer from 0 to 2, wherein m+q>0 is satisfied.)

Effects of the Invention

The present invention can provide an energy-sensitive resin composition with which it is possible, even if the precursor polymer is heat-treated at low temperatures, to produce a film or molded article comprising an imide ring-containing polymer having excellent heat resistance, tensile elongation and chemical resistance with a low dielectric constant, or a film or molded article comprising an oxazole ring-containing polymer having excellent heat resistance, tensile elongation and chemical resistance; a method of manufacturing the film or the molded article; a method of forming a pattern using the energy-sensitive resin composition; and a permanent film having excellent heat resistance, tensile elongation and chemical resistance.

PREFERRED MODE FOR CARRYING OUT THE INVENTION

<<Energy-Sensitive Resin Composition>>

An energy-sensitive resin composition according to the first aspect of the present invention comprises an imidazole compound (A) represented by the formula (1a), a resin precursor component (B), and a solvent (S).

<Imidazole Compound (A)>

An imidazole compound (A) is represented by the formula (1a).

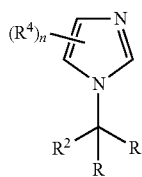

(Wherein R each independently represents a monovalent organic group, $R^2$ represents an optionally substituted aromatic group, $R^4$ each independently represents a halogen atom, a hydroxyl group, a mercapto group, a sulfide group, a silyl group, a silanol group, a nitro group, a nitroso group, a sulfonato group, a phosphino group, a phosphinyl group, a phosphonato group, or an organic group, n is an integer from 0 to 3; and the above-mentioned R may be bonded to the other R or $R^2$ to form a cyclic structure.)

In the formula (1a), R is a monovalent organic group. The monovalent organic group is not particularly limited and examples thereof include a hydrogen atom, an optionally substituted alkyl group, an optionally substituted aromatic group, and the like. This alkyl group may have an ester bond and the like in the chain. The alkyl group may be, for example, the same as that in $R^1$ or the like in the below-mentioned formula (1), and the number of carbon atoms is preferably 1 to 40, more preferably 1 to 30, further preferably 1 to 20, and further more preferably 1 to 10. The substituent which the alkyl group may have may be, for example, the same as the substituent which may be included by an alkylene group as $R^3$ in the below-mentioned formula (1).

The optionally substituted aromatic group is the same as that in $R^2$ in the below-mentioned formula (1), and is preferably an aryl group, and more preferably a phenyl group. An optionally substituted aromatic group as R may be the same as or different from $R^2$. It is preferable that one R in the formula (1a) is a hydrogen atom, and it is more preferable that one R is a hydrogen atom and the other R is an optionally substituted alkyl group or an optionally substituted aromatic group. In the formula (1a), R may be bonded to the other R or $R^2$ to form a cyclic structure. For example, when at least one R is an optionally substituted alkyl group, R may be bonded to the other R or $R^2$ to form a cyclic structure.

The imidazole compound (A) may be a compound represented by the following formula (1).

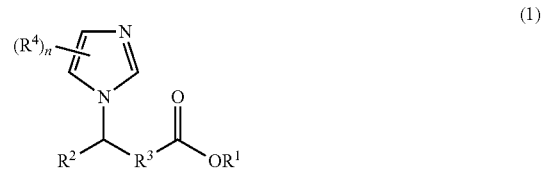

(In the formula (1), $R^1$ is a hydrogen atom or an alkyl group; $R^2$ is an optionally substituted aromatic group; $R^3$ is an optionally substituted alkylene group; $R^4$ is a halogen atom, a hydroxyl group, a mercapto group, a sulfide group, a silyl group, a silanol group, a nitro group, a nitroso group, a sulfonato group, a phosphino group, a phosphinyl group, a phosphonato group, or an organic group; and n is an integer from 0 to 3. $R^3$ may be bonded to $R^2$ to form a cyclic structure.)

In the formula (1), $R^1$ is a hydrogen atom or an alkyl group. When $R^1$ is an alkyl group, the alkyl group may be a straight-chain alkyl group or a branched-chain alkyl group. The number of carbon atoms of the alkyl group is not particularly limited, but it is preferably 1 to 20, preferably 1 to 10, and more preferably 1 to 5.

Specific examples of the suitable alkyl group as $R^1$ include a methyl group, an ethyl group, an n-propyl group, an isopropyl group, an n-butyl group, an isobutyl group, a sec-butyl group, a tert-butyl group, an n-pentyl group, an isopentyl group, a tert-pentyl group, an n-hexyl group, an n-heptyl group, an n-octyl group, a 2-ethyl-n-hexyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, an n-nonadecyl group, and an n-icosyl group.

In the formula (1), $R^2$ is an optionally substituted aromatic group. The optionally substituted aromatic group may be an optionally substituted aromatic hydrocarbon group and may be an optionally substituted aromatic heterocycle group.

Types of the aromatic hydrocarbon group are not particularly limited within a range that does not inhibit the object of the present invention. The aromatic hydrocarbon group may be a monocyclic aromatic group, or a group formed by condensing two or more aromatic hydrocarbon group together, or a group formed by condensing two or more aromatic hydrocarbon groups by a single bond. Preferable examples of the aromatic hydrocarbon group include a phenyl group, a naphthyl group, a biphenyl group, an anthryl group, and a phenanthrenyl group.

Types of the aromatic heterocycle group are not particularly limited within a range that does not inhibit the object of the present invention. The aromatic heterocycle group may be a monocyclic group, or may be a polycyclic group. Preferable examples of the aromatic heterocycle group include a pyridyl group, a furyl group, a thienyl group, an imidazolyl group, a pyrazolyl group, an oxazolyl group, a thiazolyl group, an isooxazolyl group, an isothiazolyl group, a benzoxazolyl group, a benzothiazolyl group, and a benzoimidazolyl group.

Examples of the substituent which the phenyl group, the polycyclic aromatic hydrocarbon group, or the aromatic heterocycle group may have include a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group, an amino group, an ammonio group, and an organic group. When the phenyl group, a polycyclic aromatic hydrocarbon group, or the aromatic heterocycle group has a plurality of substituents, the plurality of substituents may be the same as or different from each other.

When the substituents which an aromatic group has is an organic group, examples of the organic group include an alkyl group, an alkenyl group, a cycloalkyl group, a cycloalkenyl group, an aryl group, an aralkyl group, and the like. The organic group may include, in the organic group, a bond or a substituent, other than a hydrocarbon group, such as a heteroatom. Furthermore, the organic group may be any of a straight chain, a branched chain, and a cyclic. The organic group is generally monovalent, but when it forms a cyclic structure, it may be an organic group having a valence of two or more.

When the aromatic group has a substituent on adjacent carbon atoms, the two substituents bonded to the adjacent carbon atoms may be bonded to each other to form a cyclic structure. Examples of the cyclic structure include an aliphatic hydrocarbon ring and an aliphatic ring including a heteroatom.

When the substituent which the aromatic group has is an organic group, the bond included in the organic group is not particularly limited as long as the effect of the present invention is not impaired, and an organic group may include a bond including heteroatoms such as an oxygen atom, a nitrogen atom, and a silicon atom. Specific examples of the bond including heteroatoms include an ether bond, a thioether bond, a carbonyl bond, a thiocarbonyl bond, an ester bond, an amide bond, a urethane bond, an imino bond (—N=C(—R)—, —C(=NR)—: R represents a hydrogen atom or an organic group), a carbonate bond, a sulfonyl bond, sulfinyl bond, an azo bond, and the like.

As the bond including a heteroatom which an organic group may have, from the viewpoint of the heat resistance of the imidazole compound represented by the formula (1a) or the formula (1), an ether bond, a thioether bond, a carbonyl bond, a thiocarbonyl bond, an ester bond, an amide bond, an amino bond (—NR—: R represents a hydrogen atom or a monovalent organic group), a urethane bond, an imino bond (—N=C(—R)—, —C(=NR)—: R represents a hydrogen atom or a monovalent organic group), a carbonate bond, a sulfonyl bond, and a sulfinyl bond, are preferable.

When the organic group is a substituent other than a hydrocarbon group, the types of the substituent other than the hydrocarbon group is not particularly limited within a range that does not inhibit the object of the present invention. Specific examples of the substituent other than the hydrocarbon group include a hydrogen atom, a halogen atom, a hydroxyl group, a mercapto group, a sulfide group, a cyano group, an isocyano group, a cyanato group, an isocyanato group, a thiocyanato group, an isothiocyanato group, a silyl group, a silanol group, an alkoxy group, an alkoxycarbonyl group, an amino group, a monoalkylamino group, a dialkylamino group, a monoarylamino group, a diarylamino group, a carbamoyl group, a thiocarbamoyl group, a nitro group, a nitroso group, a carboxylato group, an acyl group, an acyloxy group, a sulfino group, a sulfonato group, a phosphino group, a phosphinyl group, a phosphonato group, an alkyl ether group, an alkenyl ether group, an alkylthio ether group, an alkenyl thioether group, an aryl ether group, an arylthio ether group, and the like. The hydrogen atom included in the substituent may be substituted by a hydrocarbon group. Furthermore, the hydrogen group included in the substituent may be any of a straight chain, a branched chain, and cyclic.

As the substituent which the phenyl group, polycyclic aromatic hydrocarbon group, or aromatic heterocycle group have, an alkyl group having 1 to 12 carbon atoms, an aryl group having 1 to 12 carbon atoms, an alkoxy group having 1 to 12 carbon atoms, an aryloxy group having 1 to 12 carbon atoms, an arylamino group having 1 to 12 carbon atoms, and a halogen atom are preferable.

Preferable examples of $R^2$ include a phenyl group, a furyl group, and a thienyl group, which may have a substituent, respectively, from the viewpoint that imidazole compounds represented by the formula (1a) or the formula (1) can be synthesized at a low cost and easily, and has good solubility of imidazole compounds in water or an organic solvent.

In the formula (1), $R^3$ is an alkylene group which may have a substituent. The substituent which an alkylene group may have is not particularly limited within a range that does not inhibit the object of the present invention. Specific examples of the substituent which an alkylene group may have include a hydroxyl group, an alkoxy group, an amino group, a cyano group, a halogen atom, and the like. The alkylene group may be a straight-chain alkylene group or may be a branched-chain alkylene group. The straight chain-alkylene group is preferable. The number of carbon atoms of alkylene group is not particularly limited, but the number is preferably 1 to 20, more preferably 1 to 10, and further more preferably 1 to 5. Note here that the number of carbon atoms of the alkylene group does not include carbon atoms of substituent bonded to the alkylene group.

An alkoxy group as the substituent bonded to the alkylene group may be a straight-chain alkoxy group, and a branched-chain alkoxy group. The number of carbon atoms of the alkoxy group as the substituent is not particularly limited, but the number preferably 1 to 10, more preferably 1 to 6, and particularly preferably 1 to 3.

An amino group as the substituent bonded to the alkylene group may be a monoalkylamino group or a dialkylamino group. Alkyl groups included in the monoalkylamino group or the dialkylamino group may be a straight-chain alkyl group or a branched-chain alkyl group. The number of carbon atoms of the amino group included in the monoalkyl or dialkylamino group is not particularly limited, but the number is preferably 1 to 10, more preferably 1 to 6, and particularly preferably 1 to 3.

Specific examples of suitable alkylene group as $R^3$ include a methylene group, an ethane-1,2-diyl group, an n-propane-1,3-diyl group, an n-propane-2,2-diyl group, an n-butane-1,4-diyl group, an n-pentane-1,5-diyl group, an n-hexane-1,6-diyl group, an n-heptane-1,7-diyl group, an n-octane-1,8-diyl group, an n-nonane-1,9-diyl group, an n-decane-1,10-diyl group, an n-undecane-1,11-diyl group, an n-dodecane-1,12-diyl group, an n-tridecane-1,13-diyl group, an n-tetradecane-1,14-diyl group, an n-pentadecane-1,15-diyl group, an n-hexadecane-1,16-diyl group, an n-heptadecane-1,17-diyl group, an n-octadecane-1,18-diyl group, an n-nonadecane-1,19-diyl group, and an n-icosane-1,20-diyl group.

$R^4$ represents a halogen atom, a hydroxyl group, a mercapto group, a sulfide group, a silyl group, a silanol group, a nitro group, a nitroso group, a sulfonato group, a phosphino group, a phosphinyl group, a phosphonato group, or an organic group; n is an integer from 0 to 3. When n is an integer from 2 to 3, the plurality of $R^4$ may be the same as or different from each other, respectively.

When $R^4$ is an organic group, the organic group is the same as the organic group which the aromatic group may have as a substituent in $R^2$.

When $R^4$ is an organic group, the organic group is preferably an alkyl group, an aromatic hydrocarbon group, and an aromatic heterocycle group. As the alkyl group, straight-chain or branched-chain alkyl group having 1 to 8 carbon atoms is preferable, and a methyl group, an ethyl group, an n-propyl group, and an isopropyl are more preferable. As the aromatic hydrocarbon group, a phenyl group, a naphthyl group, a biphenyly group, an anthryl group, and a phenanthrenyl group are preferable, a phenyl group and a naphthyl group are more preferable, and a phenyl group is particularly preferable. As the aromatic heterocycle group, a pyridyl group, a furyl group, a thienyl group, an imidazolyl group, a pyrazolyl group, an oxazolyl group, a thiazolyl group, an isooxazolyl group, an isothiazolyl group, a benzoxazolyl group, a benzothiazolyl group, and a benzoimidazolyl group are preferable, a furyl group and thienyl group are more preferable.

When $R^4$ is an alkyl group, the position at which an alkyl group bonds on the imidazole ring is preferably any of position 2, position 4, and position 5, and the position 2 is more preferable. When $R^4$ is an aromatic hydrocarbon group and an aromatic heterocycle group, the position at which these groups bond on the imidazole is preferably position 2.

Among the imidazole compounds represented by the above formula (1a), a compound represented by the following formula (1-1a) is preferable because synthesis can be carried out at a low cost and easily, and the condensation reaction of the component (B) is promoted. Herein, the condensation reaction of the component (B) includes a condensation reaction between the monomer components, and a ring closure reaction in which the below-mentioned ring-containing polymer is to be formed by a precursor polymer (a ring forming polymer mentioned later).

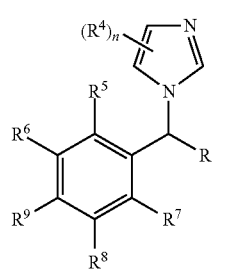

(1-1a)

(In the formula (1-1a), R, $R^4$, and n are as defined for the formula (1a), $R^5$, $R^6$, $R^7$, $R^8$, and $R^9$ each independently represents a hydrogen atom, a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group, an amino group, an ammonio group, or an organic group, wherein at least one of $R^5$, $R^6$, $R^7$, $R^8$, and $R^9$ is a group other than a hydrogen atom. At least two of $R^5$, $R^6$, $R^7$, $R^8$, and $R^9$ may be bonded to each other to form a cyclic structure. R may be bonded to $R^7$ to form a cyclic structure).

$R^5$, $R^6$, $R^7$, $R^8$, and $R^9$ are as defined for the formula (1-1) In the formula (1-1a), R may be bonded to $R^7$ to form a cyclic structure, for example, when R is an optionally substituted alkyl group, R may be bonded to $R^7$ to form a cyclic structure.

Among the imidazole compounds represented by the above formula (1) or the formula (1-1a), compounds represented by the following formula (1-1) are preferable because they can be synthesized at a low cost and easily, and have excellent solubility with respect to water or an organic solvent. A compound represented by the formula (1-1) and in which $R^3$ is a methylene group is more preferable.

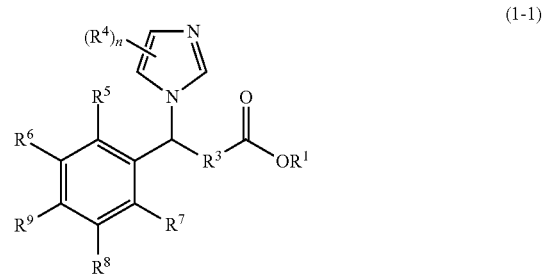

(1-1)

(In the formula (1-1), $R^1$, $R^3$, $R^4$, and n are the same as those in the formula (1); $R^5$, $R^6$, $R^7$, $R^8$, and $R^9$ each independently represents a hydrogen atom, a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group, an amino group, an ammonio group, or an organic group, wherein at least one of $R^4$, $R^6$, $R^7$, $R^8$, and $R^9$ is a group other than a hydrogen atom. At least two of $R^5$, $R^6$, $R^7$, $R^8$, and $R^9$ may be bonded to each other to form a cyclic structure. $R^3$ may be bonded to $R^7$ to form a cyclic structure.)

When $R^5$, $R^6$, $R^7$, $R^8$, and $R^9$ are an organic group, the organic group is the same as an organic group which $R^2$ has as a substituent in the formula (1). $R^5$, $R^6$, $R^7$, and $R^8$ are preferably a hydrogen atom from the viewpoint of solubility of an imidazole compound in a solvent.

Among them, at least one of $R^5$, $R^6$, $R^7$, $R^8$, and $R^9$ is preferably the below-mentioned substituent, and $R^9$ is particularly preferably the below-mentioned substituent. When $R^9$ is the below-mentioned substituent, $R^5$, $R^6$, $R^7$, and $R^8$ are preferably a hydrogen atom. —O—$R^{10}$ (Wherein $R^{10}$ is a hydrogen atom or an organic group.)

When $R^{10}$ is an organic group, the organic group is the same as an organic group which $R^2$ has as a substituent in the formula (1). As $R^{10}$, an alkyl group is preferable, an alkyl group having 1 to 8 carbon atoms is more preferable, an alkyl group having 1 to 3 carbon atoms is particularly preferable, and a methyl group is the most preferable.

Among compounds represented by the above formula (1-1), a compound represented by the following formula (1-1-1) is preferable.

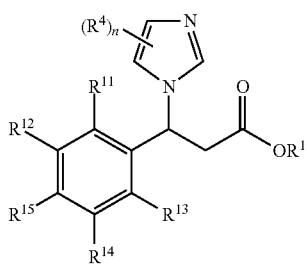

(In the formula (1-1-1), $R^1$ and $R^4$ and n are the same as those in the formula (1); and $R^{11}$, $R^{12}$, $R^{13}$, $R^{14}$, and $R^{15}$ each independently represents a hydrogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group, an amino group, an ammonio group, or an organic group, wherein at least one of $R^{11}$, $R^{12}$, $R^{13}$, $R^{14}$, and $R^{15}$ is a group other than a hydrogen atom.)

Among the compounds represented by the formula (1-1-1), a group in which at least one of $R^{11}$, $R^{12}$, $R^{13}$, $R^{14}$, and $R^{15}$ is a group represented by the above-mentioned —O—$R^{10}$ is preferable, and a group in which $R^{15}$ is a group represented is particularly preferable. In a case where $R^{15}$ is a group represented by —O—$R^{10}$, $R^{11}$, $R^{12}$, $R^{13}$, and $R^{14}$ are preferably a hydrogen atom.

A synthesis method of an imidazole compound represented by the formula (1a) is not particularly limited. For example, an imidazole compound represented by the above formula (1a) can be synthesized by reacting a halide represented by $R^2CR(Hal)R$ ($R^2$ and R are the same as those in the formula (1a), and Hal is a halogen atom) and the below-mentioned imidazole compound represented by the formula (II) with each other in a routine manner to form an imidazolyl.

A synthesis method of an imidazole compound represented by the formula (1) is not particularly limited. For example, an imidazole compound represented by the above formula (1) can be synthesized by reacting a halogen-containing carboxylic acid derivative represented by the following formula (I) and an imidazole compound represented by the following formula (II) with each other by a routine method so as to form imidazolyl.

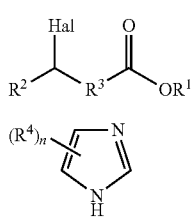

(In the formulae (I) and (II), $R^1$, $R^2$, $R^3$, $R^4$ and n are the same as those in the formula (1), and in the formula (I), Hal is a halogen atom.)

Furthermore, when the imidazole compound is a compound represented by the formula (1) in which $R^3$ is a methylene group, in other words, when the imidazole compound is a compound represented by the following formula (1-2), the imidazole compound can be synthesized by a method by the Michael addition reaction mentioned below.

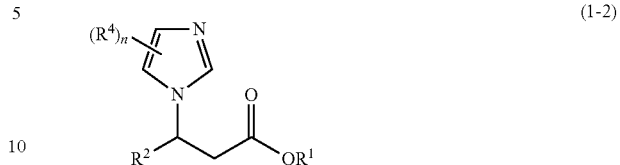

(In the formula (1-2), $R^1$, $R^2$, $R^4$ and n are the same as those in the formula (1)).

Specifically, for example, the imidazole compound represented by the formula (1-2) mentioned above can be obtained by the Michael addition reaction by mixing 3-substituted acrylic acid derivative represented by the following formula (III) and the imidazole compound represented by the above formula (II) in a solvent.

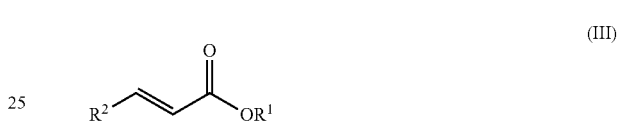

(In the formula (III), $R^1$ and $R^2$ are the same as those in the formula (1)).

Furthermore, the imidazole compound represented by the following formula (1-3) by adding 3-substituted acrylic acid derivative including an imidazolyl group represented by the following formula (IV) into a solvent including water.

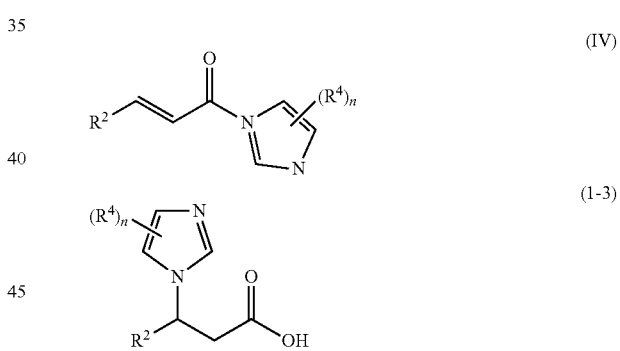

(In the formulae (IV) and (1-3), $R^2$, $R^4$ and n are the same as those in the formula (1).)

In this case, by hydrolysis of 3-substituted acrylic acid derivative represented by the above formula (IV), an imidazole compound represented by the above formula (II) and 3-substituted acrylic acid represented by the following formula (V) are generated. Then, a Michael addition reaction occurs between 3-substituted acrylic acid represented by the following formula (V) and the imidazole compound represented by the above formula (II), and the imidazole compound represented by the above formula (1-3) is generated.

(In the formula (V), R² is the same as that in the formula (1).)
Suitable specific examples of the imidazole compounds represented by the formula (1a) include the following.
Suitable specific examples of the imidazole compounds represented by the formula (1a) or the formula (1) include the following.
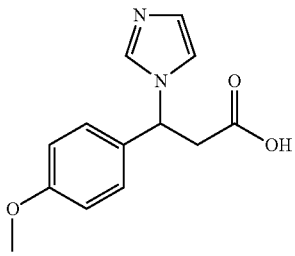
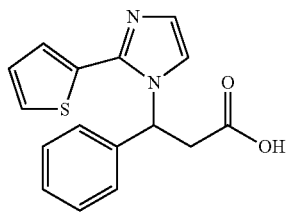
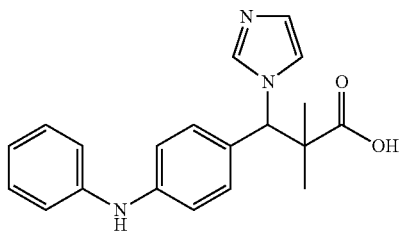
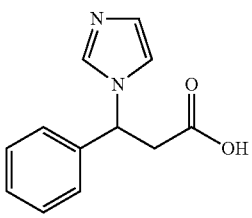 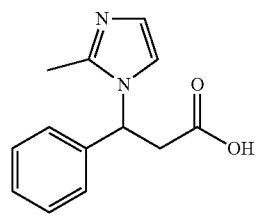
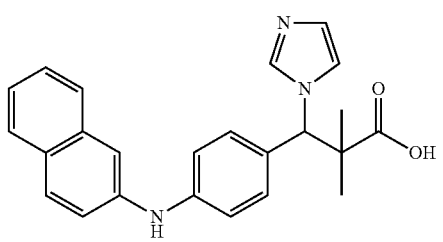
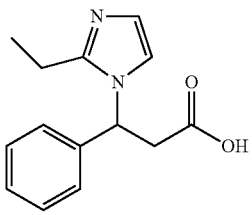
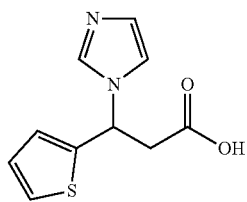
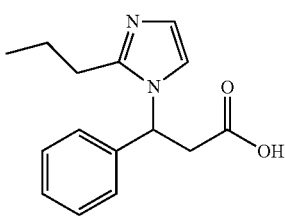
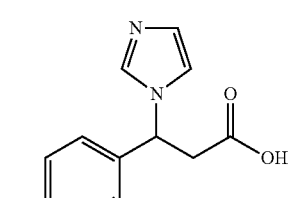
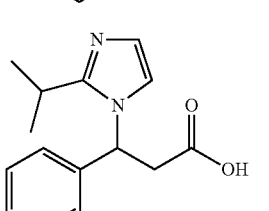
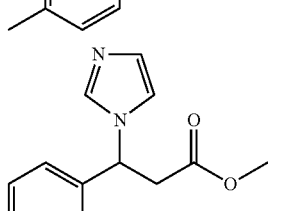
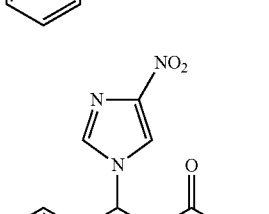
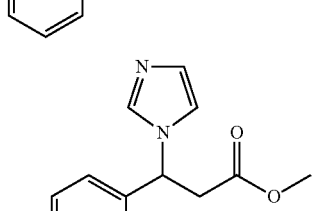
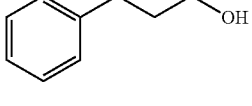
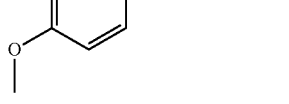

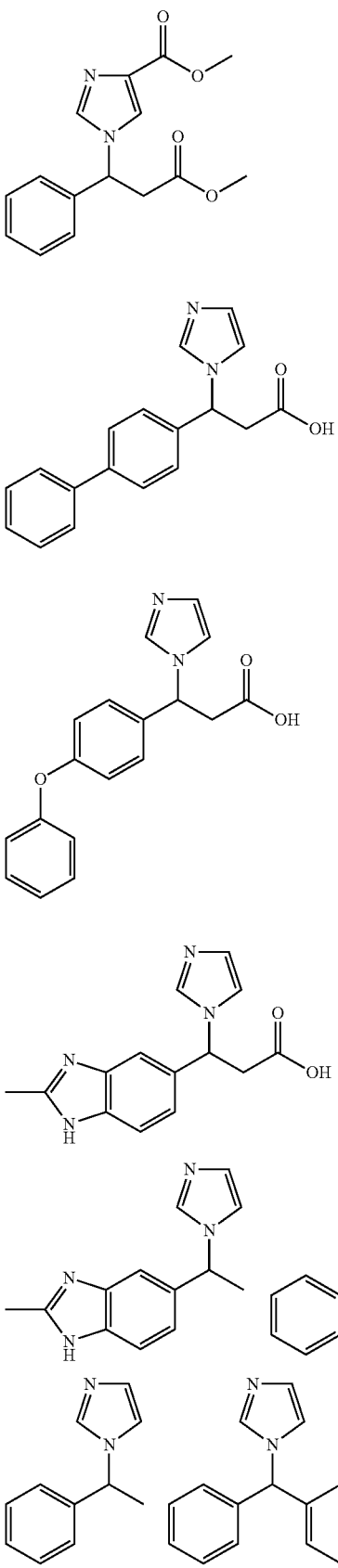

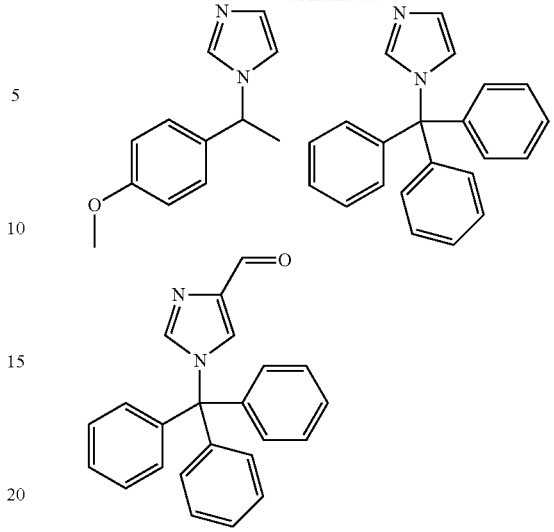

The content of the component (A) in the energy-sensitive resin composition as the first aspect of the present invention is not particularly limited, and it may be a catalyst amount. The content of the component (A) is preferably 0.001 to 20 parts by mass, more preferably 0.01 to 10 parts by mass, and further preferably 0.1 to 5 parts by mass relative to 100 parts by mass of the component (B) mentioned below.

Furthermore, the content rate of the component (A) in the energy-sensitive resin compositions is preferably 0.001 to 20% by mass, more preferably 0.01 to 10% by mass, and further preferably 0.1 to 5% by mass relative to the whole components excluding the component (S). When the component (A) is used as an additive agent, the content of component (A) is preferably 1 part by mass or more relative to 100 parts by mass of the component (B) mentioned below. The upper limit is not particularly limited, and, for example, 60 parts by mass or less. The upper limit is preferably 10 to 50 parts by mass, and more preferably 20 to 40 parts by mass. Furthermore, the content rate of the component (A) in the energy-sensitive resin compositions is preferably 1 to 60% by mass, more preferably, 5 to 55% by mass, and further more preferably 10 to 50% by mass relative to the whole components excluding the component (S).

<Resin Precursor Component (B)>

The resin precursor component (B) comprised in the energy-sensitive resin composition of the present invention is at least one selected from the group consisting of a diamine compound represented by the following formula (2), a monomer component comprising a dicarbonyl compound represented by the following formula (3a) and/or a tetracarboxylic dianhydride represented by the following formula (3b), and a precursor polymer including a repeating unit represented by the following formula (4) as a main component.

<Resin Precursor Component (B)/Monomer Component>
[Diamine Compound]

The diamine compound is represented by the following formula (2). A diamine compound may use one type singly, or may use a combination of two or more thereof.

(2)

(In the formula, $R^{BN}$ represents an organic group having a valence of (2+q), and q is an integer from 0 to 2.)

In the formula (2), $R^{BN}$ represents an organic group having a valence of (2+q), and may include one or a plurality of substituents in addition to two —$NH_2$ and —$(OH)_q$ in the formula (2). As suitable examples of the substituent, a fluorine atom, an alkyl group having 1 to 6 carbon atoms, an alkoxy group having 1 to 6 carbon atoms, a fluorinated alkyl group having 1 to 6 carbon atoms, and a fluorinated alkoxy group having 1 to 6 carbon atoms are preferable, and may include an —OH group, a —COOH group, and a —COOR group in addition to —$(OH)_q$ represented by the formula (2). When the substituent is a fluorinated alkyl group or a fluorinated alkoxy group, a perfluoroalkyl group or a perfluoroalkoxy group is preferable. As to the above-mentioned substituents, the same is true to one or a plurality of substituents which the below-mentioned group represented by any one of the formulas (2-1) to (2-9).

As to $R^{BN}$, the "valence of (2+q)" in the above-mentioned "organic group having a valence of (2+q)" shows that the number of binding arms which the $R^{BN}$ represented by the formula (2) has is (2+q), in other words, arms bonded to two —$NH_2$ and —$(OH)_q$ represented by the formula (2) is (2+q) in total. When $R^{BN}$ itself includes other substituents, the binding arms to the substituents are not included in the number of valences in "the valence of (2+q)".

In the formula (2) the lower limit value of the number of carbon atoms of the organic group having a valence of (2+q) as $R^{BN}$ is preferably 2, and more preferably 6, and the upper limit value thereof is preferably 50 and more preferably 30. $R^{BN}$ may be an aliphatic group, but is preferably an organic group having a valence of (2+q) including one or more aromatic rings. In the above formula (2), when $R^{BN}$ is an organic group having a valence of (2+q) including one or more aromatic ring and q is 1 or 2, an amino group and a hydroxyl group of each pair constituting one or two pairs of amino groups and hydroxyl groups included in the diamine compound represented by the formula (2) are preferably bonded to the two carbon atoms adjacent to the aromatic ring included in $R^{BN}$.

$R^{BN}$ may be an aromatic group, and two or more aromatic groups may be a group bonded via bond including an aliphatic hydrocarbon group and a halogenated aliphatic hydrocarbon group or heteroatoms such as an oxygen atom, a sulfur atom, and a nitrogen atom. Examples of the bond including heteroatoms such as an oxygen atom, a sulfur atom, and a nitrogen atom included in $R^{BN}$ include —CONH—, —NH—, —N=N—, —CH=N—, —COO—, —O—, —CO—, —SO—, —$SO_2$-, —S—, —S—S—, and the like, and —O—, —CO—, —SO—, —$SO_2$—, —S—, and —S—S— are preferable. The aromatic ring included in $R^{BN}$ may be an aromatic heterocycle. The aromatic ring bonded to an amino group and a hydroxyl group in $R^{BN}$ is preferably a benzene ring. When a ring bonded to an amino group and a hydroxyl group in $R^{BN}$ is a condensed ring including two or more rings, the ring bonded to the amino group and the hydroxyl group in the condensed ring is preferably a benzene ring.

Suitable examples of $R^{BN}$ include groups represented by any one of groups represented by the following formulae (2-1) to (2-9). The following formulae (2-1) to (2-9) show cases where the aromatic ring is left and right two binding arms respectively bonded to an amino group and a hydroxyl group in the formula (2) and q in the formula (2) is 2 as examples. However, when at least one of left and right one binding arm, any one of the binding arms may not be included depending upon the value of q.

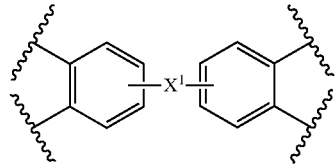 (2-1)

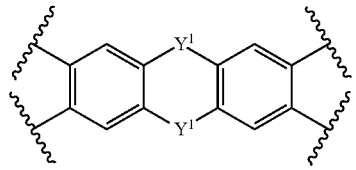 (2-2)

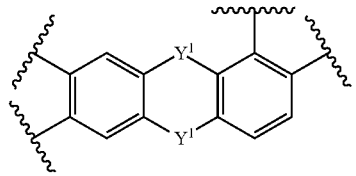 (2-3)

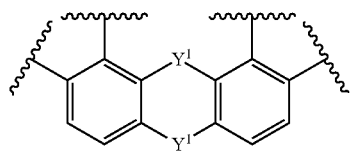 (2-4)

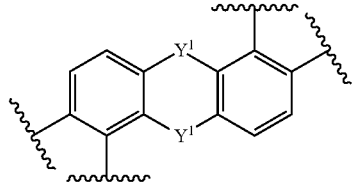 (2-5)

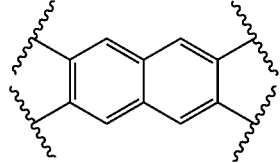 (2-6)

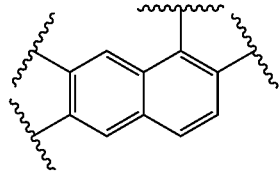 (2-7)

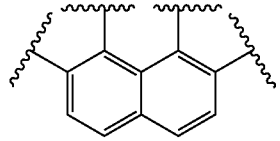 (2-8)

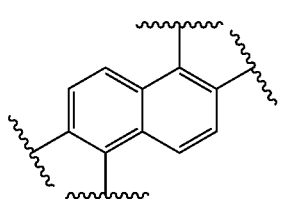
(2-9)

(In the formula (2-1), $X^1$ is one selected from the group consisting of an alkylene group having 1 to 10 carbon atoms, a fluorinated alkylene group having 1 to 10 carbon atoms, —O—, —S—, —SO—, —SO$_2$—, —CO—, —COO—, —CONH—, and a single bond. In the formulae (2-2) to (2-5), $Y^1$ may be the same as or different from each other, and is one selected from the group consisting of —CH$_2$—, —O—, —S—, —SO—, —SO$_2$—, —CO—, and a single bond.)

$R^{BN}$ in the above formula (2) may also be a group represented by the formula (2c) mentioned later, this will be mentioned later.

[Diamine Diol]

In the present invention, diamine diol represented by the following formula (2a) may be used as a diamine compound. The following formula (2a) corresponds to a formula in which q in the above formula (2) is 2. In the present invention, in the diamine diol, when the amino group and hydroxyl group thereof are reacted with a dicarbonyl compound, the below-mentioned oxazole ring forming polymer (B2) or an imide ring-oxazole ring forming polymer (B3) is formed. When the amino group and tetracarboxylic dianhydride thereof are reacted with each other, the below-mentioned imide ring forming polymer (B1) or an imide ring-oxazole ring forming polymer (B3) such as polyamic acid is formed. The diamine diol may be used singly or in combination of two or more.

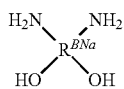
(2a)

(In the formula, $R^{BNa}$ represents a tetravalent organic group having adjacent two carbon atoms, in which each pair of an amino group and a hydroxyl group constituting a combination of two pairs of amino group and hydroxyl group included in diamine diol represented by the formula (2a) are bonded to the above-mentioned adjacent two carbon atoms.)

In the above formula (2a), examples of the organic group as $R^{BNa}$ include groups that are the same as the organic groups as $R^{BN}$ in the above formula (2) except for the valence, and the same is true to $R^{BNa}$. It is preferable that $R^{BNa}$ is a tetravalent organic group including one or more aromatic rings. In the present application, a diamine compound represented by the formula (2a) may be also referred to as "aromatic diamine diol" (wherein in the formula, $R^{BNa}$ represents a tetravalent organic group including one or more aromatic rings having adjacent two carbon atoms, an amino group and a hydroxyl group of each pair constituting a combination of two pairs of amino groups and hydroxyl groups included in diamine diol represented by the formula (2a) are bonded to the adjacent two carbon atoms on the aromatic ring included in $R^{BNa}$).

Specific examples of the compound represented by the above formula (2a) include, 3,3'-dihydroxybenzidine, 4-diamino-1,5-benzenediol, 2,5-diamino-1,4-benzenediol, 2,5-diamino-3-fluoro-1,4-benzenediol, 2,5-diamino-3,6-difluoro-1,4-benzenediol, 2,6-diamino-1,5-dihydroxy naphthalene, 1,5-diamino-2,6-dihydroxy naphthalene, 2,6-diamino-3,7-dihydroxy naphthalene, 1,6-diamino-2,5-dihydroxy naphthalene, 4,4'-diamino-3,3'-dihydroxybiphenyl, 3,3'-diamino-4,4'-dihydroxybiphenyl, 2,3'-diamino-3,2'-dihydroxybiphenyl, 3,4'-diamino-4,3'-dihydroxybiphenyl, 4,4'-diamino-3,3'-dihydroxy-6,6'-di-trifluoromethyl biphenyl, 3,3'-diamino-4,4'-dihydroxy-6,6'-di-trifluoromethyl biphenyl, 2,3'-diamino-3,2'-dihydroxy-6,6'-di-trifluoromethyl biphenyl, 3,4'-diamino-4,3'-dihydroxy-6,6'-di-trifluoromethyl biphenyl, 4,4'-diamino-3,3'-dihydroxy-5,5'-di-trifluoromethyl biphenyl, 3,3'-diamino-4,4'-dihydroxy-5,5'-di-trifluoromethyl biphenyl, 2,3'-diamino-3,2'-dihydroxy-5,5'-di-trifluoromethyl biphenyl, 3,4'-diamino-4,3'-dihydroxy-5,5'-di-trifluoromethyl biphenyl, bis(4-amino-3-hydroxyphenyl)methane, bis(3-amino-4-hydroxyphenyl)methane, 3,4'-diamino-4,3'-dihydroxy diphenyl methane, bis(4-amino-3-hydroxy-6-trifluoromethyl)methane, bis(3-amino-4-hydroxy-6-trifluoromethyl)methane, 3,4'-diamino-4,3'-dihydroxy-6,6'-di-trifluoromethyl diphenylmethane, bis(4-amino-3-hydroxyphenyl)difluoromethane, bis(3-amino-4-hydroxyphenyl)difluoromethane, 3,4'-diamino-4,3'-dihydroxydiphenyl difluoromethane, bis(4-amino-3-hydroxy-6-trifluoromethylphenyl)difluoromethane, bis(3-amino-4-hydroxy-6-trifluoromethylphenyl) difluoromethane, 3,4'-diamino-4,3'-dihydroxy-6,6'-ditrifluoromethyl diphenyl difluoromethane, bis(4-amino-3-hydroxyphenyl)ether, bis(3-amino-4-hydroxyphenyl) ether, 3,4'-diamino-4,3'-dihydroxy diphenyl ether, bis(4-amino-3-hydroxy-6-trifluoromethylphenyl) ether, bis(3-amino-4-hydroxy-6-trifluoromethylphenyl)ether, 3,4'-diamino-4,3'-dihydroxy-6,6'-ditrifluoromethyl diphenyl ether, bis(4-amino-3-hydroxyphenyl)ketone, bis(3-amino-4-hydroxyphenyl) ketone, 3,4'-diamino-4,3'-dihydroxydiphenyl ketone, bis(4-amino-3-hydroxy-6-trifluoromethyl) ketone, bis(3-amino-4-hydroxy-6-trifluoromethyl) ketone, 3,4'-diamino-4,3'-dihydroxy-6,6'-ditrifluoromethyl diphenyl ketone, 2,2-bis(4-amino-3-hydroxyphenyl)propane, 2,2-bis(3-amino-4-hydroxyphenyl)propane, 2-(3-amino-4-hydroxyphenyl)-2-(4'-amino-3'-hydroxyphenyl)propane, 2,2-bis(4-amino-3-hydroxy-6-trifluoromethylphenyl)propane, 2,2-bis(3-amino-4-hydroxy-6-trifluoromethylphenyl)propane, 2-(3-amino-4-hydroxy-6-trifluoromethylphenyl)-2-(4'-amino-3'-hydroxy-6'-trifluoromethylphenyl)propane, 2,2-bis(3-amino-4-hydroxy-5-trifluoromethylphenyl)propane, 2,2-bis(4-amino-3-hydroxyphenyl)hexafluoropropane, 2,2-bis(3-amino-4-hydroxyphenyl)hexafluoropropane, 2-(3-amino-4-hydroxyphenyl)-2-(4'-amino-3'-hydroxyphenyl) hexafluoropropane, 2,2-bis(4-amino-3-hydroxy-6-trifluoromethylphenyl)hexafluoropropane, 2,2-bis(3-amino-4-hydroxy-6-trifluoromethylphenyl)hexafluoropropane, 2-(3-amino-4-hydroxy-6-trifluoromethylphenyl)-2-(4'-amino-3'-hydroxy-6'-trifluoromethylphenyl)hexafluoropropane, 2,2-bis(3-amino-4-hydroxy-5-trifluoromethylphenyl) hexafluoropropane, bis(4-amino-3-hydroxyphenyl)sulfone, bis(3-amino-4-hydroxyphenyl) sulfone, 3,4'-diamino-4,3'-dihydroxydiphenyl sulfone, bis(4-amino-3-hydroxy-6-trifluoromethyl)sulfone, bis(3-amino-4-hydroxy-6-trifluoromethyl)sulfone, 3,4'-diamino-4,3'-dihydroxy-6,6'-ditrifluoromethyl diphenyl sulfone, bis(4-amino-3-hydroxyphenyl)sulfide, bis(3-amino-4-hydroxyphenyl) sulfide, 3,4'-diamino-4,3'-dihydroxydiphenyl sulfide, bis(4-amino-3-hydroxy-6-trifluoromethyl)sulfide, bis(3-amino-4- hydroxy-6-trifluoromethyl)sulfide, 3,4'-diamino-4,3'-dihydroxy-6,6'-ditrifluoromethyl diphenyl sulfide, (4-amino-3-hydroxyphenyl) 4-amino-3-hydroxyphenyl benzoate, (3-amino-4-hydroxyphenyl)3-amino-4-hydroxyphenyl benzoate, (3-amino-4-hydroxyphenyl) 4-amino-3-hydroxyphenyl benzoate, (4-amino-3-hydroxyphenyl)3-amino-4-hydroxyphenyl benzoate, N-(4-amino-3-hydroxyphenyl) 4-amino-3-hydroxybenzamide, N-(3-amino-4-hydroxyphenyl)3-amino 4-hydroxyphenyl benzamide, N-(3-amino-4-hydroxyphenyl)4-amino-3-hydroxyphenyl benzamide, N-(4-amino-3-hydroxyphenyl)3-amino-4-hydroxyphenyl benzamide, 2,4'-bis(4-amino-3-hydroxyphenoxy)biphenyl, 2,4'-bis(3-amino-4-hydroxyphenoxy)biphenyl, 4,4'-bis(4-amino-3-hydroxyphenoxy)biphenyl, 4,4'-bis(3-amino-4-hydroxyphenoxy)biphenyl, di[4-(4-amino-3-hydroxyphenoxy)phenyl]ether, di[4-(3-amino-4-hydroxyphenoxy)phenyl]ether, 2,4'-bis(4-amino-3-hydroxyphenoxy)benzophenone, 2,4'-bis(3-amino-4-hydroxyphenoxy)benzophenone, 4,4'-bis(4-amino-3-hydroxyphenoxy)benzophenone, 4,4'-bis(3-amino-4-hydroxyphenoxy)benzophenone, 2,4'-bis(4-amino-3-hydroxyphenoxy)octafluorobiphenyl, 2,4'-bis(3-amino-4-hydroxyphenoxy)octafluorobiphenyl, 4,4'-bis(4-amino-3-hydroxyphenoxy)octafluorobiphenyl, 4,4'-bis(3-amino-4-hydroxyphenoxy)octafluorobiphenyl, 2,4'-bis(4-amino-3-hydroxyphenoxy)octafluorobenzophenone, 2,4'-bis(3-amino-4-hydroxyphenoxy)octafluorobenzophenone, 4,4'-bis(4-amino-3-hydroxyphenoxy)octafluorobenzophenone, 4,4'-bis(3-amino-4-hydroxyphenoxy)octafluorobenzophenone, 2,2-bis[4-(4-amino-3-hydroxyphenoxy)phenyl]propane, 2,2-bis[4-(3-amino-4-hydroxyphenoxy)phenyl]propane, 2,2-bis[4-(4-amino-3-hydroxyphenoxy)phenyl]hexafluoropropane, 2,2-bis[4-(3-amino-4-hydroxyphenoxy)phenyl]hexafluoropropane, 2,8-diamino-3,7-dihydroxy dibenzofuran, 2,8-diamino-3,7-dihydroxy fluorene, 2,6-diamino-3,7-dihydroxyxanthene, 9,9-bis-(4-amino-3-hydroxyphenyl)fluorene, and 9,9-bis-(3-amino-4-hydroxyphenyl)fluorene.

Among them, 2,2-bis(3-amino-4-hydroxyphenyl) hexafluoropropane, and 3,3'-dihydroxybenzidine are preferable because a film or a molded article having excellent heat resistance, tensile elongation, and chemical resistance can be formed.

[Diamine Compounds Other than Diamine Diol]

In the present invention, as the diamine compound represented by the above formula (2), a diamine compound that is other than diamine diol represented by the above formula (2a) (hereinafter, also referred to as "diamine compound (2b)") may be used. The diamine compound (2b) is represented by a formula in which q is 0 or 1 in the above formula (2). In the present invention, the diamine compound (2b) is reacted with tetracarboxylic dianhydride to form the below-mentioned imide ring forming polymer (B1) such as polyamic acid or an imide ring-oxazole ring forming polymer (B3).

The diamine compound (2b) may be aliphatic diamine, or may be aromatic diamine in which an organic group having a valence of (2+q) including an aromatic ring in which an organic group as $R^{BN}$ having a valence of (2+q) is 1 or more (wherein, q represents 0 or 1) (also referred to as an "aromatic diamine compound (2b)" in the present application) in the above formula (2). However, from the viewpoint of heat resistance, tensile elongation, chemical resistance and low dielectric constant of the resulting film or molded article, the aromatic diamine compound (2b) is preferable. In the diamine compound (2b), "an organic group having a valence of (2+q) including one or more aromatic rings" as $R^{BN}$ in the above formula (2) (wherein, q represents 0 or 1) is the same groups as "a tetravalent organic group including one or more aromatic rings" as $R^{BNa}$ in the above formula (2a) except for the number of valence, the same is true to this case. The diamine compound (2b) may be used in a combination of two or more. The diamine compound (2b) is not particularly limited and, for example, can be appropriately selected from diamines which have been conventionally used as synthesis raw material of polyamic acid.

Suitable specific examples of aromatic diamine compound (2b) include: p-phenylenediamine; m-phenylenediamine; 2,4-diamino toluene; 4,4'-diamino biphenyl; 4,4'-diamino-2,2'-bis (trifluoromethyl) biphenyl; 3,3'-diaminodiphenyl sulfone; 4,4'-diaminodiphenyl sulfone; 4,4'-diaminodiphenyl sulfide; 4,4'-diaminodiphenylmethane; 4,4'-diamino diphenyl ether; 3,4'-diamino diphenyl ether; 3,3'-diamino diphenyl ether; 1,4-bis(4-aminophenoxy)benzene; 1,3-bis(4-aminophenoxy)benzene; 1,3-bis(3-aminophenoxy)benzene; 4,4'-bis(4-aminophenoxy)biphenyl; bis[4-(4-aminophenoxy)phenyl]sulfone; bis[4-(3-aminophenoxy)phenyl]sulfone; 2,2-bis[4-(4-aminophenoxy)phenyl]propane; 2,2-bis[4-(4-aminophenoxy)phenyl]hexafluoropropane; 9,9-bis(4-aminophenyl)fluorene, 9,9-bis(4-amino-3-methylphenyl)fluorene and 4,4'-[1,4-phenylenebis (1-methylethane-1,1-diyl)]dianiline and the like. Among these, p-phenylenediamine, m-phenylenediamine, 2,4-diamino toluene, and 4,4'-diamino diphenyl ether are preferable from the viewpoint of price, availability, and the like.

[Dicarbonyl Compound]

A dicarbonyl compound is represented by the following formula (3a). In the present application, the dicarbonyl compound is reacted with diamine diol to form the below-mentioned oxazole ring forming polymer (B2) or an imide ring-oxazole ring forming polymer (B3). The dicarbonyl compound may be used singly or in combination of two or more.

(3a)

(Wherein in the formula, $R^{BCa}$ represents a divalent organic group, $A^1$ and $A^2$ each independently represents a hydrogen atom or a halogen atom).

$R^{BCa}$ in the formula (3a) may be an aromatic group, or an aliphatic group, or a group combining an aromatic group and an aliphatic group. It is preferable that $R^{BCa}$ is a group including an aromatic group and/or an alicyclic group because the resulting film or molded article has excellent heat resistance, tensile elongation and chemical resistance. The aromatic group included in $R^{BCa}$ may be an aromatic hydrocarbon group or an aromatic heterocycle group.

$R^{BCa}$ may include a halogen atom, an oxygen atom, and a sulfur atom, in addition to a carbon atom and a hydrogen atom. When $R^{BCa}$ include an oxygen atom, a nitrogen atom, or a sulfur atom, the oxygen atom, the nitrogen atom, or the sulfur atom may be included in $R^{BCa}$ as a group selected from a divalent nitrogen-containing heterocycle group, —CONH—, —NH—, —N=N—, —CH=N—, —COO—, —O—, —CO—, —SO—, —SO$_2$—, —S—, and —S—S—, and further preferably included in $R^{BCa}$ as a group selected from —O—, —CO—, —SO—, —SO$_2$—, —S—, and —S—S—.

In the formula (3a), one of the two $A^1$ and $A^2$ may be a hydrogen atom, and the other may be a halogen atom, but it is preferable that both two of the $A^1$ and $A^2$ are a hydrogen atom, or both two of the $A^1$ and $A^2$ are a halogen atom. When the $A^1$ and $A^2$ are a halogen atom, the $A^1$ and $A^2$ are preferably a chlorine atom, a bromine atom, and iodine atom, and more preferably a chlorine atom.

Hereinafter, a dialdehyde compound and a dicarboxylic acid dihalide that are suitable compounds as the dicarbonyl compound are described.

[Dialdehyde Compound]

The dialdehyde compound is a compound represented by the following formula (3a-1). The dialdehyde compound may be used singly or in combination of two or more.

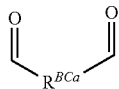
(3a-1)

(In the formula, $R^{BCa}$ is as defined above.)

Examples of suitable aromatic group or an aromatic ring-containing group for $R^{BCa}$ in the formula (3a-1) include the following groups.

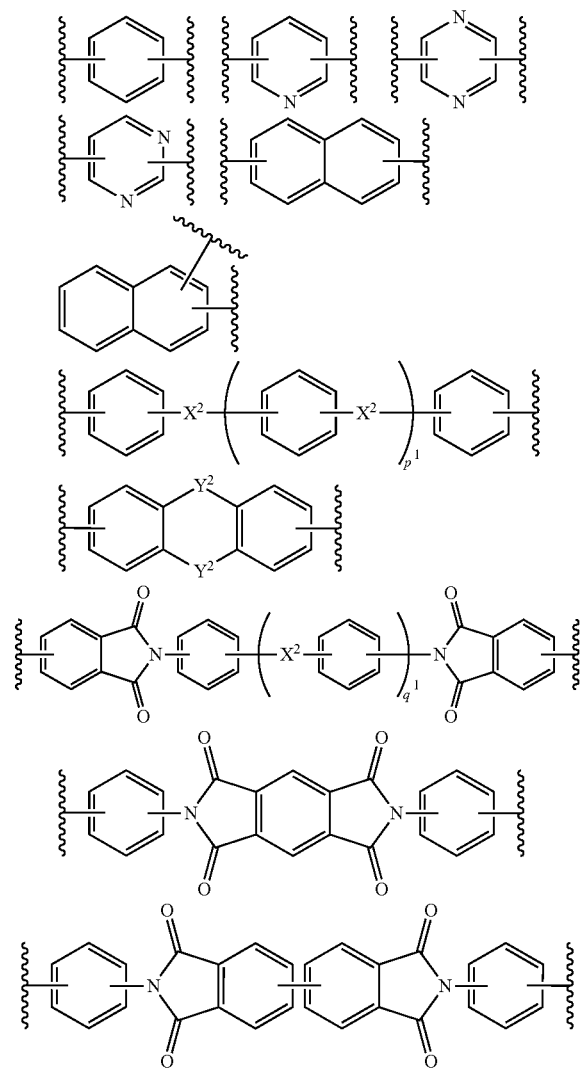

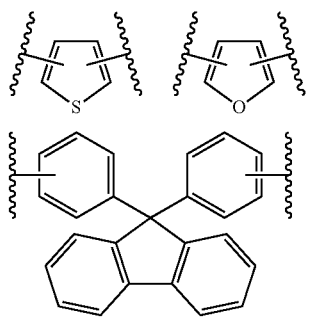

(In the above formula, $X^2$ is one selected from the group consisting of an alkylene group having 1 to 10 carbon atoms, a fluorinated alkylene group having 1 to 10 carbon atoms, —O—, —S—, —SO—, —SO$_2$—, —CO—, —COO—, —CONH—, and a single bond. When a plurality of $X^2$ is present, the plurality of $X^2$ may be the same as or different from each other. $Y^2$ may be the same as or different from each other and is one selected from the group consisting of —CH$_2$—, —O—, —S—, —SO—, —SO$_2$—, —CO—, and a single bond. $p^1$ and $q^1$ each is an integer from 0 to 3.)

Examples of the suitable alicyclic group or an alicyclic ring-containing group for $R^{BCa}$ in the formula (3a-1) include the following groups.

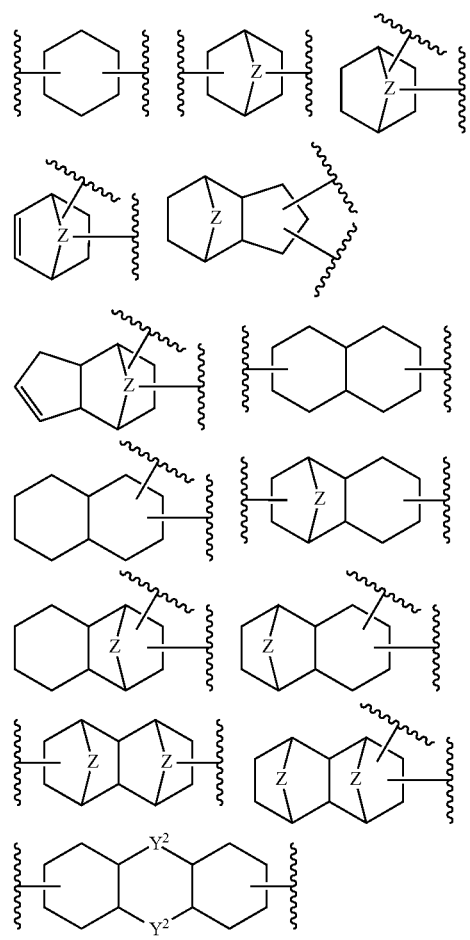

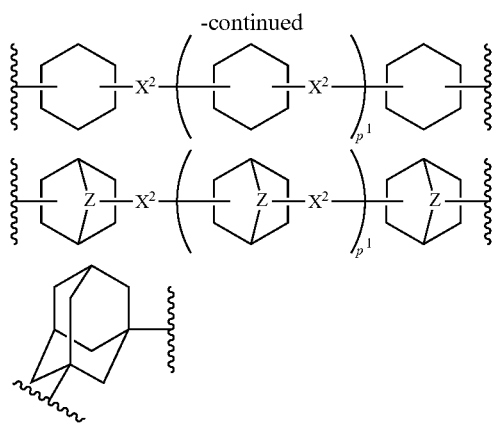

(In the above formula, $X^2$ is one selected from the group consisting of an alkylene group having 1 to 10 carbon atoms, a fluorinated alkylene group having 1 to 10 carbon atoms, —O—, —S—, —SO—, —SO$_2$—, —CO—, —COO—, —CONH—, and a single bond. When a plurality of $X^2$ is present, the plurality of $X^2$ may be the same as or different from each other. $Y^2$ may be the same as or different from each other and is one selected from the group consisting of —CH$_2$—, —O—, —S—, —SO—, —SO$_2$—, —CO—, and a single bond. Z is one selected from the group consisting of —CH$_2$—, —CH$_2$CH$_2$—, and —CH=CH—. $p^1$ is an integer from 0 to 3.)

An aromatic ring or an alicyclic ring included in suitable groups as the above-mentioned $R^{BCa}$ may include one or a plurality of substituents on the ring thereof. Suitable examples of the substituents include a fluorine atom, an alkyl group having 1 to 6 carbon atoms, an alkoxy group having 1 to 6 carbon atoms, a fluorinated alkyl group having 1 to 6 carbon atoms, and a fluorinated alkoxy group having 1 to 6 carbon atoms are preferable, and may include an —OH group, a —COOH group, and a —COOR group. When the substituent is a fluorinated alkyl group or a fluorinated alkoxy group, a perfluoroalkyl group or a perfluoroalkoxy group is preferable.

When the dialdehyde compound represented by the formula (3a-1) is aromatic dialdehyde, suitable examples include benzene dialdehydes, pyridine dialdehydes, pyrazine dialdehydes, pyrimidine dialdehydes, naphthalene dialdehydes, biphenyl dialdehydes, diphenyl ether dialdehydes, diphenyl sulfone dialdehydes, diphenyl sulfide dialdehydes, bis(formylphenoxy)benzenes, [1,4-phenylene-bis(1-methyl ethylidene)]bis-benzaldehydes, 2,2-bis[4-(formylphenoxy) phenyl]propanes, bis[4-(formylphenoxy)phenyl]sulfides, bis[4-(formylphenoxy)phenyl]sulfones, and fluorene-containing dialdehyde.

Specific examples of the benzene dialdehydes include phthalaldehyde, isophthalaldehyde, terephthalaldehyde, 3-fluorophthalaldehyde, 4-fluorophthalaldehyde, 2-fluoroisophthalaldehyde, 4-fluoro isophthalaldehyde, 5-fluoroisophthalaldehyde, 2-fluoroterephthalaldehyde, 3-trifluoromethyl phthalaldehyde, 4-trifluoromethyl phthalaldehyde, 2-trifluoromethyl isophthalaldehyde, 4-trifluoromethyl isophthalaldehyde, 5-trifluoromethyl isophthalaldehyde, 2-trifluoromethyl terephthalaldehyde, 3,4,5,6-tetrafluorophthalaldehyde, 2,4,5,6-tetrafluoro isophthalaldehyde, and 2,3,5,6-tetrafluoroterephthalaldehyde, and the like.

Specific examples of the pyridine dialdehydes include pyridine-2,3-dialdehyde, pyridine-3,4-dialdehyde, pyridine-3,5-dialdehyde, and the like. Specific examples of the pyrazine dialdehydes include pyrazine-2,3-dialdehyde, pyrazine-2,5-dialdehyde, pyrazine-2,6-dialdehyde, and the like. Specific examples of the pyrimidine dialdehydes include pyrimidine-2,4-dialdehyde, pyrimidine-4,5-dialdehyde, pyrimidine-4,6-dialdehyde, and the like.

Specific examples of the naphthalene dialdehydes include naphthalene-1,5-dialdehyde, naphthalene-1,6-dialdehyde, naphthalene-2,6-dialdehyde, naphthalene-3,7-dialdehyde, 2,3,4,6,7,8-hexafluoronaphthalene-1,5-dialdehyde, 2,3,4,5, 6,8-hexafluoronaphthalene-1,6-dialdehyde, 1,3,4,5,7,8-hexafluoronaphthalene-2,6-dialdehyde, 1-trifluoromethyl naphthalene-2,6-dialdehyde, 1,5-bis(trifluoromethyl)naphthalene-2,6-dialdehyde, 1-trifluoromethyl naphthalene-3,7-dialdehyde, 1,5-bis(trifluoromethyl)naphthalene-3,7-dialdehyde, 1-trifluoromethyl-2,4,5,6,8-pentafluoronaphthalene-3,7-dialdehyde, 1-bis(trifluoromethyl)methoxy-2,4,5,6,8-pentafluoronaphthalene-3,7-dialdehyde, 1,5-bis(trifluoromethyl)-2,4,6,8-tetrafluoronaphthalene-3,7-dialdehyde, 1,5-bis[bis(trifluoromethyl) methoxy]-2,4,6,8-tetrafluoronaphthalene-3,7-dialdehyde, and the like.

Specific examples of the biphenyl dialdehydes include biphenyl-2,2'-dialdehyde, biphenyl-2,4'-dialdehyde, biphenyl-3,3'-dialdehyde, biphenyl-4,4'-dialdehyde, 6,6'-difluorobiphenyl-3,4'-dialdehyde, 6,6'-difuorobiphenyl-2,4'-dialdehyde, 6,6'-difuorobiphenyl-3,3'-dialdehyde, 6,6'-difuorobiphenyl-3,4'-dialdehyde, 6,6'-difuorobiphenyl-4,4'-dialdehyde, 6,6'-di-trifluoromethyl biphenyl-2,2'-dialdehyde, 6,6'-di-trifluoromethyl biphenyl-2,4'-dialdehyde, 6,6'-di-trifluoromethyl biphenyl-3,3'-dialdehyde, 6,6'-di-trifluoromethyl biphenyl-3,4'-dialdehyde, 6,6'-di-trifluoromethyl biphenyl-4,4'-dialdehyde, and the like.

Specific examples of the diphenyl ether dialdehydes include diphenyl ether-2,4'-dialdehyde, diphenyl ether-3,3'-dialdehyde, diphenyl ether-3,4'-dialdehyde, diphenyl ether-4,4'-dialdehyde, and the like.

Specific examples of the diphenyl sulfone dialdehydes include diphenyl sulfone-3,3'-dialdehyde, diphenyl sulfone-3,4'-dialdehyde, diphenyl sulfone-4,4'-dialdehyde, and the like.

Specific examples of the diphenyl sulfide dialdehydes include diphenyl sulfide-3,3'-dialdehyde, diphenyl sulfide-3,4'-dialdehyde, diphenyl sulfide-4,4'-dialdehyde, and the like.

Specific examples of the diphenyl ketone dialdehydes include diphenyl ketone-3,3'-dialdehyde, diphenyl ketone-3,4'-dialdehyde, diphenyl ketone-4,4'-dialdehyde, and the like.

Specific examples of the bis(formylphenoxy)benzenes include benzene 1,3-bis(3-formylphenoxy)benzene, 1,4-bis (3-formylphenoxy)benzene, 1,4-bis(4-formylphenoxy)benzene, and the like.

Specific examples of the [1,4-phenylene-bis(1-methylethylidene)]bisbenzaldehydes include 3,3'-[1,4-phenylene-bis (1-methylethylidene)]bisbenzaldehyde, 3,4'-[1,4-phenylene-bis(1-methylethylidene)]bisbenzaldehyde, 4,4'-[1,4-phenylene-bis(1-methylethylidene)]bisbenzaldehyde, and the like.

Specific examples of the 2,2-bis[4-(formylphenoxy)phenyl]propanes include 2,2-bis[4-(2-formylphenoxy)phenyl] propane, 2,2-bis[4-(3-formylphenoxy)phenyl]propane, 2,2-bis[4-(4-formylphenoxy)phenyl]propane, 2,2-bis[4-(3-formylphenoxy)phenyl]hexafluoropropane, 2,2-bis[4-(4-formylphenoxy)phenyl]hexafluoropropane, and the like.

Specific examples of the bis[4-(formylphenoxy)phenyl] sulfides include bis[4-(3-formylphenoxy)phenyl]sulfide, bis [4-(4-formylphenoxy)phenyl]sulfide, and the like.

Specific examples of the bis[4-(formylphenoxy)phenyl] sulfones include bis[4-(3-formylphenoxy)phenyl]sulfone, bis[4-(4-formylphenoxy)phenyl]sulfone, and the like.

Specific examples of the fluorene-containing dialdehyde include fluorene-2,6-dialdehyde, fluorene-2,7-dialdehyde, dibenzofuran-3,7-dialdehyde, 9,9-bis(4-formylphenyl)fluorene, 9,9-bis(3-formylphenyl) fluorene, 9-(3-formylphenyl)-9-(4'-formylphenyl)fluorene, and the like.

Furthermore, diphenylalkane dialdehyde represented by the following formula, or diphenyl fluoroalkane dialdehyde can be also suitably used as the aromatic dialdehyde compound.

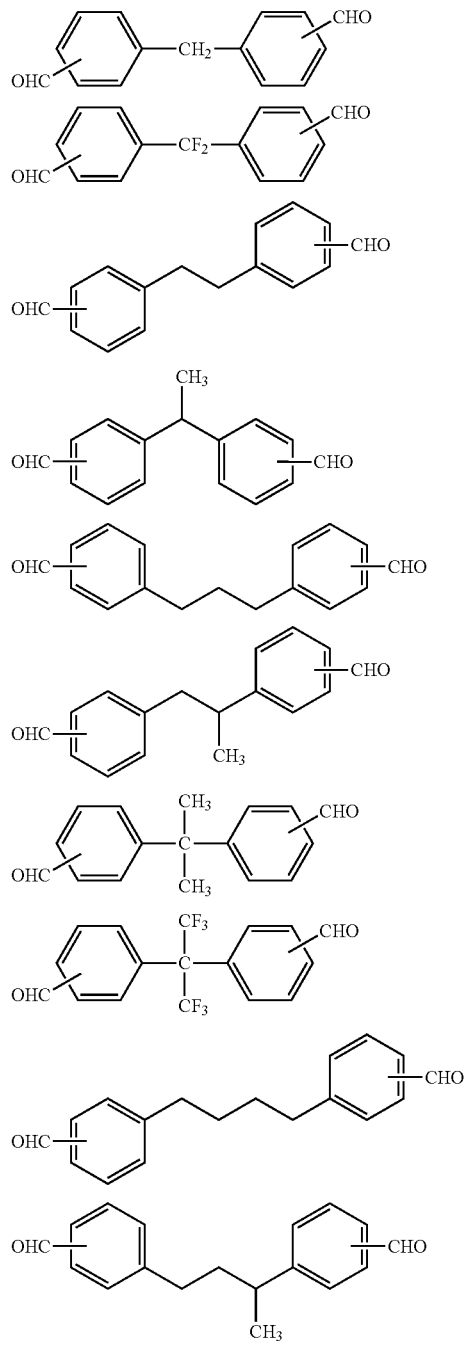

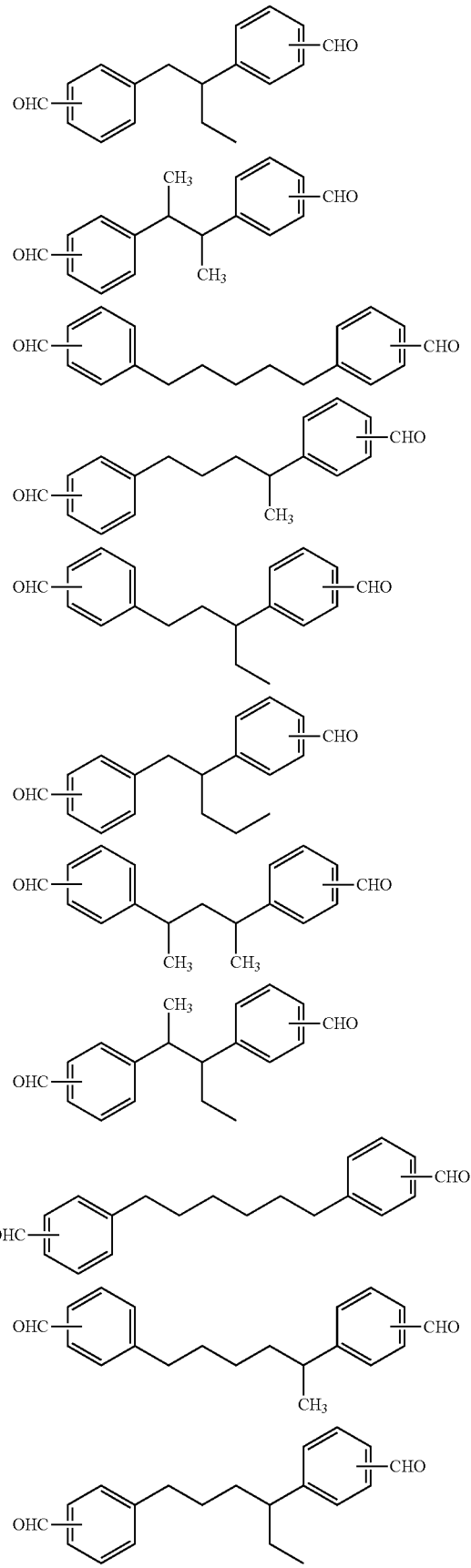

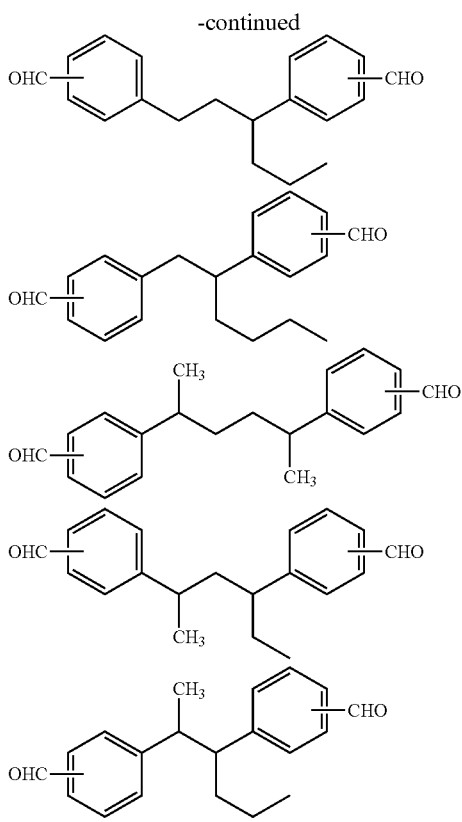

Furthermore, a compound having an imide bond represented by the following formula can be suitably used as the aromatic dialdehyde compound.

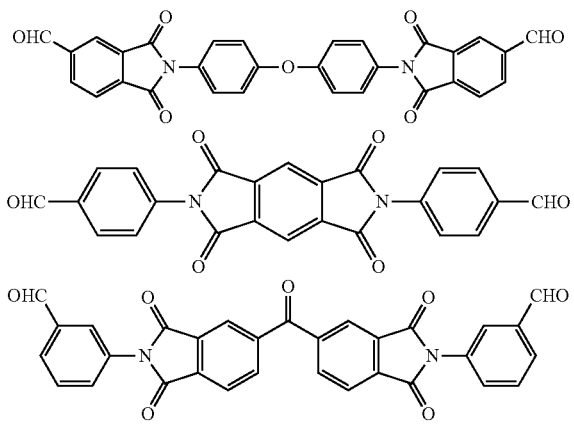

When the dicarbonyl compound represented by the formula (3a-1) is alicyclic dialdehyde including an alicyclic group, suitable examples include cyclohexane-1,4-dialdehyde, cyclohexane-1,3-dialdehyde, bicyclo[2.2.1]heptane-2,5-dialdehyde, bicyclo[2.2.2]octane-2,5-dialdehyde, bicyclo[2.2.2]octa-7-ene-2,5-dialdehyde, bicyclo[2.2.1]heptane-2,3-dialdehyde, bicyclo[2.2.1]hepta-5-ene-2,3-dialdehyde, tricyclo[5.2.1.0$^{2,6}$]decane-3,4-dialdehyde, tricyclo[5.2.1.$^{2,6}$]deca-4-ene-8,9-dialdehyde, perhydronaphthalene-2,3-dialdehyde, perhydronaphthalene-1,4-dialdehyde, perhydronaphthalene-1,6-dialdehyde, perhydro-1,4-methanonaphthalene-2,3-dialdehyde, perhydro-1,4-methanonaphthalene-2,7-dialdehyde, perhydro-1,4-methanonaphthalene-7,8-dialdehyde, perhydro-1,4:5,8-dimethanonaphthalene-2,3-dialdehyde, perhydro-1,4:5,8-dimethanonaphthalene-2,7-dialdehyde, perhydro-1,4:5,8:9,10-trimethanoanthracene-2,3-dialdehyde, bicyclohexyl-4,4'-dialdehyde, dicyclohexyl ether-3,4'-dialdehyde, dicyclohexyl methane-3,3'-dialdehyde, dicyclohexyl methane-3,4'-dialdehyde, dicyclohexyl methane-4,4'-dialdehyde, dicyclohexyl difluoromethane-3,3'-dialdehyde, dicyclohexyl difluoromethane-3,4'-dialdehyde, dicyclohexyl difluoromethane-4,4'-dialdehyde, dicyclohexyl sulfone-3,3'-dialdehyde, dicyclohexyl sulfone-3,4'-dialdehyde, dicyclohexyl sulfone-4,4'-dialdehyde, dicyclohexyl sulfide-3,3'-dialdehyde, dicyclohexyl sulfide-3,4'-dialdehyde, dicyclohexyl sulfide-4,4'-dialdehyde, dicyclohexyl ketone-3,3'-dialdehyde, dicyclohexyl ketone-3,4'-dialdehyde, dicyclohexyl ketone-4,4'-dialdehyde, 2,2-bis(3-formyl cyclohexyl)propane, 2,2-bis(4-formyl cyclohexyl)propane, 2,2-bis(3-formyl cyclohexyl) hexafluoropropane, 2,2-bis(4-formyl cyclohexyl) hexafluoropropane, 1,3-bis(3-formyl cyclohexyl) benzene, 1,4-bis(3-formyl cyclohexyl) benzene, 1,4-bis(4-formyl cyclohexyl) benzene, 3,3'-[1,4-cyclohexylene bis(1-methylethylidene)]bis-cyclohexane carbaldehyde, 3,4'-[1,4-cyclohexylene bis(1-methylethylidene)]bis cyclohexane carbaldehyde, 4,4'-[1,4-cyclohexylene bis(1-methylethylidene)]bis cyclohexane carbaldehyde, 2,2-bis[4-(3-formyl cyclohexyl)cyclohexyl]propane, 2,2-bis[4-(4-formyl cyclohexyl)cyclohexyl]propane, 2,2-bis[4-(3-formyl cyclohexyl)cyclohexyl]hexafluoropropane, 2,2-bis[4-(4-formyl phenoxy) cyclohexyl]hexafluoropropane, bis[4-(3-formyl cyclohexyloxy) cyclohexyl]sulfide, bis[4-(4-formyl cyclohexyloxy)cyclohexyl]sulfide, bis[4-(3-formyl cyclohexyloxy)cyclohexyl]sulfone, bis[4-(4-formyl cyclohexyloxy) cyclohexyl]sulfone, 2,2'-bicyclo[2.2.1]heptane-5,6'-dialdehyde, 2,2'-bicyclo[2.2.1]heptane-6,6'-dialdehyde, 1,3-diformyl adamantane, and the like.

Among the dialdehyde compounds described above, isophthalaldehyde is preferable because of its easiness in synthesis and availability, and ease in obtaining of polybenzoxazole resin having excellent heat resistance and mechanical property.

[Dicarboxylic Acid Dihalide]

The dicarboxylic acid dihalide is a compound represented by the following formula (3a-2). The dicarboxylic acid dihalide may be used singly or in combination of two or more.

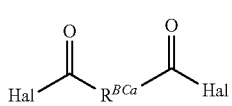

(3a-2)

(In the formula, $R^{BCa}$ is as defined above, Hal represents a halogen atom.)

In the formula (3a-2), Hal is preferably a chlorine atom, a bromine atom and an iodine atom, and more preferably a chlorine atom.

Examples of suitable compounds as the compound represented by the formula (3a-2) include compounds in which two aldehyde groups possessed by the above-mentioned compound as the suitable examples of the dialdehyde compound are substituted by a halocarbonyl group, preferably a chlorocarbonyl group.

Among the dicarboxylic acid dihalide compounds described above, terephthalic acid dichloride is preferable because of its easiness in synthesis and availability, and ease in obtaining of polybenzoxazole resin having excellent heat resistance and mechanical property.

[Tetracarboxylic Dianhydride]

The tetracarboxylic dianhydride is represented by the following formula (3b). In the present invention, tetracarboxylic dianhydride is reacted with a diamine compound (2b) to form the below-mentioned imide ring forming polymer (B1) or imide ring-oxazole ring forming polymer (B3) such as polyamic acid. The dicarbonyl compound may be used singly or in combination of two or more.

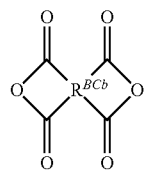

(3b)

(In the formula, $R^{BCb}$ represents a tetravalent organic group.)

In the formula (3b), $R^{BCb}$ is a tetravalent organic group and may include one or a plurality of substituents in addition to an acid anhydride group represented by two —C(=O)—O—C(=O)— in the formula (3b). The suitable examples of the substituent include a fluorine atom, an alkyl group having 1 to 6 carbon atoms, an alkoxy group having 1 to 6 carbon atoms, a fluorinated alkyl group having 1 to 6 carbon atoms, and a fluorinated alkoxy group having 1 to 6 carbon atoms are preferable, and may include an —OH group, a —COOH group, and a —COOR group in addition to an acid anhydride group represented by the formula (3b). When the substituent is a fluorinated alkyl group or a fluorinated alkoxy group, the substituent is preferably a perfluoroalkyl group or a perfluoroalkoxy group. As to the substituent, the same is true to the one or a plurality of substituent which the below-mentioned aromatic group may have on the aromatic ring.

In the formula (3b), $R^{BCb}$ is a tetravalent organic group, the lower limit value of the number of carbon atoms thereof is preferably 2, and more preferably 6. The upper limit value thereof is preferably 50, and more preferably 30. $R^{BCb}$ may be an aliphatic group, an aromatic group, and a group combining these groups. $R^{BCb}$ may include a halogen atom, an oxygen atom, and a sulfur atom in addition to the carbon atom and a hydrogen atom. When $R^{BCb}$ includes an oxygen atom, a nitrogen atom, or a sulfur atom, an oxygen atom, a nitrogen atom, or a sulfur atom may be included in $R^{BCb}$ as a group selected from a nitrogen-containing heterocycle group, —CONH—, —NH—, —N=N—, —CH=N—, —COO—, —O—, —CO—, —SO—, —SO$_2$—, —S—, and —S—S—, and more preferably included in $R^{BCb}$ as a group selected from —O—, —CO—, —SO—, —SO$_2$—, —S—, and —S—S—.

The tetracarboxylic dianhydride can be appropriately selected from tetracarboxylic dianhydride which have been conventionally used as raw materials for synthesizing polyamic acid. The tetracarboxylic dianhydride may be an aliphatic tetracarboxylic dianhydride or an aromatic tetracarboxylic dianhydride.

Examples of the aliphatic tetracarboxylic dianhydride include 2,2-bis(3,4-dicarboxy)propanedianhydride, bis(3,4-dicarboxy)methane dianhydride, cyclohexane tetracarboxylic dianhydride, cyclo butane tetracarboxylic dianhydride, cyclopentane tetracarboxylic dianhydride, and the like, and may be one comprising an alicyclic structure. Such an alicyclic structure may be polycyclic, and examples of the polycyclic alicyclic structures include a structure having a bridged alicyclic structure, for example, bicyclo[2.2.1]heptane. For example, the bridged alicyclic structure may condense to the other bridged alicyclic structure and/or non-bridged alicyclic structure, and the bridged alicyclic structure may be bonded to the other bridged alicyclic structure and/or non-bridged alicyclic structure via a spiro bond. When the aliphatic tetracarboxylic dianhydride is used, an imide ring forming polymer (B1) having excellent transparency or an imide ring-oxazole ring forming polymer (B3) tends to be formed.

Examples of the aromatic tetracarboxylic dianhydride include pyromellitic acid dianhydride, 1,4-bis(3,4-dicarboxyphenoxy)benzene dianhydride, 3,3',4,4'-oxybis phthalic acid dianhydride, 3,3',4,4'-biphenyltetracarboxylic acid dianhydride, 2,3,3',4'-biphenyltetracarboxylic acid dianhydride, 3,3',4,4'-benzophenonetetracarboxylic acid dianhydride, 3,3',4,4'-diphenylsulfone tetracarboxylic diacid anhydride, and the like.

Examples of the aromatic tetracarboxylic dianhydride may include one represented by the following formulae (3b-1) to (3b-3).

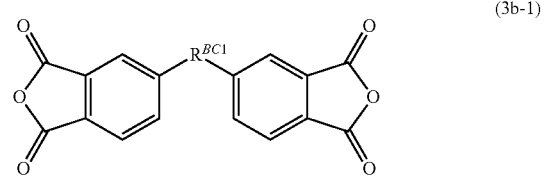

(3b-1)

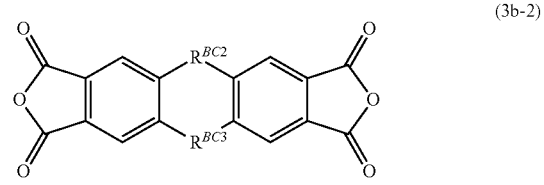

(3b-2)

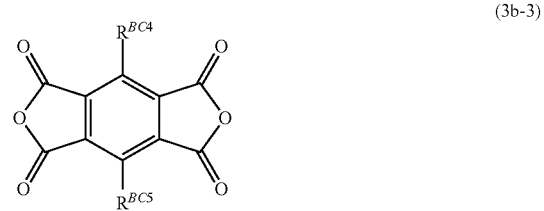

(3b-3)

In the above-mentioned formulae (3b-1) and (3b-2), $R^{BC1}$, $R^{BC2}$, and $R^{BC3}$ each may be any one of an aliphatic group optionally substituted by halogen, an oxygen atom, a sulfur atom, an aromatic group via one or more divalent elements, or divalent substituent formed of a combination thereof. $R^{BC2}$ and $R^{BC3}$ may be the same as or different from each other. In other words, $R^{BC1}$, $R^{BC2}$, and $R^{BC3}$ may include a carbon-carbon single bond, a carbon-oxygen-carbon ether bond or a halogen element (fluorine, chlorine, bromine, iodine), 2,2-bis(3,4-dicarboxytrifluorophenoxy)propane dianhydride, 1,4-bis(3,4-dicarboxytrifluorophenoxy)benzene dianhydride, 1,4-bis(3,4-dicarboxytrifluorophenoxy) tetrachlorobenzene dianhydride, 2,2',5,5',6,6'-hexafluoro-3, 3',4,4',-biphenyltetracarboxylic dianhydride, and the like.

Furthermore, in the above-mentioned general formula (3b-3), $R^{BC4}$ and $R^{BC5}$ may be any one of an aliphatic group optionally substituted by halogen, an aromatic group via one or more divalent elements, or monovalent substituent formed of a combination thereof. $R^{BC4}$ and $R^{BC5}$ may be the same as or different from each other. Difluoropyromellitic acid dianhydride, dichloropyromellitic acid dianhydride, and the like, can be used.

Examples of tetracarboxylic acid for obtaining fluorine-containing polyimide containing fluorine in a molecular structure include (trifluoromethyl)pyromellitic acid, di(trifluoromethyl)pyromellitic acid, di(heptafluoropropyl)pyromellitic acid, pentafluoroethyl pyromellitic acid, bis{3,5-di(trifluoromethyl)phenoxy}pyromellitic acid, 2,2-bis(3,4-dicarboxyphenyl)hexafluoropropane, 5,5'-bis(trifluoromethyl)-3,3',4,4'-tetracarboxy biphenyl, 2,2',5,5'-tetrakis(trifluoromethyl)-3,3',4,4'-tetracarboxy biphenyl, 5,5'-bis(trifluoromethyl)-3,3',4,4'-tetracarboxy diphenyl ether, 5,5'-bis(trifluoromethyl)-3,3',4,4'-tetracarboxybenzophenone, bis{(trifluoromethyl)dicarboxyphenoxy}benzene, bis{(trifluoromethyl)dicarboxyphenoxy}(trifluoromethyl) benzene, bis(dicarboxyphenoxy) (trifluoromethyl)benzene, bis(dicarboxyphenoxy)bis(trifluoromethyl)benzene, bis(dicarboxyphenoxy)tetrakis(trifluoromethyl)benzene, 2,2-bis{4-(3,4-dicarboxyphenoxy)phenyl}hexafluoropropane, bis{(trifluoromethyl)dicarboxyphenoxy}biphenyl, bis{(trifluoromethyl)dicarboxyphenoxy}bis(trifluoromethyl)biphenyl, bis{(trifluoromethyl)dicarboxyphenoxy}diphenyl ether, bis(dicarboxyphenoxy)bis(trifluoromethyl) biphenyl, difluoropyromellitic acid, 1,4-bis(3,4-dicarboxytrifluorophenoxy)tetrafluorobenzene, 1,4-bis(3,4-dicarboxytrifluorophenoxy)octafluorobiphenyl, pyromellitic acid, 3,4,3',4'-biphenyl tetracarboxylic acid, 2,3,3',4'-biphenyl tetracarboxylic acid, 2,3,2',3'-biphenyl tetracarboxylic acid, 3,3',4,4'-tetracarboxy diphenyl ether, 2,3',3,4'-tetracarboxy diphenyl ether, 3,3',4,4'-benzophenonetetracarboxylic acid, 3,3',4,4'-tetracarboxydiphenyl methane, 2,2-bis(3,4-dicarboxyphenyl)propane, 2,2-bis{4-(3,4-dicarboxyphenoxy) phenyl}propane, butane tetracarboxylic acid, cyclopentane tetracarboxylic acid, bis(3,4-dicarboxyphenyl) dimethyl silane, 1,3-bis(3,4-dicarboxyphenyl)tetra methyl disiloxane, and the like.

As tetracarboxylic dianhydride, from the viewpoint of heat resistance, tensile elongation and chemical resistance, and if desired, further from low dielectric constant, of the resulting film or molded article, an aromatic tetracarboxylic dianhydride is preferable, and 3,3',4,4'-biphenyltetracarboxylic dianhydride and pyromellitic acid dianhydride are preferable from the viewpoint of price, availability, and the like. Note here that acid chloride of tetracarboxylic acid, an esterized product, and the like, having the same basic structure, may be also used.

In the present invention, tetracarboxylic dianhydride may be used together with dicarboxylic anhydride. When these carboxylic anhydrides are used, the properties of the resulting imide ring-containing polymer such as polyimide resin become more excellent. Examples of the dicarboxylic anhydride include maleic anhydride, succinic anhydride, itaconic anhydride, phthalic anhydride, tetrahydrophthalic anhydride, hexahydrophthalic anhydride, methylendomethylenetetrahydrophthalic anhydride, chlorendic anhydride, methyltetrahydrophthalic anhydride, anhydrous glutaric acid, cis-4-cyclohexene-1,2-dicarboxylic anhydride and the like.

In a monomer component of the resin precursor component (B), $R^{BN}$ in the above formula (2) may be one represented by the following formula (2c), as well as/or, $R^{BCa}$ in the above formula (3a) and/or $R^{BCb}$ in the above formula (3b) may be one represented by the following formula (3c).

$R^{BN}$ in the formula (2) may be a group represented by the following formula (2c).

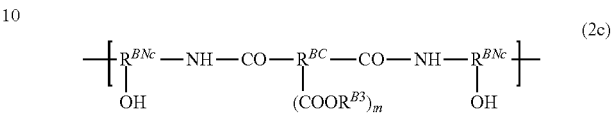

(In the formula, $R^{BC}$ represents an organic group having a valence of (2+m), and $R^{B3}$ represents a hydrogen atom or a monovalent organic group having 1 to 20 carbon atoms, m is an integer from 0 to 2. $R^{BNc}$ each independently represents a trivalent organic group.)

$R^{BNc}$ each independently represents a trivalent organic group, and preferably a trivalent organic group including one or more aromatic rings. In this case, a hydroxyl group described in the formula (2c) and an amino group described in the formula (2) are preferably bonded to adjacent two carbon atoms on the aromatic ring included in $R^{BNc}$. Examples of $R^{BNc}$ in the above formula (2c) are the same as $R^{BNa}$ in the formula (2a) except for the valence, and the same is true thereto. The "trivalent" of the above-mentioned "trivalent organic group" in $R^{BNc}$ denotes three binding arms possessed by $R^{BNc}$ represented by the formula (2c), in other words, bonding arms for —OH and —NH— represented by the formula (2c) as well as bonding arms for binding —NH$_2$ in the formula (2) are three in total as shown in the formula (2c). When $R^{BN}$C itself has the other substituents, binding arm to the substituent is not included in the number of valence of the "trivalent."

$R^{BNc}$ may be an organic group having —OH in addition to —OH represented in the above formula (2c). When $R^{BNc}$ is an organic group having one —OH in addition to —OH represented in the above formula (2c), it corresponds to $R^{BNa}$ in the above formula (2a). Furthermore, two —OH represented in the above formula (2c) may be one corresponding to —(OH)$_q$ (wherein q is 2) in the above formula (2). In such a case, the group represented by the above formula (2c) corresponds to $R^{BNa}$ in the above formula (2a). The group represented by the above formula (2c) may be a group formed by reacting a diamine compound represented by the above formula (2) (wherein q is 1 or 2) with tetracarboxylic dianhydride. $R^{BC}$ is the same as $R^{BC}$ in the below-mentioned formula (4). The formula (4) is described later.

In the present invention, a diamine compound in which $R^{BN}$ in the formula (2) is a group represented by the above formula (2c) may be reacted with tetracarboxylic dianhydride and/or dicarbonyl compound and incorporated into the energy-sensitive resin composition of the present invention in advance. The diamine compound in which $R^{BN}$ in the formula (2) is a group represented by the above formula (2c) reacted with tetracarboxylic dianhydride and/or dicarbonyl compound to form the below-mentioned imide ring-oxazole ring forming polymer (B3) as partially shown in the following formula.

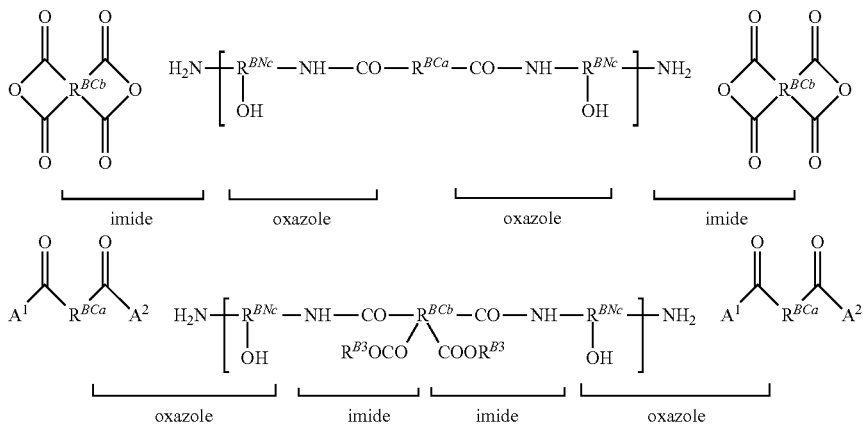

(In the formula, $R^{BN}$, $R^{BCa}$, $R^{BCb}$, $R^{B3}$, $A^1$ and $A^2$ are as defined above.)

$R^{BCa}$ in the above formula (3a) and/or $R^{BCb}$ in the above formula (3b) may be the group represented by the following formula (3c).

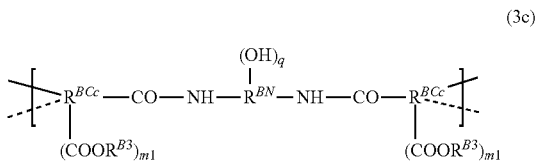

(3c)

(In the formula, $R^{BN}$ and q are as defined above, $R^{B3}$ are each independently as defined above, m1 each independently is 0 or 1, when a group represented by the formula (3c) corresponds to $R^{BCa}$ in the above formula (3a), $R^{BCa}$ each independently represents an organic group having a valence of (2+m1), a dotted line shown in the formula (3c) is regarded as not being present, and when a group represented by the formula (3c) corresponds to $R^{BCa}$ in the above formula (3b), $R^{BCa}$ each independently represents an organic group having a valence of (3+m1), and a dotted line shown in the formula (3c) represents a single bond, wherein m1+q>0 is satisfied.)

$R^{BN}$ represents an organic group having a valence of (2+q) as in $R^{BN}$ in the above formula (2), and is preferably an organic group having a valence of (2+q) including one or more aromatic rings. In the above formula (3c), when $R^{BN}$ is an organic group having a valence of (2+q) including one or more aromatic rings, and q is 1 or 2, it is preferable that each pair of —NH— and a hydroxyl group constituting a combination of one or two pairs of —NH— and a hydroxyl group included in the group represented by the formula (3c) are bonded to adjacent two carbon atoms on the aromatic ring included in $R^{BN}$.

As to $R^{BCc}$, when a group represented by the formula (3c) corresponds to $R^a$ on the above formula (3a), the "valence of (2+m1)" in the above-mentioned "organic group having a valence of (2+m1)" shows that (2+m1) binding arms which the $R^{BCc}$ represented by the formula (3c) has, in other words, arms bonded to —CO— represented by the formula (3c) and —(COOR$^{B3}$)$_{m1}$ as well as a carbonyl group in the formula (3a) are (2+m1) in total. When $R^{BCc}$ itself includes other substituents, the binding arms to the substituents are not included in the number of valences of "the valence of (2+m1)". The same is true to the "valence of (3+m1)" in the "organic group having a valence of (3+m1)" as to $R^{BCb}$ in a case where the group represented by the formula (3c) corresponds to $R^{BCb}$ of the above formula (3b).

The group represented by the above formula (3c) may be a group formed by reaction of the above-mentioned monomer components. Specifically, for example, the group is obtained by reaction between a diamine compound represented by the above formula (2) and a dicarbonyl compound represented by the above formula (3a) and/or a tetracarboxylic dianhydride represented by the formula (3b). More specifically, it is preferable that when q in the formula (3c) is 0 or 1, it is obtained by reaction between the above-mentioned diamine compound (2b) and tetracarboxylic dianhydride represented by the formula (3b) (when m1 in the formula (3c) is 1 or 2); and when q in the formula (3c) is 2, it is obtained by reaction between the above-mentioned diamine diol represented by the formula (2a) and the dicarbonyl compound represented by the formula (3a) (wherein m1 in the formula (3c) is 0).

Furthermore, when the group represented by the formula (3c) corresponds to $R^{BCb}$ in the formula (3b), q in the formula (3c) is 2, it is preferable that the group represented by the formula (3c) is obtained by reaction between diamine diol represented by the formula (2a) and a compound in which any one of carbonyl groups represented by —C(=O)A$^1$ or —C(=O)A$^2$ is substituted by an imide group in a dicarbonyl compound represented by the formula (3a), or a compound (trimellit acid anhydride and the like) in which any one of imide groups represented by two —C(=O)—O—C(=O)— of tetracarboxylic dianhydride represented by the formula (3b) is substituted by carboxy group (m1 in the formula (3c) is 0, a dotted line shown in the formula (3c) represents a single bond).

$R^{BN}$ in the formula (3c) is the same as $R^{BN}$ in the above formula (2). $R^{BCa}$ in the formula (3c) may be the same as $R^{BCa}$ in the formula (3a) or $R^{BCb}$ in the formula (3b), and specifically, may be the same as $R^{BCa}$ in the formula (3a) when, for example, m1 is 0, and as $R^{BCb}$ in the formula (3b) when m1 is 2. As $R^{B3}$, hydrogen is preferable.

In the present invention, tetracarboxylic dianhydride, in which $R^{BCa}$ in the formula (3a) is a dicarbonyl compound represented by the above formula (3c) and $R^{BCb}$ in the formula (3b) is a group represented by the formula (3c), may be reacted with a diamine compound represented by the formula (2) in advance, and blended into the energy-sensitive resin composition of the present invention. A dicarbonyl compound in which $R^{BCa}$ in the formula (3a) is a group represented by the formula (3c) and tetracarboxylic dianhydride in which $R^{BCb}$ in the formula (3b) is a group represented by the formula (3c) are reacted with a diamine compound represented by the formula (2) to form the below-mentioned imide ring-oxazole ring forming polymer (B3), a part of which is shown in the following formula.

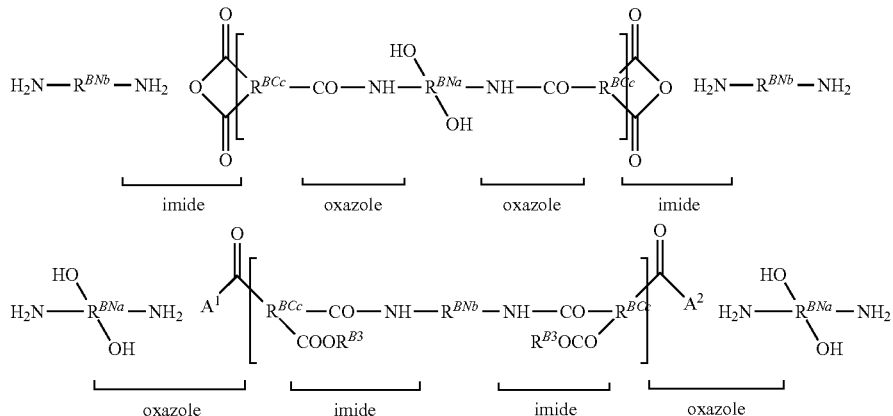

(In the formula, $R^{BNa}$, $R^{BNb}$, $R^{BCc}$, $R^{B3}$, $A^1$ and $A^2$ are as defined above.)

<Resin Precursor Component (B)/Precursor Polymer>

A precursor polymer has a repeating unit represented by the following formula (4).

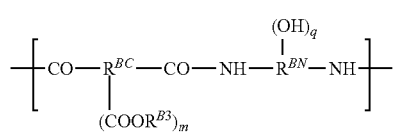

(4)

(In the formula, $R^{BN}$ and q are as defined above, $R^{BC}$ represents an organic group having a valence of (2+m), $R^{B3}$ represents a hydrogen atom or a monovalent organic group having 1 to 20 carbon atoms, and m is an integer from 0 to 2, wherein m+q>0 is satisfied.)

$R^{BN}$ represents an organic group having a valence of (2+q) as in $R^{BN}$ in the above formula (2), and preferably is an organic group having a valence of (2+q) including one or more aromatic rings. In the above formula (4), when $R^{BN}$ is an organic group having a valence of (2+q) including one or more aromatic rings, and q is 1 or 2, it is preferable that each pair of —NH— and a hydroxyl group constituting a combination of one pair or two pairs of —NH— and a hydroxyl group included in the repeating unit represented by the formula (4) are bonded to adjacent two carbon atoms on the aromatic ring included in $R^{BN}$.

As to $R^{BC}$, the "valence of (2+m)" in the above-mentioned "organic group having a valence of (2+m)" shows that the number of binding arms which the $R^{BC}$ represented by the formula (4) has is (2+m), in other words, the number of arms bonded to two —CO— and —(COOR$^{B3}$)$_m$ represented in the formula (4) is (2+m) in total. When $R^{BC}$ itself includes other substituents, the binding arms to the substituents are not included in the number of valences in "the valence of (2+m)". The same is true to $R^{BCa}$ in the above formula (3a) and $R^{BCb}$ in the above formula (3b).

The repeating unit represented in the above formula (4) may be obtained by the reaction of monomer components mentioned above. Specifically, for example, the repeating unit may be one obtained by reaction between a diamine compound represented in the above formula (2) and a dicarbonyl compound represented by the above formula (3a) and/or a tetracarboxylic dianhydride represented by the formula (3b). More specifically, it is preferable that when q in the formula (4) is 0 or 1, the repeating unit may be one obtained by reaction between the above-mentioned diamine compound (2b) and tetracarboxylic dianhydride represented by the formula (3b) (m in the formula (4) is 2), when q in the formula (4) is 2, the repeating unit is one obtained by reaction between the above-mentioned diamine diol represented by the formula (2a) and a dicarbonyl compound represented by the formula (3a) (m in the formula (4) is 0).

$R^{BN}$ in the formula (4) is the same as $R^{BN}$ in the above formula (2). $R^{BC}$ in the formula (4) is the same as $R^{BCa}$ in the formula (3a) or $R^{BCb}$ in the formula (3b). Specifically, for example, $R^{BC}$ is the same as $R^{BCa}$ in the formula (3a) when m is 0, and is the same as $R^{BC}$ in the formula (3b) when m is 2. As $R^{B3}$, hydrogen is preferable.

In the present invention, the "precursor polymer" is a polymer forming a ring by exposure or heating (also referred to as a "ring forming polymer" in the present application). Specific examples include a polymer forming an imide ring and/or an oxazole ring (also referred to as an "imide ring and/or oxazole ring forming polymer" in the present application), in other words, a polymer forming an imide ring (also referred to as an "imide ring forming polymer" in the present application), a polymer forming an oxazole ring (also referred to as an "oxazole ring forming polymer" in the present application), as well as a polymer forming an imide ring and an oxazole ring (also referred to as an "imide ring-oxazole ring forming polymer" in the present application). In the present application, the imide ring, for example, as an imidized product of pyromellitic acid dianhydride (including —C(=O)—N—C(=O)—), may be a ring constituting a part of a condensed ring with the other ring (for example, an imidized product of pyromellitic acid dianhydride); and an oxazole ring, for example, as a benzoxazole ring, may be a ring constituting a part of a condensed ring with the other ring (for example, a benzene ring in the benzoxazole ring); respectively.

The ring forming polymer becomes a polymer containing the corresponding ring by forming a ring (ring-closing) by exposure or heating (also referred to as a "ring-containing polymer" in the present application). Specific examples of the ring-containing polymer include an imide ring and/or oxazole ring-containing polymer, in other words, a polymer containing an imide ring (also referred to as an "imide ring-containing polymer" in the present application), a polymer containing an oxazole ring (also referred to as an "oxazole ring-containing polymer" in the present application), as well as a polymer containing an imide ring and an oxazole ring (also referred to as an "imide ring-oxazole ring-containing polymer" in the present application).

The precursor polymer includes a repeating unit represented by the above formula (4), and it may be a polymer obtained by reaction of the above-mentioned monomer components, and a polymer including a repeating unit represented by the above formula (4) as a main structure, and may be a polymer which does not include a repeating unit other than the repeating unit represented by the above formula (4).

$R^{BC}(COOR^3)_m$ in the above formula (4) is not particularly limited, and examples thereof include the following structures.

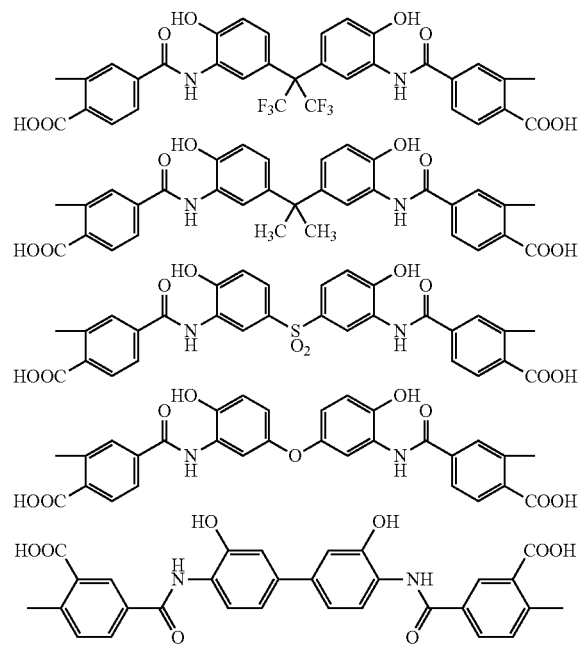

Furthermore, $R^{BN}(OH)_q$ in the above formula (4) is not particularly limited, and examples thereof include the following structures. Two types of more of these diamine components may be used, but from the viewpoint of solubility in an alkaline developing solution, preferably, 60 mol % or more of residues of diamine having a hydroxyl group is included.

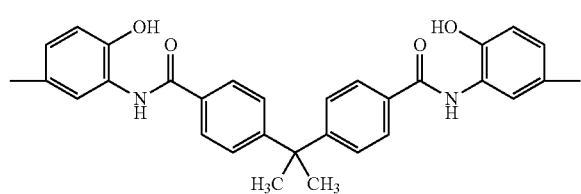

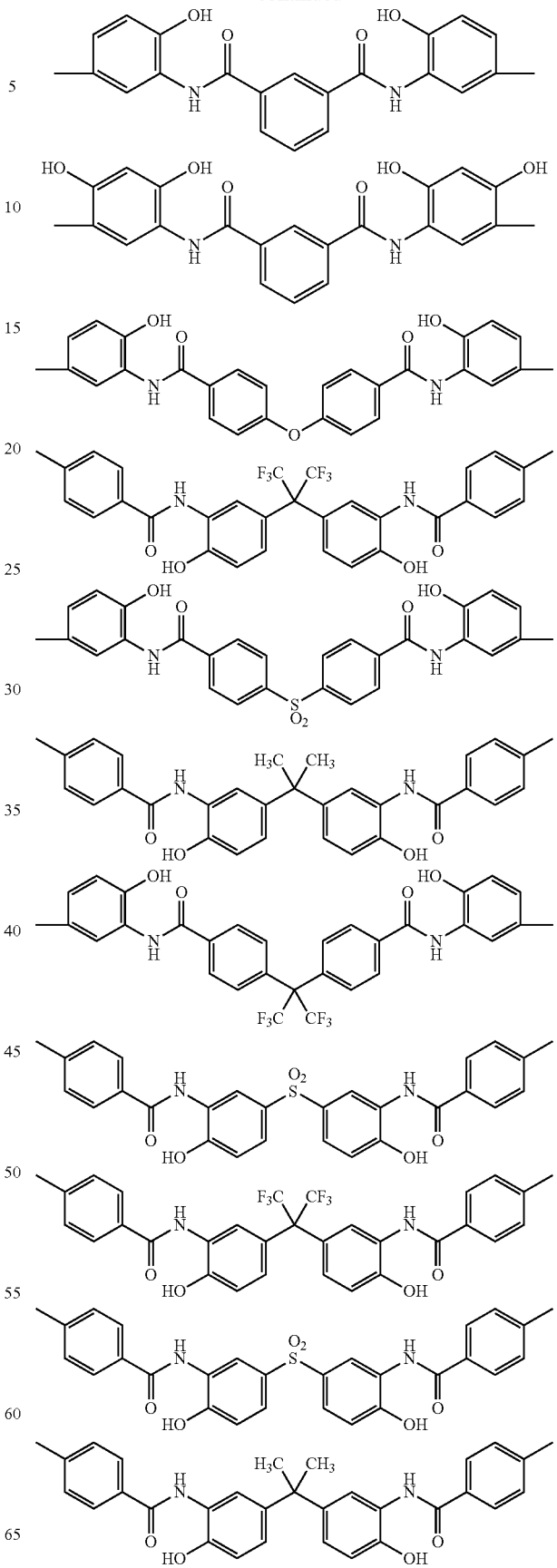

-continued

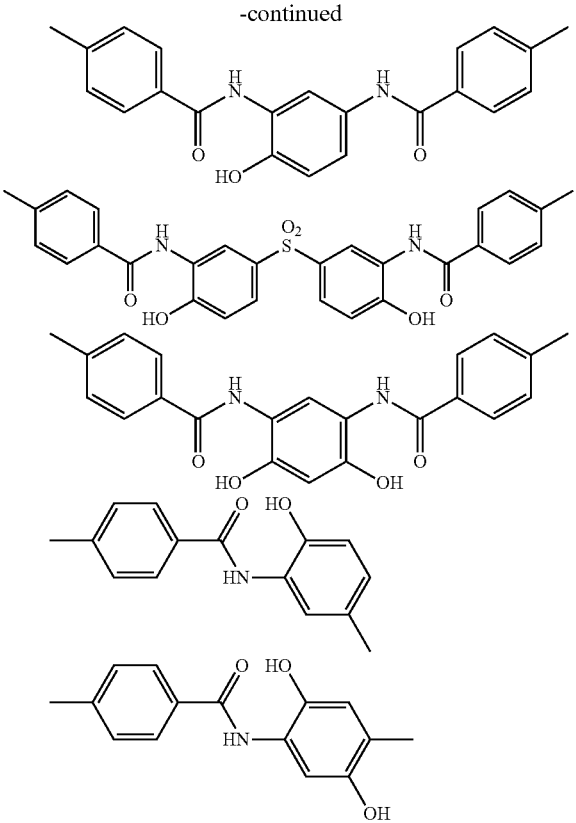

Examples of the component (B) in the energy-sensitive resin composition is as follows:
(B0-1) A combination of diamine diol and at least one selected from the group consisting of a dicarbonyl compound, a dialdehyde compound and dicarboxylic acid dihalide
(B0-2) A combination of diamine compound other than diamine diol (diamine compound (2b)) and tetracarboxylic dianhydride
A combination of a monomer component of a precursor polymer having a repeating unit represented by the formula (4) or a precursor polymer.
Note here that when the combination of the monomer components is used as the component (B), since the component (A) in the energy-sensitive resin composition acts as a catalyst or a curing agent, it can be allowed to be present after condensation reaction of each monomer component. Consequently, an energy-sensitive resin composition after condensation reaction of each monomer is a composition comprising a precursor polymer having a repeating unit represented by the formula (4) and the component (A).
The above-mentioned resin precursor component (B) is preferably a precursor polymer, and more preferably is at least one selected from the group consisting of:
(B1) an imide ring forming polymer (excluding a polymer of the below-mentioned (B3)) obtained by reacting a diamine compound and tetracarboxylic dianhydride with each other,
(B2) an oxazole ring forming polymer (excluding a polymer of the below-mentioned (B3)) obtained by reacting the above-mentioned diamine diol represented by the formula (2a) and dicarbonyl compound represented by the above formula (3a) with each other, and
(B3) an imide ring-oxazole ring forming polymer including a repeating unit represented by the below-mentioned formula (4c) as a main component.

The (B1) to (B3) may be obtained in the presence of the component (A) (in other words, may be the energy-sensitive resin composition according to the present invention, which is obtained by condensation reaction of the (B0-1) or (B0-2)), and a precursor polymer obtained in the absence of the component (A) may be used. Note here that it is preferable that (B1) to (B3) are obtained from each monomer component in the presence of component (A), because precursor polymers (B1) to (B3) having a smaller molecular weight distribution and a large mass average molecular weight. When the precursor polymer obtained in the absence of the component (A) is used, it is preferable to combine with the below-mentioned low-temperature baking or step baking in order to improve contribution to catalytic action and ring closure reaction efficiency of the component (A), or contribution to molecular weight increase of precursor polymer before imidization reaction (increase of molecular weight of the ring forming polymer). When (B1) to (B3) are obtained from each monomer component in the presence of component (A), the rate of the component (A) to each monomer component (the component (B), for example, the (B0-1) or (B0-2)) may be the same range in the above-mentioned content of component (A).
In the present application, an imide ring forming polymer excluding a polymer of the above-mentioned (B3) is also referred to as an "imide ring forming polymer (B1)," and an oxazole ring forming polymer excluding a polymer of the above-mentioned (B3) is also referred to as an "oxazole ring forming polymer (B2)". Furthermore, a polymer obtained by ring closure of the imide ring forming polymer (B1) is also referred to as an "imide ring-containing polymer (B1)", and a polymer obtained by ring closure of an oxazole ring forming polymer (B2) is also referred to as an "oxazole ring-containing polymer (B2)."

[Imide Ring Forming Polymer (B1)]
The imide ring forming polymer (B1) is a diamine compound represented by the above formula (2), and preferably a polymer obtained by reacting a diamine compound (2b) and tetracarboxylic dianhydride represented by the formula (3b) with each other, and also may be a polymer obtained by using one or two types or more of the diamine compound and/or tetracarboxylic dianhydride respectively, and may be, for example, an imide ring forming polymer obtained by subjecting a diamine compound and a mixture of two types or more of tetracarboxylic dianhydride to condensation polymerization. Furthermore, the imide ring forming polymer (B1) may be used singly or in combination of two or more.
The imide ring forming polymer (B1) may be typically a polymer appropriately selected from polyamic acids (polyamide acid) which have conventionally been known as a precursor of polyimide resin. Examples of the preferable imide ring forming polymer (B1) include the imide ring forming polymer (B1) represented by the following formula (4a-1).

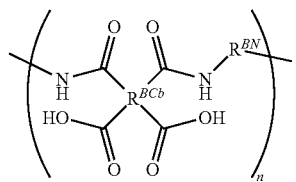

(4a-1)

(In the formula, $R^{BCb}$ and $R^{BN}$ are as defined above and n is the number of repeating units of the constituting unit represented in the parentheses.)

An imide ring-containing polymer (B1) represented by the following formula (4a) is obtained by ring closure (imidization) of an imide ring forming polymer represented by the above formula (4a-1) by heating or catalysis, and thus polyimide resin is formed. A method of ring closure by heating is not particularly limited and conventionally known methods can be used.

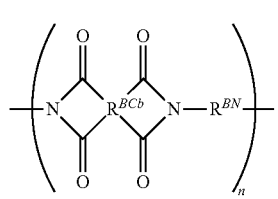

(In the formula, $R^{BCb}$, $R^{BN}$, and n are as defined above.)

An imide ring forming polymer (B1) represented by the above formula (4a-1) is obtained by reacting tetracarboxylic dianhydride and a diamine compound in a solvent with each other. Tetracarboxylic dianhydride, and the diamine compound as raw materials for synthesizing an imide ring forming polymer are as defined above, and is not particularly limited as long as polyamic acid can be formed by the reaction between an acid anhydride group and an amino group.

Amounts of the tetracarboxylic dianhydride and the diamine compound to be used upon synthesis of the imide ring forming polymer (B1) are not particularly limited; however, it is preferable to use 0.50 to 1.50 moles, and more preferable to use 0.60 to 1.30 moles, and particularly preferable to use 0.70 to 1.20 moles of the diamine compound relative to 1 mole of the tetracarboxylic dianhydride.

The reaction between tetracarboxylic dianhydride and diamine compound is usually performed in an organic solvent. The organic solvent used for the reaction of tetracarboxylic dianhydride and diamine compound is not particularly limited, as long as the solvent can dissolve the tetracarboxylic dianhydride and the diamine compound and does not react with the tetracarboxylic dianhydride or the diamine compound. The organic solvent may be used singly or in combination of two or more.

Examples of the organic solvent used for the reaction of tetracarboxylic dianhydride and diamine compound include nitrogen-containing polar solvents such as N-methyl-2-pyrrolidone, N,N-dimethylacetamide, N,N-dimethyl isobutylamide, N,N-diethyl acetamide, N,N-dimethylformamide, N,N-diethylformamide, N-methylcaprolactam and N,N,N', N'-tetramethyl urea, and the like; lactone-based polar solvents such as β-propiolactone, γ-butyrolactone, γ-valerolactone, δ-valerolactone, γ-caprolactone and ε-caprolactone, and the like; dimethyl sulfoxide; acetonitrile; fatty acid esters such as ethyl lactate and butyl lactate, and the like; and ethers such as diethyleneglycol dimethyl ether, diethyleneglycol diethyl ether, dioxane, tetrahydrofuran, methyl cellosolve acetate and ethyl cellosolve acetate, and the like.

Among these organic solvents, preferred are nitrogen-containing polar solvents including N-methyl-2-pyrrolidone, N,N-dimethylacetamide, N,N-diethyl acetamide, N,N-dimethylformamide, N,N-diethylformamide, N-methylcaprolactam and N,N,N',N'-tetramethylurea, and the like, for solubilities of the resulting imide ring forming polymer (B1) or polyimide resins.

[Oxazole Ring Forming Polymer (B2)]

The oxazole ring forming polymer (B2) is a polymer obtained by reacting the above-mentioned diamine diol represented by the formula (2a) and dicarbonyl compound represented by the formula (3a) with each other. The diamine diol and/or dicarbonyl compound each may be one or two or more types of polymers, and may be, for example, an oxazole ring forming polymer obtained by subjecting, for example, a mixture of two types or more of diamine diols and dicarbonyl compound to condensation polymerization. Furthermore, the oxazole ring forming polymer (B2) may be used singly or as a mixture of two or more. As the diamine diol represented by the formula (2a), aromatic diamine diol is preferable. The oxazole ring forming polymer (B2) may be typically a polymer that has been appropriately selected form the polymers conventionally known as a precursor of polyoxazole resin such as a polybenzoxazole resin.

As the dicarbonyl compound represented by the formula (3a), when a dialdehyde compound in which both $A^1$ and $A^2$ are a hydrogen atom is used, an oxazole ring forming polymers (B2) represented by the following formula (4b) are produced.

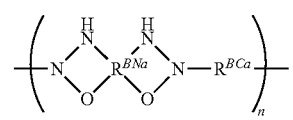

(In the formula, $R^{BNa}$ and $R^{BCa}$ are as defined above, and n is the number of repeating units of the unit represented by the formula (4b).)

When dicarboxylic acid dihalide in which both $A^1$ and $A^2$ are a halogen atom is used as the dicarbonyl compound represented by the formula (3a), an oxazole ring forming polymer (B2) represented by the following formula (4b-1) is manufactured.

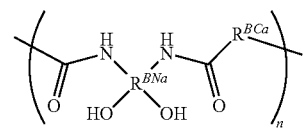

(In the formula, $R^{BNa}$ and $R^{BCa}$ are as defined above, and n is the number of repeating units of the unit represented by the formula (4b-1).)

Method of manufacturing oxazole ring forming polymer (B2)

In the present invention, an oxazole ring forming polymer (B2) is manufactured by reacting the diamine diol represented by the above formula (2a) and a dicarbonyl compound represented by the above formula (3a) in a solvent by a well-known method. Hereinafter, as typical examples of a manufacturing method of an oxazole ring forming polymer (B2), a manufacturing method in a case where a dicarbonyl compound is a dialdehyde compound, and the dicarbonyl compound is dicarboxylic halide will be described.

(Reaction Between Diamine Diol and Dialdehyde Compound)

The reaction between diamine diol and dialdehyde compound is carried out in a solvent. The reaction between diamine diol and dialdehyde compound is formation reaction of Schiff base, and can be carried out according to a well-known method. A reaction temperature is not particularly limited, and the temperature is usually preferably 20 to 200° C., more preferably 20 to 160° C., and particularly preferably 100 to 160° C.

Reaction between diamine diol and dialdehyde compound may be carried out while an entrainer is added into a solvent and subjected to reflux dehydration. The entrainer is not particularly limited, but it is appropriately selected from organic solvents to form an azeotropic mixture with water, and forming a two-phase system with water at room temperature. Suitable examples of entrainer include esters such as isobutyl acetate, allyl acetate, n-propyl propionate, isopropyl propionate, n-butyl propionate, and isobutyl propionate; ethers such as dichloromethyl ether, and ethyl isoamyl ether; ketones such as ethyl propyl ketone; and aromatic hydrocarbon such as toluene.

Time of reaction between diamine diol and dialdehyde compound is not particularly limited, but the preferable time is typically about 2 to 72 hours.

An amount of the dialdehyde compound to be used in manufacturing an oxazole ring forming polymer (B2) is preferably 0.5 to 1.5 moles, and more preferably 0.7 to 1.3 moles with respect to 1 mole of diamine diol.

An amount of solvent to be used is not particularly limited as long as the reaction between diamine diol and dialdehyde compound is well proceeds. Typically, it is preferable to use 1 to 40 times, preferably 1.5 to 20 times of the mass of solvent with respect to the total of a mass of diamine diol and a mass of dialdehyde compound.

The reaction between diamine diol and dialdehyde compound is preferably carried out until the number average molecular weight of the produced oxazole ring forming polymer (B2) becomes 1000 to 20000, and preferably 1200 to 5000.

(Reaction Between Diamine Diol and Dicarboxylic Acid Dihalide)

Reaction between diamine diol and dicarboxylic acid dihalide is carried out in a solvent. The reaction temperature is not particularly limited, but the temperature is usually preferably −20 to 150° C., more preferably −10 to 150° C., and particularly preferably −5 to 70° C. In the reaction between diamine diol and dicarboxylic acid dihalide, halogenated hydrogen is generated as a by-product. In order to neutralize such halogenated hydrogen, an organic base such as triethylamine, pyridine, and N,N-dimethyl-4 amino pyridine, alkali metal hydroxide such as sodium hydroxide and potassium hydroxide may be added into reaction solution in a small amount.

Time of the reaction between diamine diol and dicarboxylic acid dihalide is not particularly limited, but typically, about 2 to 72 hours is preferable.

An amount of dicarboxylic acid dihalide to be used in manufacturing an oxazole ring forming polymer (B2) is preferably 0.5 to 1.5 moles, and more preferably 0.7 to 1.3 moles with respect to 1 mole of diamine diol.

An amount of solvent to be used is not particularly limited as long as the reaction between diamine diol and dicarboxylic acid dihalide is well proceeds. Typically, it is preferable to use 1 to 40 times, preferably 1.5 to 20 times of the mass of solvent with respect to the total of a mass of diamine diol and a mass of dicarboxylic acid dihalide.

The reaction between diamine diol and dicarboxylic acid dihalide is preferably carried out until the number average molecular weight of the produced oxazole ring forming polymer (B2) becomes 1000 to 20000, and preferably 1200 to 5000.

A solution of the oxazole ring forming polymer (B2) is obtained by the method as described above. When the energy-sensitive resin composition according to the present invention is prepared, a solution of the oxazole ring forming polymer (B2) can be used as it is. Furthermore, it is possible to use an oxazole ring forming polymer (B2) in a form of paste or solid obtained by removing at least a part of a solvent from a solution of the oxazole ring forming polymer (B2) under reduced pressure, at a low temperature such that conversion from an oxazole ring forming polymer (B2) into an oxazole ring-containing polymer does not occur. Furthermore, it is possible to use a solution of the oxazole ring forming polymer (B2) whose solid content concentration has been adjusted by adding an appropriate amount of solvent or the like to a solution of the oxazole ring forming polymer (B2) obtained by the above-mentioned reaction, for preparing the energy-sensitive resin composition according to the present invention.

Examples of the organic solvent used for the reaction between diamine diol and dicarbonyl compound include nitrogen-containing polar solvents such as N-methyl-2-pyrrolidone, N,N-dimethylacetamide, N,N-dimethyl isobutylamide, N,N-diethyl acetamide, N,N-dimethylformamide, N,N-diethylformamide, N,N,2-tirmethyl propionamide, N-methylcaprolactam and N,N,N',N'-tetramethyl urea, and the like; lactone-based polar solvents such as R-propiolactone, γ-butyrolactone, γ-valerolactone, 5-valerolactone, γ-caprolactone and ε-caprolactone, and the like; dimethyl sulfoxide; acetonitrile; fatty acid esters such as ethyl lactate and butyl lactate, and the like; and ethers such as diethyleneglycol dimethyl ether, diethyleneglycol diethyl ether, dioxane, tetrahydrofuran, methyl cellosolve acetate and ethyl cellosolve acetate, and the like Among these organic solvents, preferred are nitrogen-containing polar solvents including N-methyl-2-pyrrolidone, N,N-dimethylacetamide, N,N-diethyl acetamide, N,N-dimethylformamide, N,N-diethylformamide, N,N,2-tirmethyl propionamide, N-methylcaprolactam and N,N,N', N'-tetramethylurea, and the like for solubilities of the resulting oxazole ring forming polymer (B2) and an oxazole ring-containing polymer.

[Imide Ring—Oxazole Ring Forming Polymer (B3)]

An imide ring-oxazole ring forming polymer (B3) includes a repeating unit represented by the following formula (4c) as a main component.

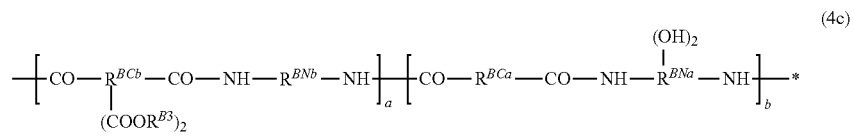

(4c)

-continued

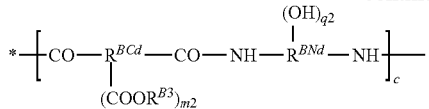

(In the formula, $R^{BNa}$, $R^{BCa}$, $R^{BCb}$, and $R^{B3}$ are each as defined above independently, $R^{BNb}$ represents a divalent organic group, $R^{BNd}$ represents an organic group having a valence of (2+q2), $R^{BCd}$ represents an organic group having a valence of (2+m2), m2 and q2 are each independently 1 or 2, a, b and c are each independently an integer of 0 or more, and the bonding order among repeating units of a pieces of repeating units, b pieces of repeating units, and c pieces of repeating units is not limited to the order described in the formula (4c), wherein a>0 and b>0 are satisfied, or c>0 is satisfied.)

Examples of $R^{BNb}$ and $R^{BNd}$ are the same as those of the organic group as $R^{BNb}$ in the above formula (2) except for the number of valences, and the same is true to $R^{BNb}$ and $R^{BNd}$. As the organic group, an organic group including one or more aromatic rings is preferable. In the above formula (4c), when $R^{BNb}$ is an organic group having a valence of (2+q) including one or more aromatic rings, and q is 1 or 2, it is preferable that each pair of —NH— and a hydroxyl group constituting a combination of one or two pairs of —NH— and a hydroxyl group included in the repeating unit represented by the formula (4) are bonded to adjacent two carbon atoms on the aromatic ring included in $R^{BNd}$, similar to $R^{BNa}$.

As to $R^{BCd}$, the "valence of (2+m2)" in the above-mentioned "organic group having a valence of (2+m2)" shows that the number of binding arms which the $R^{BCd}$ represented by the formula (4c) has is (2+m2), in other words, the number of arms bonded to two —CO— represented by the formula (4c) and —$(COOR^{B3})_{m2}$ is (2+m2) in total. When $R^{BCd}$ itself includes other substituents, the binding arms to the substituents are not included in the number of valences in "the valence of (2+m2)". The same is true to $R^{BNd}$.

The imide ring-oxazole ring forming polymer (B3) is a polymer obtained by reacting a diamine compound represented by the above formula (2) and tetracarboxylic dianhydride represented by the above formula (3b) and the dicarbonyl compound represented by the formula (3a). Specifically, imide ring-oxazole ring forming polymer (B3) is a polymer obtained by reacting an imide ring forming structure obtained by reacting a diamine compound represented by the formula (2), preferably a diamine compound (2b) with a tetracarboxylic dianhydride represented by the formula (3b) and an oxazole ring forming structure obtained by reacting diamine diol represented by the formula (2a) with dicarbonyl compound represented by the above formula (3a).

The imide ring forming structure is represented by, for example, —$R^{BCd}[(COOR^{B3})_{m2})]$—CO—NH— of a pieces of the repeating units or c pieces of the repeating units in the formula (2). The oxazole ring forming structure is represented by, for example, —CO—NH—$R^{BNd}[(OH)_{q2})]$— of b pieces of the repeating units or c pieces of the repeating units in the formula (2).

The imide ring-oxazole ring forming polymer (B3) may be an imide ring-oxazole ring forming polymer obtained by using one or two types or more of each of a diamine compound, tetracarboxylic dianhydride and/or dicarbonyl compound. Furthermore, the imide ring forming polymer (B1) can be used singly or as a mixture of two or more.

<Solvent (S)>

The energy-sensitive resin composition according to the present invention includes a solvent from the perspective of application characteristics and may be in a state of a paste comprising a solid or in a state of a solution, and preferably in a state of a solution. The solvent may be used singly or in combination of two or more. There is no particular limitation for the type of solvent as long as it does not interfere with the object of the present invention. Preferred examples of the solvent are similar to the examples of the solvent used in the reaction between tetracarboxylic dianhydride and diamine compound, and examples of the solvents to be used for the reaction between diamine diol and dicarbonyl compound. The solvent may include an alcohol solvent such as polyethylene glycol, ethylene glycol, diethylene glycol, propylene glycol, and dipropylene glycol, and the like. When the solvent includes an alcohol-based solvent, a pattern which is good in heat resistance is likely to be formed.

The solvent may use a solvent comprising a compound (S1) represented by the following formula (5).

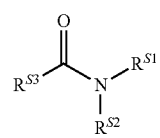

(5)

(In the formula (5), $R^{S1}$ and $R^{S2}$ each independently represents an alkyl group having 1 to 3 carbon atoms, and $R^{S3}$ is a group represented by the following formula (5-1) or the following formula (5-2):

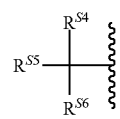

(5-1)

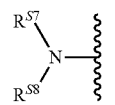

(5-2)

In the formula (5-1), $R^{S4}$ is a hydrogen atom or a hydroxyl group, $R^{S5}$ and $R^{S6}$ each independently represents an alkyl group having 1 to 3 carbon atoms. In the formula (5-2), $R^{S7}$ and $R^{S8}$ each independently represents a hydrogen atom, or an alkyl group having 1 to 3 carbon atoms.)

Specific examples of the compounds (S1) represented by the formula (5) in which $R^{S3}$ is a group represented by the formula (5-1) include N,N,2-tirmethyl propionamide, N-ethyl,N,2-dimethyl propionamide, N,N-diethyl-2-methyl propionamide, N,N,2-trimethyl-2-hydroxy propionamide, N-ethyl-N,2-dimethyl-2-hydroxy propionamide, N,N-diethyl-2-hydroxy-2-methyl propionamide, and the like.

Specific examples of compounds (S1) represented by the formula (5) in which $R^{S3}$ is a group represented by the formula (5-2) include N,N,N',N'-tetramethylurea, N,N,N', N'-tetraethylurea, and the like.

Among the examples of the above-mentioned compounds (S1), N,N,2-tirmethyl propionamide is particularly preferable, and N,N,N',N'-tetramethylurea is preferable. The boiling point of N,N,2-tirmethyl propionamide under atmospheric pressure is 175° C., and the boiling point of N,N, N',N'-tetramethylurea under atmospheric pressure is 177° C. In this way, in N,N,2-tirmethyl propionamide and N,N,N', N'-tetramethylurea have a relatively low boiling point in a solvent capable of dissolving imide ring and/or oxazole ring forming polymer and the monomer components thereof. Therefore, when an imide ring- and/or oxazole ring-containing polymer is formed using an imide ring and/or oxazole ring forming polymer synthesized by using a solvent including at least one type selected from N,N,2-tirmethyl propionamide and N,N,N',N'-tetramethylurea, when the imide ring and/or oxazole ring forming polymer is heated, in a film or a molded article comprising the resulting imide ring- and/or oxazole ring-containing polymer, a solvent does not tend to remain, thus making it difficult to cause deterioration of tensile elongation of the resulting film or molded article.

In addition, N,N,2-tirmethyl propionamide and N,N,N', N'-tetramethylurea are not identified as SVHC (Substance of Very High Concern) as having concern about harmful effects under REACH regulation of EU (European Union), and therefore they are useful as less harmful substances.

The content of compound (S1) in a solvent to be used for preparing in the imide ring and/or oxazole ring forming polymer is not particularly limited within a range that does not inhibit the object of the present invention. The rate of the compound (S1) with respect to the mass of the solvent is typically preferably 70% by mass or more, more preferably 80% by mass or more, particularly preferably 90% by mass or more, and the most preferably 100% by mass.

Examples of the organic solvent that can be used together with the compound (S1) include nitrogen-containing polar solvents such as N,N-dimethylformamide, N,N-dimethylacetamide, N-methyl-2-pyrrolidone, hexamethylphosphoramide, and 1,3-dimethyl-2-imidazolidinone; ketones such as methyl ethyl ketone, methyl isobutyl ketone, cyclohexanone, and isophorone; esters such as γ-butyrolactone, γ-valerolactone, 5-valerolactone, γ-caprolactone, ε-caprolactone, α-methyl-γ-butyrolactone, ethyl lactate, methyl acetate, ethyl acetate, and n-butyl acetate; cyclic ethers such as dioxane and tetrahydrofuran; cyclic esters such as ethylene carbonate and propylene carbonate; aromatic hydrocarbons such as toluene and xylene; and sulfoxides such as dimethyl sulfoxide.

The content of a solvent (S) in the energy-sensitive resin composition is not particularly limited, within a range that does not inhibit objects of the present invention. The content of a solvent (S) in the energy-sensitive resin composition is appropriately adjusted depending upon the solid content in the energy-sensitive resin composition. The solid content of the energy-sensitive resin composition is, for example, 1 to 80% by mass, preferably 5 and 70% by mass, and more preferably 10 to 60% by mass.

<Other Components>

The energy-sensitive resin composition according to the present invention may include other components in addition to the above-mentioned components within a range that does not inhibit the object of the present invention. Examples of the other components include polymerizing components such as a base generating component, a silicon-containing compound, and a monomer, surfactant, plasticizer, viscosity modifiers, anti-foaming agents, various fillers such as high-dielectric filler or low-dielectric filler, and colorants. Examples of the low-dielectric filler include PTFE (polytetrafluoroethylene) filler and the like. When the method of manufacturing below-mentioned film or molded article or the method of forming a pattern includes an exposure step, it is preferred a base generator component that generates a base by exposure is further comprised. In the present application, "light" means irradiation of radiated rays as whole, the same is true to the "light" in the "exposure."

[Base Generator Component]

In exposing an energy-sensitive resin composition comprising a base generator component, the ring closure of the component (B) in the energy-sensitive resin composition is accelerated by the base generated in an exposed portion so that the exposed portion becomes insoluble in the developing solution. Meanwhile, since the unexposed portion is soluble in the developing solution, it can be removed by dissolving such part in the developing solution. Therefore, it is possible to form a desired pattern by selectively exposing the energy-sensitive resin composition.

Examples of the base generator component include, for example, a compound (D-1) which decomposes by the action of light and generates an imidazole compound, and an oxime ester compound (D-2). Below, the compounds (D-1) and (D-2) will be explained.

[Compound (D-1) which Decomposes by the Action of Light and Generates Imidazole Compound]

An imidazole compound which the compound (D-1) generates accelerates ring closure of the component (B) in the energy-sensitive resin composition according to the present invention as a basic imidation catalyst. The imidazole compound which the compound (D-1) generates may be imidazole or an imidazole compound where a part or all of the hydrogen atoms bound to the carbon atoms in the imidazole are replaced with a substituent (s). The imidazole compound represented by the following formula (d3) is preferred.

(d3)

(In the formula, $R^{D1}$, $R^{D2}$ and $R^{D3}$ each independently represents a hydrogen atom, a halogen atom, a hydroxyl group, a mercapto group, a sulfide group, a silyl group, a silanol group, a nitro group, a nitroso group, a sulfonato group, a phosphino group, a phosphinyl group, a phosphonato group, or an organic group.)

As the organic group in $R^{D1}$, $R^{D2}$ and $R^{D3}$, an alkyl group, an alkenyl group, a cycloalkyl group, a cycloalkenyl group, an aryl group, an aralkyl group, and the like can be exemplified. The organic group may include a hetero atom. In addition, the organic group can be either a straight chain, a branched chain, or cyclic. This organic group is generally monovalent; however, can also be an organic group of divalent or more in a case of forming a cyclic structure or the like.

$R^{D1}$ and $R^{D2}$ can bind to form a cyclic structure, and can further include a hetero atom bond. As the cyclic structure, a heterocycloalkyl group, a heteroaryl group and the like can be exemplified, and the cyclic structure can also be a condensed ring.

In the case where the organic group represented by $R^{D1}$, $R^{D2}$ or $R^{D3}$ includes a hetero atom, examples of the hetero atom include an oxygen atom, a nitrogen atom, and a silicon atom. Specific examples of the bond including a hetero atom include an ether bond, a thioether bond, a carbonyl bond, a thiocarbonyl bond, an ester bond, an amide bond, a urethane bond, an imino bond (—N=C(—R)— or —C(=NR)—: R representing a hydrogen atom or an organic group, the same applies below), a carbonate bond, a sulfonyl bond, a sulfinyl bond, an azo bond and the like. Inter alia, from the viewpoint of thermal resistance of the imidazole compound, an ether bond, a thioether bond, a carbonyl bond, a thiocarbonyl bond, an ester bond, an amide bond, a urethane bond, an imino bond, a carbonate bond, a sulfonyl bond, and a sulfinyl bond are preferable.

A hydrogen atom(s) included in the groups other than the organic groups represented by $R^{D1}$, $R^{D2}$ or $R^{D3}$ may be substituted with a hydrocarbon group(s). This hydrocarbon group can be either a straight chain, a branched chain, or cyclic.

As $R^{D1}$, $R^{D2}$ and $R^{D3}$, each independently represents a hydrogen atom, an alkyl group having 1 to 12 carbon atoms, an aryl group having 1 to 12 carbon atoms, an alkoxy group having 1 to 12 carbon atoms, and a halogen atom are preferable, and a hydrogen atom is more preferable. Since the imidazole compound where all of $R^{D1}$, $R^{D2}$ and $R^{D3}$ are each a hydrogen atom has a simple structure with a small steric hindrance, such an imidazole compound can easily act on polyamic acid as an imidation catalyst.

The compound (D-1) is not particularly limited, as long as the compound (D-1) decomposes by the action of light and generates an imidazole compound, preferably an imidazole compound represented by the above formula (d3). Compounds which can be used as compound (D-1) are obtained by replacing the skeleton originating from amines which are generated upon exposure from the compounds which are conventionally contained in photosensitive resin compositions and generate amines by the action of light, with the skeleton originating from the imidazole compounds, preferably the imidazole compounds represented by the above formula (3).

Examples of the preferred compound (D-1) include the compounds represented by the following formula (d4):

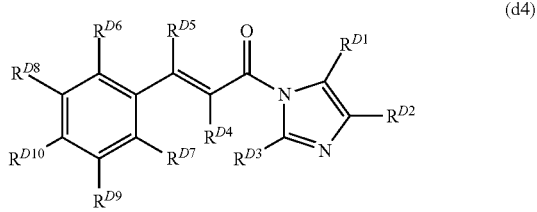

(Wherein $R^{D1}$, $R^{D2}$ and $R^{D3}$ each independently represents a hydrogen atom, a halogen atom, a hydroxyl group, a mercapto group, a sulfide group, a silyl group, a silanol group, a nitro group, a nitroso group, a phosphino group, a sulfonato group, a phosphinyl group, a phosphonato group, or an organic group;

$R^{D4}$ and $R^{D5}$ each independently represents a hydrogen atom, a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group, or an organic group; $R^{D6}$, $R^{D7}$, $R^{D8}$, $R^{D9}$ and $R^{D10}$ each independently represents a hydrogen atom, a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group, an amino group, an ammonio group, or an organic group; and two or more of $R^{D6}$, $R^{D7}$, $R^{D8}$, $R^{D9}$ and $R^{D10}$ may join together to form a cyclic structure, or may include a bond of a hetero atom).

In the formula (d4), $R^{D1}$, $R^{D2}$, and $R^{D3}$ are similar to those explained regarding the formula (d3).

In the formula (d4), as the organic group represented by $R^{D4}$ and $R^{D5}$, those listed for $R^{D1}$, $R^{D2}$, and $R^{D3}$ can be exemplified. This organic group can include a hetero atom, as in the case of $R^{D1}$, $R^{D2}$, and $R^{D3}$. Further, the organic group can be either a straight chain, a branched chain, or cyclic.

$R^{D4}$ and $R^{D5}$ are preferably, respectively independently a hydrogen atom, an alkyl group having 1 to 10 carbon atoms, a cycloalkyl group having 4 to 13 carbon atoms, a cycloalkenyl group having 4 to 13 carbon atoms, an aryloxy alkyl group having 7 to 16 carbon atoms, an aralkyl group having 7 to 20 carbon atoms, an alkyl group having 2 to 11 carbon atoms substituted with a cyano group, an alkyl group having 1 to 10 carbon atoms substituted with a hydroxyl group, an alkoxy group having 1 to 10 carbon atoms, an amide group having 2 to 11 carbon atoms, an alkylthio group having 1 to 10 carbon atoms, an acyl group having 1 to 10 carbon atoms, an ester group (—COOR, —OCOR: R representing a hydrocarbon group) having 2 to 11 carbon atoms, an aryl group having 6 to 20 carbon atoms, an aryl group having 6 to 20 carbon atoms substituted with an electron-donating group and/or an electron-withdrawing group, a benzyl group substituted with an electron-donating group and/or an electron-withdrawing group, a cyano group, and a methylthio group. More preferably, $R^{D4}$ and $R^{D5}$ are both hydrogen atoms; or $R^{D4}$ is a methyl group and $R^{D5}$ is a hydrogen atom.

In the formula (d4), as the organic group in $R^{D6}$, $R^{D7}$, $R^{D8}$, $R^{D9}$ or $R^{D10}$, those listed for $R^{D1}$, $R^{D2}$, and $R^{D3}$ can be exemplified. As in the case of $R^{D1}$ and $R^{D2}$, this organic group can include a hetero atom. Further, this organic group can be either a straight chain, a branched chain, or cyclic.

At least two of $R^{D6}$, $R^{D7}$, $R^{D8}$, $R^{D9}$ and $R^{D10}$ can bind to form a cyclic structure, and these can further include a bond of hetero atoms. As the cyclic structure, a heterocycloalkyl group, a heteroaryl group and the like can be exemplified, and the cyclic structure can also be a condensed ring. For example, two or more of $R^{D6}$, $R^{D7}$, $R^{D8}$, $R^{D9}$ and $R^{D10}$ join together to form a condensed ring such as naphthalene, anthracene, phenanthrene and indene by sharing the atoms of the benzene ring to which $R^{D6}$, $R^{D7}$, $R^{D8}$, $R^{D9}$ and $R^{D10}$ are attached.

$R^{D6}$, $R^{D7}$, $R^{D8}$, $R^{D9}$ and $R^{D10}$ are preferably, respectively independently a hydrogen atom, an alkyl group having 1 to 10 carbon atoms, a cycloalkyl group having 4 to 13 carbon atoms, a cycloalkenyl group having 4 to 13 carbon atoms, an aryloxy alkyl group having 7 to 16 carbon atoms, an aralkyl group having 7 to 20 carbon atoms, an alkyl group having 2 to 11 carbon atoms substituted with a cyano group, an alkyl group having 1 to 10 carbon atoms substituted with a hydroxyl group, an alkoxy group having 1 to 10 carbon atoms, an amide group having 2 to 11 carbon atoms, an alkylthio group having 1 to 10 carbon atoms, an acyl group having 1 to 10 carbon atoms, an ester group having 2 to 11 carbon atoms, an aryl group having 6 to 20 carbon atoms, an aryl group having 6 to 20 carbon atoms substituted with an electron-donating group and/or an electron-withdrawing group, a benzyl group substituted with an electron-donating group and/or an electron-withdrawing group, a cyano group, a methylthio group and a nitro group.

A case where two or more of $R^{D6}$, $R^{D7}$, $R^{D8}$, $R^{D9}$ and $R^{D10}$ join together to form a condensed ring such as naphthalene, anthracene, phenanthrene and indene by sharing the atoms of the benzene ring to which $R^{D6}$, $R^{D7}$, $R^{D8}$, $R^{D9}$ and $R^{D10}$ are attached is preferred because the absorption wavelength is shifted toward a longer wavelength.

Among the compounds represented by the above formula (d4), compounds represented by the following formula (d5);

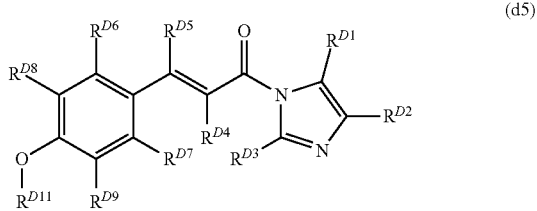
(d5)

(wherein $R^{D1}$, $R^{D2}$ and $R^{D3}$ are used synonymously with those in formulas (d3) and (d4);
$R^{D4}$ to $R^{D9}$ are used synonymously with those in formula (d4);
$R^{D11}$ represents a hydrogen atom or an organic group;
$R^{D6}$ and $R^{D7}$ shall not be a hydroxyl group; and two or more of $R^{D6}$, $R^{D7}$, $R^{D8}$ and $R^{D9}$ may join together to form a cyclic structure, or may include a bond of a hetero atom), are preferred.

The compounds represented by formula (d5) have good solubility in organic solvents because they have a substituent —O—$R^{D11}$.

In formula (d5), in a case where $R^{D11}$ is an organic group, those exemplified with regard to $R^{D1}$, $R^{D2}$ and $R^{D3}$ may be referred to as the organic group. This organic group may include a hetero atom. This organic group may be any of a straight chain, a branched chain, and cyclic. For $R^{D11}$, a hydrogen atom or an alkyl group having 1 to 12 carbon atoms is preferred, and a methyl group is more preferred.

Examples of the preferred compounds (D-1) also include the compounds represented by the following formula (d6).

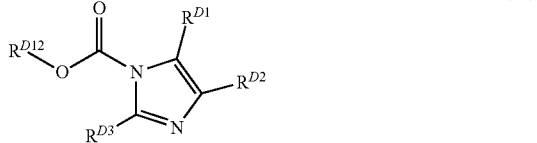
(d6)

(Wherein $R^{D1}$, $R^{D2}$ and $R^{D3}$ each independently represents a hydrogen atom, a halogen atom, a hydroxyl group, a mercapto group, a sulfide group, a silyl group, a silanol group, a nitro group, a nitroso group, a phosphino group, a sulfonato group, a phosphinyl group, a phosphonato group, or an organic group; and $R^{D12}$ represents an optionally substituted hydrocarbon group.)

$R^{D1}$, $R^{D2}$ and $R^{D3}$ in the formula (d6) are similar to those explained with respect to the formula (d3).

In the formula (d6), examples of $R^{D12}$ include an alkyl group having 1 to 20 carbon atoms, an alkenyl group having 2 to 20 carbon atoms, an optionally substituted aryl group having 6 to 20 carbon atoms, and an optionally substituted aralkyl group having 7 to 20 carbon atoms, and an optionally substituted aralkyl group having 7 to 20 carbon atoms is preferred. In a case where the aryl group or an aralkyl group is substituted, examples of the substituent include a halogen atom, a nitro group, an alkyl group having 1 to 4 carbon atoms, and an alkoxy group having 1 to 4 carbon atoms.

The compound represented by the formula (d6) can be synthesized by the reaction of an imidazole compound represented by the formula (d3) and chloroformate represented by the following formula (d7), by the reaction of an imidazole compound represented by the formula (d3) and dicarbonate represented by the following formula (d8), or by the reaction of a carbonylimidazole compound represented by the following formula (d9) and an alcohol represented by the following formula (d10).

(d7)

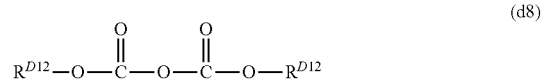
(d8)

(d9)

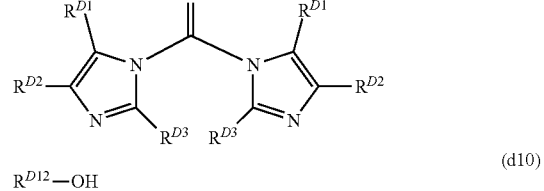

(d10)
$R^{D12}$—OH (Wherein, $R^{D1}$, $R^{D2}$ and $R^{D3}$ in the formulas (d7) to (d10) are as defined in the formula (d3); and $R^{D12}$ is as defined in the formula (d6).)

Specific examples of the particularly suitable compounds as the compound (D-1) are shown below.

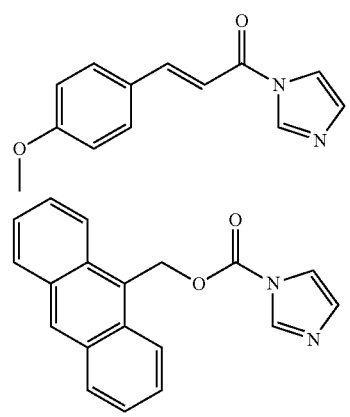

[Oxime Ester Compound (D-2)]

The oxime ester compound (D-2) decomposes by the action of light and generates a base. The ring closure of the component (B) in the energy-sensitive resin composition according to the present invention is accelerated by the base generated by the decomposition of compound (D-2).

Examples of the preferred compound (D-2) include compounds represented by the following formula (d11).

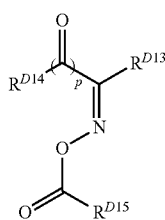

(d11)

In the following formula (d11), $R^{D13}$ represents an alkyl group having 1 to 10 carbon atoms, an optionally substituted phenyl group or an optionally substituted carbazolyl group; and p is 0 or 1. $R^{D14}$ represents an optionally substituted alkyl group having 1 to 10 carbon atoms, an optionally substituted phenyl group, an optionally substituted carbazolyl group. $R^{D15}$ represents a hydrogen atom, an alkyl group having 1 to 6 carbon atoms or an optionally substituted phenyl group.

In a case where $R^{D13}$ represents an alkyl group having 1 to 10 carbon atoms, the alkyl group may be a straight chain, or a branched chain. In this case, the number of carbon atoms of the alkyl group is preferably 1 to 8, and more preferably 1 to 5.

In a case where $R^{D13}$ represents an optionally substituted phenyl group, there is no particular limitation for the type of substituents as long as they do not interfere with the object of the present invention. Suitable examples of the substituents which a phenyl group may have include an alkyl group, an alkoxy group, a cycloalkyl group, a cycloalkoxy group, a saturated aliphatic acyl group, an alkoxycarbonyl group, a saturated aliphatic acyloxy group, an optionally substituted phenyl group, an optionally substituted phenoxy group, an optionally substituted benzoyl group, an optionally substituted phenoxycarbonyl group, an optionally substituted benzoyloxy group, an optionally substituted phenylalkyl group, an optionally substituted naphthyl group, an optionally substituted naphthoxy group, an optionally substituted naphthoyl group, an optionally substituted naphthoxycarbonyl group, an optionally substituted naphthoyloxy group, an optionally substituted naphthylalkyl group, an optionally substituted heterocyclyl group, an amino group, an amino group substituted with one or two organic groups, a morpholin-1-yl group, and a piperazin-1-yl group, halogen, a nitro group, and a cyano group and the like. When $R^{D13}$ is an optionally substituted phenyl group, and the phenyl group has two or more substituents, the two or more substituents may be the same, or may be different.

In a case where a substituent on the phenyl group is an alkyl group, the number of carbon atoms of the substituent is preferably 1 to 20, more preferably 1 to 10, still more preferably 1 to 6, particularly preferably 1 to 3, and the most preferably 1. The alkyl group may be a straight chain or a branched chain. In a case where a substituent on the phenyl group is an alkyl group, specific examples of the alkyl group include a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an n-heptyl group, an n-octyl group, an isooctyl group, a sec-octyl group, a tert-octyl group, an n-nonyl group, an isononyl group, an n-decyl group, an isodecyl group and the like. The alkyl group may include an ether bond (—O—) in the carbon chain. In this case, examples of the substituent on the phenyl group include an alkoxyalkyl group and an alkoxyalkoxyalkyl group. In a case where the substituent on the phenyl group is an alkoxyalkyl group, a group represented by —$R^{D16}$—O—$R^{D17}$ is preferred. $R^{D16}$ is an alkylene group having 1 to 10 carbon atoms, which may be a straight chain or a branched chain. $R^{D17}$ is an alkyl group having 1 to 10 carbon atoms, which may be a straight chain or a branched chain. The number of carbon atoms of $R^{D16}$ is preferably 1 to 8, more preferably 1 to 5, and particularly preferably 1 to 3. The number of carbon atoms of $R^{D17}$ is preferably 1 to 8, more preferably 1 to 5, particularly preferably 1 to 3, and the most preferably, 1. Examples of the alkyl group having an ether bond in the carbon chain include a methoxyethyl group, an ethoxyethyl group, a methoxyethoxyethyl group, an ethoxyethoxyethyl group, a propyloxyethoxyethyl group, a methoxypropyl group and the like.

In a case where a substituent on the phenyl group is an alkoxy group, the number of carbon atoms of the substituent is preferably 1 to 20, more preferably 1 to 6. The alkoxy group may be a straight chain or a branched chain. Specific examples of the alkoxy group when a substituent on the phenyl group is an alkoxy group include a methoxy group, an ethoxy group, an n-propyloxy group, an isopropyloxy group, an n-butyloxy group, an isobutyloxy group, a sec-butyloxy group, a tert-butyloxy group, an n-pentyloxy group, an isopentyloxy group, a sec-pentyloxy group, a tert-pentyloxy group, an n-hexyloxy group, an n-heptyloxy group, an n-octyloxy group, an isooctyloxy group, a sec-octyloxy group, a tert-octyloxy group, an n-nonyloxy group, an isononyloxy group, an n-decyloxy group, an isodecyloxy group and the like. The alkoxy group may include an ether bond (—O—) in the carbon chain. Examples of the alkoxy group having an ether bond in the carbon chain include a methoxyethoxy group, an ethoxyethoxy group, a 2-methoxy-1-methylethoxy group, a methoxyethoxyethoxy group, an ethoxyethoxyethoxy group, a propyloxyethoxyethoxy group, a methoxypropyloxy group and the like.

In a case where a substituent on the phenyl group is a cycloalkyl group or a cycloalkoxy group, the number of carbon atoms of the substituent is preferably 3 to 10, more preferably 3 to 6. In a case where a substituent on the phenyl group is a cycloalkyl group, specific examples of the cycloalkyl group include a cyclopropyl group, a cyclobutyl group, a cyclopentyl group, a cyclohexyl group, a cycloheptyl group, a cyclooctyl group and the like. In a case where a substituent on the phenyl group is a cycloalkoxy group, specific examples of the cycloalkoxy group include a cyclopropyloxy group, a cyclobutyloxy group, a cyclopentyloxy group, a cyclohexyloxy group, a cycloheptyloxy group, a cyclooctyloxy group and the like.

In a case where a substituent on the phenyl group is a saturated aliphatic acyl group or a saturated aliphatic acyloxy group, the number of carbon atoms of the substituent is preferably 2 to 20, more preferably 2 to 7. In a case where a substituent on the phenyl group is a saturated aliphatic acyl group, specific examples of the saturated aliphatic acyl group include an acetyl group, a propanoyl group, an n-butanoyl group, a 2-methylpropanoyl group, an n-pentanoyl group, a 2,2-dimethylpropanoyl group, an n-hexanoyl group, an n-heptanoyl group, an n-octanoyl group, an n-nonanoyl group, an n-decanoyl group, an n-undecanoyl group, an n-dodecanoyl group, an n-tridecanoyl group, an n-tetradecanoyl group, an n-pentadecanoyl group, an n-hexadecanoyl group and the like. In a case where a substituent on the phenyl group is a saturated aliphatic acyloxy group, specific examples of the saturated aliphatic acyloxy group include an acetyloxy group, a propanoyloxy group, an n-butanoyloxy group, a 2-methylpropanoyloxy group, an n-pentanoyloxy group, a 2,2-dimethylpropanoyloxy group, an n-hexanoyloxy group, an n-heptanoyloxy group, an n-octanoyloxy group, an n-nonanoyloxy group, an n-decanoyloxy group, an n-undecanoyloxy group, an n-dodecanoyloxy group, an n-tridecanoyloxy group, an n-tetradecanoyloxy group, an n-pentadecanoyloxy group, an n-hexadecanoyloxy group and the like.

In a case where a substituent on the phenyl group is an alkoxycarbonyl group, the number of carbon atoms of the substituent is preferably 2 to 20, more preferably 2 to 7. In a case where a substituent on the phenyl group is an alkoxycarbonyl group, specific examples of the alkoxycarbonyl group include a methoxycarbonyl group, an ethoxycarbonyl group, an n-propyloxycarbonyl group, an isopropyloxycarbonyl group, an n-butyloxycarbonyl group, an isobutyloxycarbonyl group, a sec-butyloxycarbonyl group, a tert-butyloxycarbonyl group, an n-pentyloxycarbonyl group, an isopentyloxycarbonyl group, a sec-pentyloxycarbonyl group, a tert-pentyloxycarbonyl group, an n-hexyloxycarbonyl group, an n-heptyloxycarbonyl group, an n-octyloxycarbonyl group, an isooctyloxycarbonyl group, a sec-octyloxycarbonyl group, a tert-octyloxycarbonyl group, an n-nonyloxycarbonyl group, an isononyloxycarbonyl group, an n-decyloxycarbonyl group, an isodecyloxycarbonyl group and the like.

In a case where a substituent on the phenyl group is a phenylalkyl group, the number of carbon atoms of the substituent is preferably 7 to 20, more preferably 7 to 10. In a case where a substituent on the phenyl group is a naphthylalkyl group, the number of carbon atoms of the substituent is preferably 11 to 20, more preferably 11 to 14. In a case where a substituent on the phenyl group is a phenylalkyl group, specific examples of the phenylalkyl group include a benzyl group, a 2-phenylethyl group, a 3-phenylpropyl group and a 4-phenylbutyl group. In a case where a substituent on the phenyl group is a naphthylalkyl group, specific examples of the naphthylalkyl group include an α-naphthylmethyl group, a R-naphthylmethyl group, a 2-(α-naphthyl)ethyl group and a 2-(β-naphthyl)ethyl group. In a case where a substituent on the phenyl group is a phenylalkyl group or a naphthylalkyl group, the substituent may further have a substituent on the phenyl group or the naphthyl group.

In a case where a substituent on the phenyl group is a heterocyclyl group, the heterocyclyl group is a 5 or 6-membered monocyclic ring having one or more N, S and O, or a heterocyclyl group in which the above monocyclic rings are condensed together, or the above monocyclic ring and a benzene ring are condensed. In a case where the heterocyclyl group is a condensed ring, the number of rings shall be up to 3. Heterocyclic rings contained in the above heterocyclyl group include furan, thiophene, pyrrole, oxazole, isoxazole, thiazole, thiadiazole, isothiazole, imidazole, pyrazole, triazole, pyridine, pyrazine, pyrimidine, pyridazine, benzofuran, benzothiophene, indole, isoindole, indolizine, benzimidazole, benzotriazole, benzoxazole, benzothiazole, carbazole, purine, quinoline, isoquinoline, quinazoline, phthalazine, cinnoline, quinoxaline and the like. In a case where a substituent on the phenyl group is a heterocyclyl group, the heterocyclyl group may further have a substituent.

In a case where a substituent on the phenyl group is an amino group substituted with one or two organic groups, suitable examples of the organic group include an alkyl group having 1 to 20 carbon atoms, a cycloalkyl group having 3 to 10 carbon atoms, a saturated aliphatic acyl group having 2 to 20 carbon atoms, a saturated aliphatic acyloxy group having 2 to 20 carbon atoms, an optionally substituted phenyl group, an optionally substituted benzoyl group, an optionally substituted phenylalkyl group having 7 to 20 carbon atoms, an optionally substituted naphthyl group, an optionally substituted naphthoyl group, an optionally substituted naphthylalkyl group having 11 to 20 carbon atoms, a heterocyclyl group and the like. Specific examples of these suitable organic groups similarly include those described for the substituents on the phenyl group. Specific examples of the amino group substituted with one or two organic groups include a methylamino group, an ethylamino group, a diethylamino group, an n-propylamino group, a di-n-propylamino group, an isopropylamino group, an n-butylamino group, a di-n-butylamino group, an n-pentylamino group, an n-hexylamino group, an n-heptylamino group, an n-octylamino group, an n-nonylamino group, an n-decylamino group, a phenylamino group, a naphthylamino group, an acetylamino group, a propanoylamino group, an n-butanoylamino group, n-pentanoylamino group, an n-hexanoylamino group, an n-heptanoylamino group, an n-octanoylamino group, an n-decanoylamino group, a benzoylamino group, an α-naphthoylamino group, a R-naphthoylamino group, N-acetyl-N-acetyloxyamino group, and the like.

In a case where the phenyl group, the naphthyl group and the heterocyclyl group included in the substituent on the phenyl group further have a substituent, examples of the substituent include an alkyl group having 1 to 6 carbon atoms, an alkoxy group having 1 to 6 carbon atoms, a saturated aliphatic acyl group having 2 to 7 carbon atoms, an alkoxycarbonyl group having 2 to 7 carbon atoms, a saturated aliphatic acyloxy group having 2 to 7 carbon atoms, a monoalkylamino group having an alkyl group with 1 to 6 carbon atoms, a dialkylamino group having alkyl groups with 1 to 6 carbon atoms, a morpholin-1-yl group, a piperazin-1-yl group, halogen, a nitro group, a cyano group and the like. In a case where the phenyl group, the naphthyl group and the heterocyclyl group included in the substituent on the phenyl group further have a substituent, the number of the substituents is preferably, but not limited to, 1 to 4 as long as it does not interfere with the object of the present invention. In a case where the phenyl group, the naphthyl group and the heterocyclyl group included in the substituent on the phenyl group have two or more substituents, the two or more substituents may be the same, or may different.

As described above, whereas explanation was given with respect to the substituents in a case where $R^{D13}$ is an optionally substituted phenyl group, among these substituents, alkyl groups or alkoxyalkyl groups are preferred.

In a case where $R^{D13}$ is an optionally substituted phenyl group, there is no particular limitation for the number of substituents and a position at which a substituent is attached as long as they do not interfere with the object of the present invention. In a case where $R^{D13}$ is an optionally substituted phenyl group, the optionally substituted phenyl group is preferably an optionally substituted o-tolyl group in view of excellent efficiency of base generation.

In a case where $R^{D13}$ is an optionally substituted carbazolyl group, there is no particular limitation on the type of the substituent, as long as it does not interfere with the object of the present invention. Examples of suitable substituents which the carbazolyl group may have on the carbon atom include an alkyl group having 1 to 20 carbon atoms, an alkoxy group having 1 to 20 carbon atoms, a cycloalkyl group having 3 to 10 carbon atoms, a cycloalkoxy group having 3 to 10 carbon atoms, a saturated aliphatic acyl group having 2 to 20 carbon atoms, an alkoxycarbonyl group having 2 to 20 carbon atoms, a saturated aliphatic acyloxy group having 2 to 20 carbon atoms, an optionally substituted phenyl group, an optionally substituted phenoxy group, an optionally substituted phenylthio group, an optionally substituted phenylcarbonyl group, an optionally substituted benzoyl group, an optionally substituted phenoxycarbonyl group, an optionally substituted benzoyloxy group, an optionally substituted phenylalkyl group having 7 to 20 carbon atoms, an optionally substituted naphthyl group, an optionally substituted naphthoxy group, an optionally substituted naphthylcarbonyl group, an optionally substituted naphthoyl group, an optionally substituted naphthoxycarbonyl group, an optionally substituted naphthoyloxy group, an optionally substituted naphthylalkyl group having 11 to 20 carbon atoms, an optionally substituted heterocyclyl group, an optionally substituted heterocyclylcarbonyl group, an amino group, an amino group substituted with one or two organic groups, a morpholin-1-yl group, a piperazin-1-yl group, halogen, a nitro group, a cyano group and the like.

In a case where $R^{D13}$ is an optionally substituted carbazolyl group, examples of suitable substituent which the carbazolyl group may have on the nitrogen atom include an alkyl group having 1 to 20 carbon atoms, a cycloalkyl group having 3 to 10 carbon atoms, a saturated aliphatic acyl group having 2 to 20 carbon atoms, an alkoxycarbonyl group having 2 to 20 carbon atoms, an optionally substituted phenyl group, an optionally substituted benzoyl group, an optionally substituted phenoxycarbonyl group, an optionally substituted phenylalkyl group having 7 to 20 carbon atoms, an optionally substituted naphthyl group, an optionally substituted naphthoyl group, an optionally substituted naphthoxycarbonyl group, an optionally substituted naphthylalkyl group having 11 to 20 carbon atoms, an optionally substituted heterocyclyl group, an optionally substituted heterocyclylcarbonyl group and the like. Among these substituents, an alkyl group having 1 to 20 carbon atoms is preferred, and an alkyl group having 1 to 6 carbon atoms is more preferred, and in particular an ethyl group is particularly preferred.

For an alkyl group, an alkoxy group, a cycloalkyl group, a cycloalkoxy group, a saturated aliphatic acyl group, an alkoxycarbonyl group, a saturated aliphatic acyloxy group, an optionally substituted phenylalkyl group, an optionally substituted naphthylalkyl group, an optionally substituted heterocyclyl group, and an amino group substituted with one or two organic groups, specific examples of the substituents on the carbazolyl group are similar to the examples of the substituents on the phenyl group in a case where $R^{D13}$ is an optionally substituted phenyl group.

In a case where the phenyl group, the naphthyl group and the heterocyclyl group included in the substituent on the carbazolyl group in $R^{D13}$ further have a substituent, examples of the substituent include an alkyl group having 1 to 6 carbon atoms, an alkoxy group having 1 to 6 carbon atoms, a saturated aliphatic acyl group having 2 to 7 carbon atoms, an alkoxycarbonyl group having 2 to 7 carbon atoms, a saturated aliphatic acyloxy group having 2 to 7 carbon atoms, a phenyl group, a naphthyl group, a benzoyl group, a naphthoyl group, a benzoyl group substituted with a group selected from the group consisting of an alkyl group having 1 to 6 carbon atoms, a morpholin-1-yl group, a piperazin-1-yl group and a phenyl group, a monoalkylamino group having an alkyl group with 1 to 6 carbon atoms, a dialkylamino group having alkyl groups with 1 to 6 carbon atoms, a morpholin-1-yl group, a piperazin-1-yl group, halogen, a nitro group, a cyano group and the like. In a case where the phenyl group, the naphthyl group and the heterocyclyl group included in the substituent on the carbazolyl group further have a substituent, the number of the substituents is preferably, but not limited to, 1 to 4 as long as it does not interfere with the object of the present invention. In a case where the phenyl group, the naphthyl group and the heterocyclyl group have a plurality of substituents, the plurality of substituents may be the same as or different from each other.

$R^{D14}$ is an optionally substituted alkyl group having 1 to 10 carbon atoms, an optionally substituted phenyl group, or an optionally substituted carbazolyl group.

In a case where $R^{D14}$ is an optionally substituted alkyl group having 1 to 10 carbon atoms, the alkyl group may be a straight chain or a branched chain. In this case, the number of carbon atoms of the alkyl group is preferably 1 to 8, and more preferably 1 to 5.

In $R^{D14}$, the substituents on the alkyl group, the phenyl group, or carbazolyl group is not particularly limited as long as they do not interfere with the object of the present invention. Examples of suitable substituents which the alkyl group may have on the carbon atom include an alkoxy group having 1 to 20 carbon atoms, a cycloalkyl group having 3 to 10 carbon atoms, a cycloalkoxy group having 3 to 10 carbon atoms, a saturated aliphatic acyl group having 2 to 20 carbon atoms, an alkoxycarbonyl group having 2 to 20 carbon atoms, a saturated aliphatic acyloxy group having 2 to 20 carbon atoms, an optionally substituted phenyl group, an optionally substituted phenoxy group, an optionally substituted phenylthio group, an optionally substituted benzoyl group, an optionally substituted phenoxycarbonyl group, an optionally substituted benzoyloxy group, an optionally substituted phenylalkyl group having 7 to 20 carbon atoms, an optionally substituted naphthyl group, an optionally substituted naphthoxy group, an optionally substituted naphthoyl group, an optionally substituted naphthoxycarbonyl group, an optionally substituted naphthoyloxy group, an optionally substituted naphthylalkyl group having 11 to 20 carbon atoms, an optionally substituted heterocyclyl group, an optionally substituted heterocyclycarbonyl group, an amino group, an amino group substituted with one or two organic groups, a morpholin-1-yl group, and a piperazin-1-yl group, halogen, a nitro group, and a cyano group and the like. Examples of suitable substituents which a phenyl group and a carbazolyl group may have on its carbon atom include an alkyl group having 1 to 20 carbon atoms, in addition to the groups exemplified in the above as the suitable substituents which an alkyl group may have on its carbon atom.

For an alkyl group, an alkoxy group, a cycloalkyl group, a cycloalkoxy group, a saturated aliphatic acyl group, an alkoxycarbonyl group, a saturated aliphatic acyloxy group, an optionally substituted phenylalkyl group, an optionally substituted naphthylalkyl group, an optionally substituted heterocyclyl group, and an amino group substituted with one or two organic groups, specific examples of the substituents on the alkyl group, on the phenyl group or on the carbazolyl group are similar to the examples of the substituents on the phenyl group in a case where $R^{D13}$ is an optionally substituted phenyl group.

In a case where the phenyl group, the naphthyl group and the heterocyclyl group included in the substituent on the alkyl group, the phenyl group or the carbazolyl group in $R^{D14}$ further have a substituent, examples of the substituent include an alkyl group having 1 to 6 carbon atoms, an alkoxy group having 1 to 6 carbon atoms, a saturated aliphatic acyl group having 2 to 7 carbon atoms, an alkoxycarbonyl group having 2 to 7 carbon atoms, a saturated aliphatic acyloxy group having 2 to 7 carbon atoms, a phenyl group, a naphthyl group, a benzoyl group, a naphthoyl group, a benzoyl group substituted with a group selected from the group consisting of an alkyl group having 1 to 6 carbon atoms, a morpholin-1-yl group, a piperazin-1-yl group and a phenyl group, a monoalkylamino group having an alkyl group with 1 to 6 carbon atoms, a dialkylamino group having alkyl groups with 1 to 6 carbon atoms, a morpholin-1-yl group, a piperazin-1-yl group, halogen, a nitro group, a cyano group. In a case where the phenyl group, the naphthyl group and the heterocyclyl group included in the substituent on the alkyl group or the phenyl group further have a substituent, the number of the substituents is preferably, but not limited to, 1 to 4 as long as it does not interfere with the object of the present invention. In a case where the phenyl group, the naphthyl group and the heterocyclyl group have a plurality of substituents, the plurality of substituents may be the same, or may different.

From a viewpoint of efficiency of base generation of the compounds represented by formula (d11), as $R^{D14}$, the groups represented by the following formula (d12):

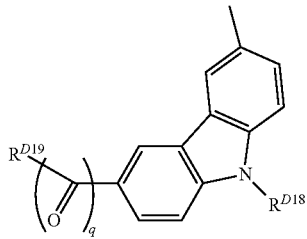

(d12)

are preferred. And, as $R^{D14}$, the groups represented by the following formula (d13):

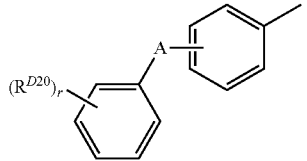

(d13)

are preferred.

In formula (d12), $R^{D18}$ and $R^{D19}$ each are a monovalent organic group, and q is 0 or 1. In formula (d13), $R^{D20}$ is a group selected from the group consisting of a monovalent organic group, an amino group, halogen, a nitro group and a cyano group; A is S or O; and r is an integer between 0 and 4.

$R^{18}$ in the formula (d12) can be selected from various kinds of organic groups as far as objects of the present invention are not inhibited. Suitable examples of $R^{D18}$ include an alkyl group having 1 to 20 carbon atoms, a cycloalkyl group having 3 to 10 carbon atoms, a saturated aliphatic acyl group having 2 to 20 carbon atoms, an alkoxycarbonyl group having 2 to 20 carbon atoms, an optionally substituted phenyl group, an optionally substituted benzoyl group, an optionally substituted phenoxycarbonyl group, an optionally substituted phenylalkyl group having 7 to 20 carbon atoms, an optionally substituted naphthyl group, an optionally substituted naphthoyl group, an optionally substituted naphthoxycarbonyl group, an optionally substituted naphthylalkyl group having 11 to 20 carbon atoms, an optionally substituted heterocyclyl group, an optionally substituted heterocyclylcarbonyl group and the like.

In $R^{D18}$, an alkyl group having 1 to 20 carbon atoms is preferred, an alkyl group having 1 to 6 carbon atoms is more preferred, and an ethyl group is particularly preferred.

There is no particular limitation for $R^{D19}$ in the formula (d12) as long as they do not interfere with the object of the present invention, and it can be selected from various organic groups. Specific examples of the suitable group for $R^{D19}$ include an alkyl group having 1 to 20 carbon atoms, an optionally substituted phenyl group, an optionally substituted naphthyl group and an optionally substituted heterocyclyl group. Among these groups, as $R^{D19}$, an optionally substituted phenyl group and an optionally substituted naphthyl group are more preferred, and a 2-methylphenyl group and a naphthyl group are particularly preferred.

In a case where the phenyl group, the naphthyl group and the heterocyclyl group included in $R^{D18}$ or $R^{D9}$ further have a substituent, examples of the substituents include an alkyl group having 1 to 6 carbon atoms, an alkoxy group having 1 to 6 carbon atoms, a saturated aliphatic acyl group having 2 to 7 carbon atoms, an alkoxycarbonyl group having 2 to 7 carbon atoms, a saturated aliphatic acyloxy group having 2 to 7 carbon atoms, a monoalkylamino group having an alkyl group with 1 to 6 carbon atoms, a dialkylamino group having alkyl groups with 1 to 6 carbon atoms, a morpholin-1-yl group, a piperazin-1-yl group, halogen, a nitro group, a cyano group and the like. In a case where the phenyl group, the naphthyl group and the heterocyclyl group included in $R^{D18}$ or $R^{D19}$ further have a substituent, there is no particular limitation for the number of the substituents as long as it does not interfere with the object of the present invention, but it is preferably 1 to 4. In a case where the phenyl group, the naphthyl group and the heterocyclyl group included in $R^{D18}$ or $R^{D19}$ have two or more substituents, the two or more substituents may be the same, or may be different.

In a case where $R^{D20}$ in the formula (d13) is an organic group, it can be selected from various organic groups, as long as it does not interfere with the object of the present invention. In a case where $R^{D20}$ is an organic group in the formula (d13), suitable examples include an alkyl group having 1 to 6 carbon atoms, an alkoxy group having 1 to 6 carbon atoms, a saturated aliphatic acyl group having 2 to 7 carbon atoms, an alkoxycarbonyl group having 2 to 7 carbon atoms, a saturated aliphatic acyloxy group having 2 to 7 carbon atoms, a phenyl group, a naphthyl group, a benzoyl group, a naphthoyl group, a benzoyl group substituted with a group selected from the group consisting of an alkyl group having 1 to 6 carbon atoms, a morpholin-1-yl group, a piperazin-1-yl group and a phenyl group, a monoalkylamino group having an alkyl group with 1 to 6 carbon atoms, a dialkylamino group having alkyl groups with 1 to 6 carbon atoms, a morpholin-1-yl group, a piperazin-1-yl group, halogen, a nitro group, a cyano group; 2-methylphenylcarbonyl group, 4-(piperazin-1-yl)phenylcarbonyl group, and 4-(phenyl)phenyl carbonyl group.

Among $R^{D20}$, a benzoyl group, a naphthoyl group, a benzoyl group substituted with a group selected from the group consisting of an alkyl group having 1 to 6 carbon atoms, a morpholin-1-yl group, a piperazin-1-yl group and a phenyl, a nitro group are preferred, and a benzoyl group, a naphthoyl group, 2-methylphenylcarbonyl group, 4-(piperazin-1-yl)phenylcarbonyl group, and 4-(phenyl)phenyl carbonyl group are more preferred.

Further in the formula (d13), r is preferably an integer from 0 to 3, more preferably 0 to 2, and particularly preferably 0 or 1. When r is 1, the position at which $R^{D20}$ bonds is preferably the para-position to the bonding through which the phenyl group (to which $R^{D2}$ bonds) bonds to a sulfur atom.

$R^{D15}$ represents a hydrogen atom, an alkyl group having 1 to 6 carbon atoms or an optionally substituted phenyl group. In a case where $R^{D15}$ is an optionally substituted phenyl group, optional substituents on the phenyl group are similar to those in a case where $R^{D13}$ is an optionally substituted phenyl group. As $R^{D15}$, a methyl group, an ethyl group or a phenyl group is preferred, and a methyl group or a phenyl group is more preferred.

The oxime ester compound represented by the above formula (d11) wherein p is 0 can be synthesized, for example, by the method described below. First, a ketone compound represented by $R^{D14}$—CO—$R^{D13}$ is subjected to oximation with hydroxylamine to obtain an oxime compound represented by $R^{14}$—(C=N—OH)—$R^{13}$. Subsequently, the resulting oxime compound is acylated with an acid halide represented by $R^{D15}$—CO-Hal (Hal represents halogen) or an acid anhydride represented by $(R^{D15}CO)_2O$ to obtain an oxime ester compound represented by the above formula (d11) wherein p is 0.

The oxime ester compound represented by the above formula (d11), in a case where p is 1, can be synthesized, for example, by the method described below. First, a ketone compound represented by $R^{D14}$—CO—$CH_2$—$R^{D13}$ is allowed to react with a nitrous ester in the presence of hydrochloric acid to obtain an oxime compound represented by $R^{D4}$—CO—(C=N—OH)—$R^{13}$. Subsequently, the resulting oxime compound is acylated with an acid halide represented by $R^{D15}$—CO-Hal (Hal represents halogen) or an acid anhydride represented by $(R^{D15}CO)_2O$ to obtain an oxime ester compound represented by the above formula (d11) wherein p is 1.

Examples of the compounds represented by the above formula (d11) include the compounds represented by the following formula (d14).

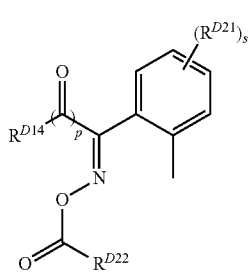

(d14)

In the above formula (d14), p and $R^{D14}$ are as defined above. $R^{D21}$ is a group selected from the group consisting of a monovalent organic group, an amino group, halogen, a nitro group and a cyano group; s is an integer between 0 and 4; $R^{D22}$ represents a hydrogen atom or an alkyl group having 1 to 6 carbon atoms.

There is no particular limitation for $R^{D21}$ in the above formula (d14), as long as it does not interfere with the object of the present invention, and when it is an organic group, it can be selected from various organic groups. Preferred examples of $R^{D21}$ include an alkyl group, an alkoxy group, a cycloalkyl group, a cycloalkoxy group, a saturated aliphatic acyl group, an alkoxycarbonyl group a saturated aliphatic acyloxy group, an optionally substituted phenyl group, an optionally substituted phenoxy group, an optionally substituted benzoyl group, an optionally substituted phenoxycarbonyl group, an optionally substituted benzoyloxy group, an optionally substituted phenylalkyl group, an optionally substituted naphthyl group, an optionally substituted naphthoxy group, an optionally substituted naphthoyl group, an optionally substituted naphthoxycarbonyl group, an optionally substituted naphthoyloxy group, an optionally substituted naphthylalkyl group, an optionally substituted heterocyclyl group, an amino group, an amino group substituted with one or two organic groups, a morpholin-1-yl group, a piperazin-1-yl group, halogen, a nitro group, a cyano group and the like. In a case where s is an integer from 2 to 4, $R^{D21}$ may the same or may be different. Further, the number of carbon atoms of a substituent does not include the number of carbon atoms of another substituent which the substituent further has.

In a case where $R^{D21}$ is an alkyl group, the number of carbon atoms is preferably 1 to 20, and more preferably 1 to 6. Further, in a case where $R^{D21}$ is an alkyl group, it may be a straight chain or a branched chain. In a case where $R^{D21}$ is an alkyl group, specific examples include a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an n-heptyl group, an n-octyl group, an isooctyl group, a sec-octyl group, a tert-octyl group, an n-nonyl group, an isononyl group, an n-decyl group, an isodecyl group and the like. Further, in a case where $R^{D21}$ is an alkyl group, the alkyl group may include an ether bond (—O—) in the carbon chain. Examples of the alkoxy group having an ether bond in the carbon chain include a methoxyethyl group, an ethoxyethyl group, a methoxyethoxethyl group, an ethoxyethoxyethyl group, a propyloxyethoxyethyl group, a methoxypropyl group and the like.

In a case where $R^{D21}$ is an alkoxy group, the number of carbon atoms is preferably 1 to 20, and more preferably 1 to 6. Further, in a case where $R^{D21}$ is an alkoxyl group, it may be a straight chain or a branched chain. In a case where $R^{D21}$ is an alkoxy group, specific examples include a methoxy group, an ethoxy group, an n-propyloxy group, an isopropyloxy group, an n-butyloxy group, an isobutyloxy group, a sec-butyloxy group, a tert-butyloxy group, an n-pentyloxy group, an isopentyloxy group, a sec-pentyloxy group, a tert-pentyloxy group, an n-hexyloxy group, an n-heptyloxy group, an n-octyloxy group, an isooctyloxy group, a sec-octyloxy group, a tert-octyloxy group, an n-nonyloxy group, an isononyloxy group, an n-decyloxy group, an isodecyloxy group and the like. Further, in a case where $R^{D21}$ is an alkoxy group, the alkoxy group may include an ether bond (—O—) in the carbon chain. Examples of the alkoxy group having an ether bond in the carbon chain include a methoxyethoxy group, an ethoxyethoxy group, a methoxyethoxyethoxy group, an ethoxyethoxyethoxy group, a propyloxyethoxyethoxy group, a methoxypropyloxy group and the like.

In a case where $R^{D21}$ is a cycloalkyl group or a cycloalkoxy group, the number of carbon atoms is preferably 3 to 10, and more preferably 3 to 6. In a case where $R^{D21}$ is a cycloalkyl group, specific examples include a cyclopropyl group, a cyclobutyl group, a cyclopentyl group, a cyclohexyl group, a cycloheptyl group, a cyclooctyl group and the like. In a case where $R^{D21}$ is a cycloalkoxy group, specific examples include a cyclopropyloxy group, a cyclobutyloxy group, a cyclopentyloxy group, a cyclohexyloxy group, a cycloheptyloxy group, a cyclooctyloxy group and the like.

In a case where $R^{D21}$ is a saturated aliphatic acyl group or a saturated acyloxy group, the number of carbon atoms is preferably 2 to 20, more preferably 2 to 7. In a case where $R^{D21}$ is a saturated aliphatic acyl group, examples include an acetyl group, a propanoyl group, an n-butanoyl group, a 2-methyl propanoyl group, an n-pentanoyl group, a 2,2-dimethyl propanoyl group, an n-hexanoyl group, an n-heptanoyl group, an n-octanoyl group, an n-nonanoyl group, an n-decanoyl group, an n-undecanoyl group, an n-dodecanoyl group, an n-tridecanoyl group, an n-tetradecanoyl group, an n-pentadecanoyl group, an n-hexadecanoyl group and the like. In a case where $R^{D21}$ is a saturated aliphatic acyloxy group, specific examples include an acetyloxy group, a propanoyloxy group, an n-butanoyloxy group, a 2-methyl propanoyloxy group, an n-pentanoyloxy group, a 2,2-dimethyl propanoyloxy group, an n-hexanoyloxy group, an n-heptanoyloxy group, an n-octanoyloxy group, an n-nonanoyloxy group, an n-decanoyloxy group, an n-undecanoyloxy group, an n-dodecanoyloxy group, an n-tridecanoyloxy group, an n-tetradecanoyloxy group, an n-pentadecanoyloxy group, an n-hexadecanoyloxy group and the like.

In a case where $R^{D21}$ is an alkoxycarbonyl group, the number of carbon atoms is preferably 2 to 20, more preferably 2 to 7. In a case where $R^{D21}$ is an alkoxycarbonyl group, specific examples include a methoxycarbonyl group, an ethoxycarbonyl group, an n-propyloxycarbonyl group, an isopropyloxycarbonyl group, an n-butyloxycarbonyl group, an isobutyloxycarbonyl group, a sec-butyloxycarbonyl group, a tert-butyloxycarbonyl group, an n-pentyloxycarbonyl group, an isopentyloxycarbonyl group, a sec-pentyloxycarbonyl group, a tert-pentyloxycarbonyl group, an n-hexyloxycarbonyl group, an n-heptyloxycarbonyl group, an n octyloxycarbonyl group, an isooctyloxycarbonyl group, a sec-octyloxycarbonyl group, a tert-octyloxycarbonyl group, an n-nonyloxycarbonyl group, an isononyloxycarbonyl group, an n-decyloxycarbonyl group, an isodecyloxycarbonyl group and the like.

In a case where $R^{D21}$ is a phenyl alkyl group, the number of carbon atoms is preferably 7 to 20, more preferably 7 to 10. Further, in a case where $R^{D21}$ is a naphthlalkyl group, the number of carbon atoms is preferably 11 to 20, more preferably 11 to 14. In a case where $R^{D21}$ is a phenylalkyl group, specific examples include a benzyl group, 2-phenylethyl group, 3-phenylpropyl group, and 4-phenylbutyl group. In a case where $R^{D21}$ is a naphthylalkyl group, specific examples include an α-naphthylmethyl group, a β-naphthylmethyl group, a 2-(α-naphthyl)ethyl group, and a 2-(β-naphthyl)ethyl group. In a case where $R^{D21}$ is a phenylalkyl group or a naphthylalkyl group, $R^{D21}$ may further have a substituent on the phenyl group or the naphthyl group.

In a case where $R^{D21}$ is a heterocyclyl group, the heterocyclyl group is a 5 or 6-membered monocyclic ring having one or more N, S or O, or a heterocyclyl group in which the above monocyclic rings are condensed together, or the above monocyclic ring and a benzene ring are condensed. In a case where the heterocyclyl group is a condensed ring, the number of rings shall be up to 3. Heterocyclic rings contained in the above heterocyclyl group include furan, thiophene, pyrrole, oxazole, isoxazole, thiazole, thiadiazole, isothiazole, imidazole, pyrazole, triazole, pyridine, pyrazine, pyrimidine, pyridazine, benzofuran, benzothiophene, indole, isoindole, indolizine, benzimidazole, benzotriazole, benzoxazole, benzothiazole, carbazole, purine, quinoline, isoquinoline, quinazoline, phthalazine, cinnoline, quinoxaline and the like. In a case where $R^{D21}$ is a heterocyclyl group, the heterocyclyl group may further have a substituent.

In a case where $R^{D21}$ is an amino group substituted with one or two organic groups, suitable examples of the organic group include an alkyl group having 1 to 20 carbon atoms, a cycloalkyl group having 3 to 10 carbon atoms, a saturated aliphatic acyl group having 2 to 20 carbon atoms, an optionally substituted phenyl group, an optionally substituted benzoyl group, an optionally substituted phenylalkyl group having 7 to 20 carbon atoms, an optionally substituted naphthyl group, an optionally substituted naphthoyl group, an optionally substituted naphthylalkyl group having 11 to 20 carbon atoms, a heterocyclyl group and the like. Specific examples of these preferred organic groups are similar to those of $R^{D21}$. Specific examples of the amino group substituted with one or two organic groups include a methylamino group, an ethylamino group, a diethylamino group, an n-propylamino group, a di-n-propylamino group, an isopropylamino group, an n-butylamino group, a di-n-butylamino group, an n-pentylamino group, an n-hexylamino group, an n-heptylamino group, an n-octylamino group, an n-nonylamino group, an n-decylamino group, a phenylamino group, a naphthylamino group, an acetylamino group, a propanoylamino group, an n-butanoylamino group, an n-pentanoylamino group, an n-hexanoylamino group, an n-heptanoylamino group, an n-octanoylamino group, an n-decanoylamino group, a benzoylamino group, an α-naphthoylamino group, a β-naphthoylamino group and the like.

In a case where the phenyl group, the naphthyl group and the heterocyclyl group included in $R^{D21}$ further have a substituent, examples of the substituents include an alkyl group having 1 to 6 carbon atoms, an alkoxy group having 1 to 6 carbon atoms, a saturated aliphatic acyl group having 2 to 7 carbon atoms, an alkoxycarbonyl group having 2 to 7 carbon atoms, a saturated aliphatic acyloxy group having 2 to 7 carbon atoms, a monoalkylamino group having an alkyl group with 1 to 6 carbon atoms, a dialkylamino group having alkyl groups with 1 to 6 carbon atoms, a morpholin-1-yl group, a piperazin-1-yl group, halogen, a nitro group, a cyano group and the like. In a case where the phenyl group, the naphthyl group and the heterocyclyl group included in $R^{D21}$ further have a substituent, there is no particular limitation for the number of the substituents as long as it does not interfere with the object of the present invention, but it is preferably 1 to 4. In a case where the phenyl group, the naphthyl group and the heterocyclyl group included in $R^{D21}$ have two or more substituents, the two or more substituents may be the same, or may be different.

Among $R^{D21}$, a group selected from the group consisting of an alkyl group having 1 to 6 carbon atoms, an alkoxy group having 1 to 6 carbon atoms, and a saturated aliphatic acyl group having 2 to 7 carbon atoms is preferred, an alkyl group having 1 to 6 carbon atoms is more preferred, and particularly preferred is a methyl group on account of chemical stability and ease of synthesis of an oxime ester compound because of small steric hindrance.

Regarding the position at which $R^{D21}$ bonds to a phenyl group, if assuming that the position at which the major skeleton of the oxime ester compound bonds to the phenyl group is position 1 and the position of the methyl group is position 2, the position at which $R^{D21}$ bonds to the phenyl group is preferably position 4 or position 5, more preferably position 5. Further, s is preferably an integer 0 to 3, more preferably 0 to 2, and particularly preferably 0 or 1.

$R^{D22}$ in the above formula (d14) represents a hydrogen atom or an alkyl group having 1 to 6 carbon atoms. As $R^{D22}$, a methyl group or an ethyl group is preferred and a methyl group is more preferred.

Specific examples of the particularly preferred compounds as the compound (D-2) are shown below.

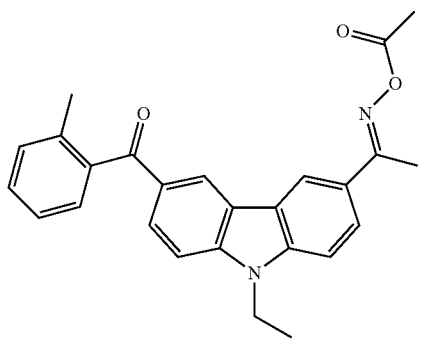

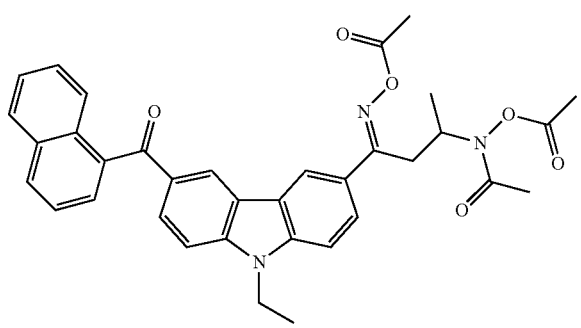

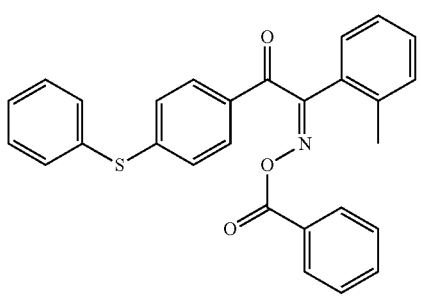

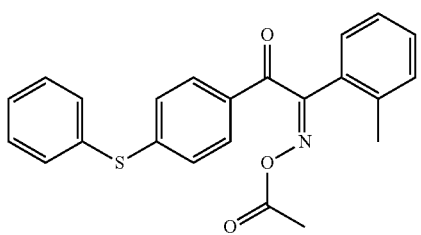

The compound represented by the following formula (d15) is also suitably used as the oxime ester compound (D-2).

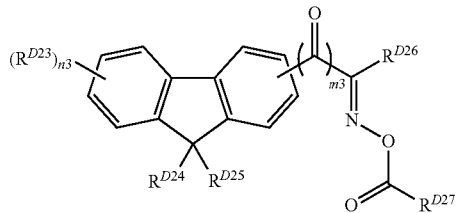

(d15)

($R^{D23}$ is a hydrogen atom, a nitro group, or a monovalent organic group, $R^{D24}$ and $R^{D25}$ are respectively an optionally substituted chained alkyl group, an optionally substituted cyclic organic group, or a hydrogen atom; $R^{D24}$ and $R^{D25}$ may be bonded to each other to form a ring, $R^{D26}$ is a monovalent organic group, $R^{D27}$ is a hydrogen atom, an optionally substituted alkyl group having 1 to 11 carbon atoms, or an optionally substituted aryl group, n3 is an integer from 0 to 4, and m3 is 0 or 1.)

In the formula (d15), $R^{D23}$ is a hydrogen atom, a nitro group or a monovalent organic group. $R^{D23}$ is bonded to a 6-membered aromatic ring that is different from the 6-membered aromatic ring to be bonded to the group represented by —(CO)$_{m}$3-, on the fluorene ring in the formula (d15). In the formula (d15), the bonding position of $R^{D23}$ with respect to the fluorene ring is not particularly limited. In a case where the compound represented by the formula (d15) has one or more $R^2$, it is preferable that one of the one or more $R^{D23}$ is bonded to the position 2 of the fluorene ring, from the viewpoint of ease in synthesis of the compound represented by the formula (d15). In a case where a plurality of $R^{D23}$ is present, the plurality of $R^{D23}$ may be the same as or different from each other.

In a case where $R^{D23}$ is an organic group, $R^{D23}$ is not particularly limited within a range that does not inhibit the object of the present invention and appropriately selected from various organic groups. In a case where $R^{D23}$ is an organic group, suitable examples of $R^{D23}$ include an alkyl group, an alkoxy group, a cycloalkyl group, a cycloalkoxy group, a saturated aliphatic acyl group, an alkoxycarbonyl group, a saturated aliphatic acyloxy group, an optionally substituted phenyl group, an optionally substituted phenoxy group, an optionally substituted benzoyl group, an optionally substituted phenoxycarbonyl group, an optionally substituted benzoyloxy group, an optionally substituted phenylalkyl group, an optionally substituted naphthyl group, an optionally substituted naphthoyl group, an optionally substituted naphthoxycarbonyl group, an optionally substituted naphthoyloxy group, an optionally substituted naphthylalkyl group, an optionally substituted heterocyclyl group, an optionally substituted heterocyclyl carbonyl group, an amino group substituted with one or two organic groups, a morpholin-1-yl group, and a piperazin-1-yl group, and the like.

In a case where $R^{D23}$ is an alkyl group, the number of carbon atoms of the alkyl group is preferably 1 to 20, and more preferably 1 to 6. Further, in a case where $R^{D23}$ is an alkyl group, it may be a straight chain or a branched chain. In a case where $R^{D23}$ is an alkyl group, specific examples of the $R^{D23}$ include a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an n-heptyl group, an n-octyl group, an isooctyl group, a sec-octyl group, a tert-octyl group, an n-nonyl group, an isononyl group, an n-decyl group, an isodecyl group and the like. Further, in a case where $R^{D23}$ is an alkyl group, the alkyl group may include an ether bond (—O—) in a carbon chain. Examples of the alkoxy group having an ether bond in the carbon chain include a methoxyethyl group, an ethoxyethyl group, a methoxyethoxyethyl group, an ethoxyethoxyethyl group, a propyloxyethoxyethyl group, a methoxypropyl group and the like.

In a case where $R^{D23}$ is an alkoxy group, the number of carbon atoms of the alkoxy group is preferably 1 to 20, and more preferably 1 to 6. Further, in a case where $R^{D23}$ is an alkoxyl group, it may be a straight chain or a branched chain. In a case where $R^{D23}$ is an alkoxy group, specific examples include a methoxy group, an ethoxy group, an n-propyloxy group, an isopropyloxy group, an n-butyloxy group, an isobutyloxy group, a sec-butyloxy group, a tert-butyloxy group, an n-pentyloxy group, an isopentyloxy group, a sec-pentyloxy group, a tert-pentyloxy group, an n-hexyloxy group, an n-heptyloxy group, an n-octyloxy group, an isooctyloxy group, a sec-octyloxy group, a tert-octyloxy group, an n-nonyloxy group, an isononyloxy group, an n-decyloxy group, an isodecyloxy group and the like. Further, in a case where $R^{D23}$ is an alkoxy group, the alkoxy group may include an ether bond (—O—) in the carbon chain. Examples of the alkoxy group having an ether bond in the carbon chain include a methoxyethoxy group, an ethoxyethoxy group, a methoxyethoxyethoxy group, an ethoxyethoxyethoxy group, a propyloxyethoxyethoxy group, a methoxypropyloxy group and the like.

In a case where $R^{D23}$ is a cycloalkyl group or a cycloalkoxy group, the number of carbon atoms of a cycloalkyl group or a cycloalkoxy group is preferably 3 to 10, and more preferably 3 to 6. In a case where $R^{D23}$ is a cycloalkyl group, specific examples include a cyclopropyl group, a cyclobutyl group, a cyclopentyl group, a cyclohexyl group, a cycloheptyl group, a cyclooctyl group and the like. In a case where $R^{23}$ is a cycloalkoxy group, specific examples include a cyclopropyloxy group, a cyclobutyloxy group, a cyclopentyloxy group, a cyclohexyloxy group, a cycloheptyloxy group, a cyclooctyloxy group and the like.

In a case where $R^{D23}$ is a saturated aliphatic acyl group or a saturated acyloxy group, the number of carbon atoms of a saturated aliphatic acyl group or a saturated acyloxy group is preferably 2 to 21, more preferably 2 to 7. In a case where $R^{D23}$ is a saturated aliphatic acyl group, specific examples include an acetyl group, a propanoyl group, an n-butanoyl group, a 2-methyl propanoyl group, an n-pentanoyl group, a 2,2-dimethyl propanoyl group, an n-hexanoyl group, an n-heptanoyl group, an n-octanoyl group, an n-nonanoyl group, an n-decanoyl group, an n-undecanoyl group, an n-dodecanoyl group, an n-tridecanoyl group, an n-tetradecanoyl group, an n-pentadecanoyl group, an n-hexadecanoyl group and the like. In a case where $R^{D23}$ is a saturated aliphatic acyloxy group, specific examples include an acetyloxy group, a propanoyloxy group, an n-butanoyloxy group, a 2-methyl propanoyloxy group, an n-pentanoyloxy group, a 2,2-dimethyl propanoyloxy group, an n-hexanoyloxy group, an n-heptanoyloxy group, an n-octanoyloxy group, an n-nonanoyloxy group, an n-decanoyloxy group, an n-undecanoyloxy group, an n-dodecanoyloxy group, an n-tridecanoyloxy group, an n-tetradecanoyloxy group, an n-pentadecanoyloxy group, an n-hexadecanoyloxy group and the like.

In a case where $R^{D23}$ is an alkoxycarbonyl group, the number of carbon atoms of the alkoxycarbonyl group is preferably 2 to 20, more preferably 2 to 7. In a case where $R^{D23}$ is an alkoxycarbonyl group, specific examples include a methoxycarbonyl group, an ethoxycarbonyl group, an n-propyloxycarbonyl group, an isopropyloxycarbonyl group, an n-butyloxycarbonyl group, an isobutyloxycarbonyl group, a sec-butyloxycarbonyl group, a tert-butyloxycarbonyl group, an n-pentyloxycarbonyl group, an isopentyloxycarbonyl group, a sec-pentyloxycarbonyl group, a tert-pentyloxycarbonyl group, an n-hexyloxycarbonyl group, an n-heptyloxycarbonyl group, an n octyloxycarbonyl group, an isooctyloxycarbonyl group, a sec-octyloxycarbonyl group, a tert-octyloxycarbonyl group, an n-nonyloxycarbonyl group, an isononyloxycarbonyl group, an n-decyloxycarbonyl group, an isodecyloxycarbonyl group and the like.

In a case where $R^{D23}$ is a phenylalkyl group, the number of carbon atoms of the phenylalkyl group is preferably 7 to 20, more preferably 7 to 10. Further, in a case where $R^{D23}$ is a naphthlalkyl group, the number of carbon atoms of the naphthlalkyl group is preferably 11 to 20, more preferably 11 to 14. In a case where $R^{D23}$ is a phenylalkyl group, specific examples include a benzyl group, 2-phenylethyl group, 3-phenylpropyl group, and 4-phenylbutyl group. In a case where $R^{D23}$ is a naphthylalkyl group, specific examples include an α-naphthylmethyl group, β-naphthylmethyl group, 2-(α-naphthyl)ethyl group, and a 2-(β-naphthyl)ethyl group. In a case where $R^{D23}$ is a phenylalkyl group or a naphthylalkyl group, $R^{D23}$ may further have a substituent on the phenyl group or the naphthyl group.

In a case where $R^{D23}$ is a heterocyclyl group, the heterocyclyl group is a 5 or 6-membered monocyclic ring having one or more N, S or O, or a heterocyclyl group in which the above monocyclic rings are condensed together, or the above monocyclic ring and a benzene ring are condensed. In a case where the heterocyclyl group is a condensed ring, the number of rings shall be up to 3. Heterocyclyl group may be an aromatic group (a heteroaryl group), or may be non-aromatic group. Heterocyclic rings contained in the above heterocyclyl group include furan, thiophene, pyrrole, oxazole, isoxazole, thiazole, thiadiazole, isothiazole, imidazole, pyrazole, triazole, pyridine, pyrazine, pyrimidine, pyridazine, benzofuran, benzothiophene, indole, isoindole, indolizine, benzimidazole, benzotriazole, benzoxazole, benzothiazole, carbazole, purine, quinoline, isoquinoline, quinazoline, phthalazine, cinnoline, quinoxaline, piperidine, piperidine, morpholine, piperidine, tetrahydropyran, tetrahydrofuran, and the like. In a case where $R^{D23}$ is a heterocyclyl group, the heterocyclyl group may further have a substituent.

In a case where $R^{D23}$ is a heterocyclyl carbonyl group, the heterocyclyl group included in the heterocyclyl carbonyl group is similar to the case where $R^{D23}$ is a heterocyclyl group.

In a case where $R^{D23}$ is an amino group substituted with one or two organic groups, suitable examples of the organic group include an alkyl group having 1 to 20 carbon atoms, a cycloalkyl group having 3 to 10 carbon atoms, a saturated aliphatic acyl group having 2 to 21 carbon atoms, an optionally substituted phenyl group, an optionally substituted benzoyl group, an optionally substituted phenylalkyl group having 7 to 20 carbon atoms, an optionally substituted naphthyl group, an optionally substituted naphthoyl group, an optionally substituted naphthylalkyl group having 11 to 20 carbon atoms, a heterocyclyl group and the like. Specific examples of these preferred organic groups are similar to those of $R^{D23}$. Specific examples of the amino group substituted with one or two organic groups include a methylamino group, an ethylamino group, a diethylamino group, an n-propylamino group, a di-n-propylamino group, an isopropylamino group, an n-butylamino group, a di-n-butylamino group, an n-pentylamino group, an n-hexylamino group, an n-heptylamino group, an n-octylamino group, an n-nonylamino group, an n-decylamino group, a phenylamino group, a naphthylamino group, an acetylamino group, a propanoylamino group, an n-butanoylamino group, an n-pentanoylamino group, an n-hexanoylamino group, an n-heptanoylamino group, an n-octanoylamino group, an n-decanoylamino group, a benzoylamino group, an α-naphthoylamino group, a β-naphthoylamino group and the like.

In a case where the phenyl group, the naphthyl group and the heterocyclyl group included in $R^{D23}$ further have a substituent, examples of the substituents include an alkyl group having 1 to 6 carbon atoms, an alkoxy group having 1 to 6 carbon atoms, a saturated aliphatic acyl group having 2 to 7 carbon atoms, an alkoxycarbonyl group having 2 to 7 carbon atoms, a saturated aliphatic acyloxy group having 2 to 7 carbon atoms, a monoalkylamino group having an alkyl group with 1 to 6 carbon atoms, a dialkylamino group having alkyl groups with 1 to 6 carbon atoms, a morpholin-1-yl group, a piperazin-1-yl group, halogen, a nitro group, a cyano group and the like. In a case where the phenyl group, the naphthyl group and the heterocyclyl group included in $R^{D23}$ further have a substituent, there is no particular limitation for the number of the substituents as long as it does not interfere with the object of the present invention, but it is preferably 1 to 4. In a case where the phenyl group, the naphthyl group and the heterocyclyl group included in $R^{D23}$ have two or more substituents, the two or more substituents may be the same, or may be different.

Among the above-described groups, it is preferable that $R^{D23}$ is a nitro group or a group represented by $R^{D28}$—CO—, because sensitivity tends to be improved. $R^{D28}$ is not particularly limited within a range that does not inhibit the object of the present invention, and can be selected from various organic groups. Suitable examples of $R^{D28}$ include an alkyl group having 1 to 20 carbon atoms, an optionally substituted phenyl group, an optionally substituted naphthyl group, and an optionally substituted heterocyclyl group. As $R^{D28}$, among these groups, 2-methylphenyl group, a thiophene-2-yl group, and α-naphthyl group are particularly preferable. Furthermore, it is preferable that $R^{D23}$ is a hydrogen atom because good transparency tends to be achieved. Note here that when $R^{D23}$ is a hydrogen atom, and $R^{D26}$ is a group represented by the below-mentioned formula (R4-2), transparency tends to be more excellent.

In the formula (d15), $R^{D24}$ and $R^{D25}$ are an optionally substituted chained alkyl group, an optionally substituted cyclic organic group, or a hydrogen atom, respectively. $R^{D24}$ and $R^{D25}$ may be bonded to each other to form a ring. Among these groups, as $R^{D24}$ and $R^{D25}$, an optionally substituted chained alkyl group is preferable. In a case where $R^{D24}$ and $R^{D25}$ are an optionally substituted chained alkyl group, the chained alkyl group may be a straight-chain alkyl group or a branched-chain alkyl group.

In a case where $R^{D24}$ and $R^{D25}$ are a not-substituted chained alkyl group, the number of carbon atoms preferably 1 to 20, more preferably 1 to 10, and particularly preferably 1 to 6. Specific examples of the $R^{D24}$ and $R^{D25}$ as a chained alkyl group include a methyl group, an ethyl group, an n-propyl group, an isopropyl group, an n-butyl group, an isobutyl group, a sec-butyl group, a tert-butyl group, an n-pentyl group, an isopentyl group, a sec-pentyl group, a tert-pentyl group, an n-hexyl group, an n-heptyl group, an n-octyl group, an isooctyl group, a sec-octyl group, a tert-octyl group, an n-nonyl group, an isononyl group, an n-decyl group, an isodecyl group and the like. In a case where $R^{D24}$ and $R^{D25}$ are an alkyl group, the alkyl group may include an ether bond (—O—) in the carbon chain. Examples of the alkyl group having an ether bond in the carbon chain include a methoxyethyl group, an ethoxyethyl group, a methoxyethoxyethyl group, an ethoxyethoxyethyl group, a propyloxyethoxyethyl group, a methoxypropyl group and the like.

In a case where $R^{D24}$ and $R^{D25}$ are a chained alkyl group having substituent, the number of carbon atoms of the chained alkyl group is preferably 1 to 20, more preferably 1 to 10, and particularly preferably 1 to 6. In this case, the number of carbon atoms of the substituent is not included in the number of carbon atoms of the chained alkyl group. The substituted chained alkyl group is preferably a straight chain. The substituent which the alkyl group may have is not particularly limited within a range that does not inhibit the object of the present invention. Suitable examples of the substituent include a cyano group, a halogen atom, a cyclic organic group, and an alkoxycarbonyl group. Examples of the halogen atom include a fluorine atom, a chlorine atom, a bromine atom, and an iodine atom. Among them, a fluorine atom, a chlorine atom, and a bromine atom are preferably. Examples of the cyclic organic group include a cycloalkyl group, an aromatic hydrocarbon group, and a heterocyclyl group. Specific examples of the cycloalkyl group are similar to the suitable examples in a case where $R^{D23}$ is a cycloalkyl group. Specific examples of the aromatic hydrocarbon group include a phenyl group, a naphthyl group, a biphenyly group, an anthryl group, and a phenanthryl group. Specific examples of the heterocyclyl group are similar to the suitable examples in the case where $R^{D23}$ is a heterocyclyl group. In a case where $R^{D23}$ is an alkoxycarbonyl group, the alkoxy group included in the alkoxycarbonyl group may be a straight chain or a branched chain, and a straight chain is preferable. The number of carbon atoms of the alkoxy group included in the alkoxycarbonyl group is preferably 1 to 10, and more preferably 1 to 6.

In a case where the chained alkyl group includes a substituent, the number of the substituents is not particularly limited. The preferable number of the substituents varies depending upon the number of carbon atoms of the chained alkyl group. The number of the substituents is typically 1 to 20, preferably 1 to 10, and more preferably 1 to 6.

In a case where $R^{D24}$ and $R^{D25}$ are a cyclic organic group, the cyclic organic group may be an alicyclic group, or an aromatic group. Examples of the cyclic organic group include an aliphatic cyclic hydrocarbon group, an aromatic hydrocarbon group, and a heterocyclyl group. When $R^{D24}$ and $R^{D25}$ are a cyclic organic group, a substituent which the cyclic organic group may have is similar to the case where $R^{D24}$ and $R^{25}$ are a chained alkyl group.

In a case where $R^{D24}$ and $R^{D25}$ are an aromatic hydrocarbon group, it is preferable that the aromatic hydrocarbon group is a phenyl group or a group formed by bonding a plurality of benzene rings via a carbon-carbon bond, or a group formed by condensing a plurality of benzene rings. When the aromatic hydrocarbon group is a phenyl group or a group formed by condensing a plurality of benzene rings via bonding or condensation, the number of rings of the benzene rings included in the aromatic hydrocarbon group is not particularly limited, but it is preferably 3 or less, more preferably 2 or less, and particularly preferably 1. Preferable specific examples of the aromatic hydrocarbon group include a phenyl group, a naphthyl group, a biphenylyl group, an anthryl group, a phenanthryl group, and the like.

In a case where $R^{D24}$ and $R^{D25}$ are an aliphatic cyclic hydrocarbon group, the aliphatic cyclic hydrocarbon group may be monocyclic or may be polycyclic. The number of carbon atoms of the aliphatic cyclic hydrocarbon group is not particularly limited, but the number is preferably 3 to 20, and more preferably 3 to 10. Examples of a monocyclic cyclic hydrocarbon group include a cyclo propyl group, a cyclo butyl group, a cyclopentyl group, a cyclohexyl group, a cycloheptyl group, a cyclooctyl group, a norbornyl group, an isobornyl group, a tricyclononyl group, a tricyclodecyl group, a tetracyclododecyl group, an adamanthyl group, and the like.

In a case where $R^{D24}$ and $R^{D25}$ are a heterocyclyl group, the heterocyclyl group is a 5 or 6-membered monocyclic ring having one or more N, S and O, or a heterocyclyl group in which the above monocyclic rings are condensed together, or the above monocyclic ring and a benzene ring are condensed. In a case where the heterocyclyl group is a condensed ring, the number of rings shall be up to 3. The heterocyclyl group may be an aromatic group (heteroaryl group) or a non-aromatic group. Heterocyclic rings contained in the above heterocyclyl group include furan, thiophene, pyrrole, oxazole, isoxazole, thiazole, thiadiazole, isothiazole, imidazole, pyrazole, triazole, pyridine, pyrazine, pyrimidine, pyridazine, benzofuran, benzothiophene, indole, isoindole, indolizine, benzimidazole, benzotriazole, benzoxazole, benzothiazole, carbazole, purine, quinoline, isoquinoline, quinazoline, phthalazine, cinnoline, quinoxaline, piperidine, piperidine, morpholine, piperidine, tetrahydropyran, tetrahydrofuran, and the like.

$R^{D24}$ and $R^{D25}$ may be bonded to each other to form a ring. A group including a ring formed by $R^{D24}$ and $R^{D25}$ is preferably a cycloalkylidene group. When $R^{D24}$ and $R^{D25}$ are bonded to each other to form a cycloalkylidene group, a ring constituting the cycloalkylidene group is preferably 5-membered ring to 6-membered ring, and more preferably 5-membered ring.

In a case where a group formed by bonding of $R^{D24}$ and $R^{D25}$ is a cycloalkylidene group, the cycloalkylidene group may be condensed with one or more other rings. Examples of rings that may be condensed to the cycloalkylidene group include a benzene ring, a naphthalene ring, a cyclobutane ring, a cyclopentane ring, a cyclohexane ring, a cycloheptane ring, a cyclooctane ring, a furan ring, a thiophene ring, a pyrrole ring, a pyridine ring, a pyrazine ring, a pyrimidine ring, and the like.

Examples of suitable groups among the above-described $R^{D24}$ and $R^{D25}$ include groups represented by the formula $-A^{D1}-A^{D2}$. In the formula, $A^{D1}$ is a straight chain alkylene group, and $A^{D2}$ is an alkoxy group, a cyano group, a halogen atom, an alkyl halide group, a cyclic organic group, or an alkoxycarbonyl group.

The number of carbon atoms of $A^{D1}$ of the straight chain alkylene group is preferably 1 to 10, and more preferably 1 to 6. In a case where $A^{D2}$ is an alkoxy group, the alkoxy group may be a straight chain or branched chain, and a straight chain is preferable. The number of carbon atoms of the alkoxy group is preferably 1 to 10, and more preferably 1 to 6. In a case where $A^{D2}$ is a halogen atom, a fluorine atom, chlorine atom, a bromine atom, and an iodine atom are preferable, and a fluorine atom, a chlorine atom, and a bromine atom are more preferable. In a case where $A^{D2}$ is an alkyl halide group, a halogen atom included in the alkyl halide group is preferably a fluorine atom, chlorine atom, a bromine atom, and an iodine atom, and more preferably a fluorine atom, a chlorine atom, and a bromine atom. The alkyl halide group may be a straight chain or branched chain, and a straight chain is preferable. In a case where $A^{D2}$ is a cyclic organic group, examples of the cyclic organic group are similar to the cyclic organic group which $R^{D24}$ and $R^{D25}$ have as a substituent. In a case where $A^{D2}$ is an alkoxycarbonyl group, examples of the alkoxycarbonyl group are similar to the alkoxycarbonyl group which $R^{D24}$ and $R^{D25}$ have as a substituent.

Suitable specific examples of the $R^{D24}$ and $R^{D25}$ include alkyl groups such as an ethyl group, an n-propyl group, an n-butyl group, an n-hexyl group, an n-heptyl group, and an n-octyl group; alkoxy alkyl groups such as a 2-methoxy ethyl group, a 3-methoxy-n-propyl group, a 4-methoxy-n-butyl group, a 5-methoxy-n-pentyl group, a 6-methoxy-n-hexyl group, a 7-methoxy-n-heptyl group, a 8-methoxy-n-octyl group, a 2-ethoxy ethyl group, a 3-ethoxy-n-propyl group, a 4-ethoxy-n-butyl group, a 5-ethoxy-n-pentyl group, a 6-ethoxy-n-hexyl group, a 7-ethoxy-n-heptyl group, and a 8-ethoxy-n-octyl group; cyano alkyl groups such as a 2-cyanoethyl group, a 3-cyano-n-propyl group, a 4-cyano-n-butyl group, a 5-cyano-n-pentyl group, 6-cyano-n-hexyl group, a 7-cyano-n-heptyl group, and a 8-cyano-n-octyl group; phenylalkyl groups such as a 2-phenyl ethyl group, a 3-phenyl-n-propyl group, a 4-phenyl-n-butyl group, a 5-phenyl-n-pentyl group, 6-phenyl-n-hexyl group, a 7-phenyl-n-heptyl group, and a 8-phenyl-n-octyl group; cycloalkyl alkyl groups such as 2-cyclohexyl ethyl group, a 3-cyclohexyl-n-propyl group, a 4-cyclohexyl-n-butyl group, a 5-cyclohexyl-n-pentyl group, 6-cyclohexyl-n-hexyl group, a 7-cyclohexyl-n-heptyl group, a 8-cyclohexyl-n-octyl group, a 2-cyclopentyl ethyl group, a 3-cyclopentyl-n-propyl group, a 4-cyclopentyl-n-butyl group, a 5-cyclopentyl-n-pentyl group, a 6-cyclopentyl-n-hexyl group, a 7-cyclopentyl-n-heptyl group, and an 8-cyclopentyl-n-octyl group; alkoxy carbonyl alkyl group such as a 2-methoxy carbonyl ethyl group, a 3-methoxy carbonyl-n-propyl group, a 4-methoxy carbonyl-n-butyl group, a 5-methoxy carbonyl-n-pentyl group, a 6-methoxycarbonyl-n-hexyl group, a 7-methoxycarbonyl-n-heptyl group, a 8-methoxycarbonyl-n-octyl group, a 2-ethoxycarbonyl ethyl group, a 3-ethoxy carbonyl-n-propyl group, a 4-ethoxycarbonyl-n-butyl group, a 5-ethoxycarbonyl-n-pentyl group, 6-ethoxycarbonyl-n-hexyl group, a 7-ethoxycarbonyl-n-heptyl group, and a 8-ethoxycarbonyl-n-octyl; alkyl halide groups such as 2-chloroethyl group, a 3-chloro-n-propyl group, a 4-chloro-n-butyl group, a 5-chloro-n-pentyl group, a 6-chloro-n-hexyl group, a 7-chloro-n-heptyl group, a 8-chloro-n-octyl group, a 2-bromo ethyl group, a 3-bromo-n-propyl group, a 4-bromo-n-butyl group, a 5-bromo-n-pentyl group, 6-bromo-n-hexyl group, a 7-bromo-n-heptyl group, a 8-bromo-n-octyl group, a 3,3,3-trifluoro propyl group, and a 3,3,4,4,5,5,5-heptafluoro-n-pentyl group.

Among the above, suitable groups as $R^{D24}$ and $R^{D25}$ include an ethyl group, an n-propyl group, an n-butyl group, n-pentyl group, a 2-methoxy ethyl group, a 2-cyanoethyl group, a 2-phenyl ethyl group, a 2-cyclohexyl ethyl group, a 2-methoxy carbonyl ethyl group, a 2-chroloethyl group, a 2-bromo ethyl group, a 3,3,3-trifluoropropyl group, and a 3,3,4,4,5,5,5-heptafluoro-n-pentyl group.

Examples of the suitable organic group of $R^{D26}$ include, as $R^{D23}$, an alkyl group, an alkoxy group, a cycloalkyl group, a cycloalkoxy group, a saturated aliphatic acyl group, an alkoxycarbonyl group, a saturated aliphatic acyloxy group, an optionally substituted phenyl group, an optionally substituted phenoxy group, an optionally substituted benzoyl group, an optionally substituted phenoxycarbonyl group, an optionally substituted benzoyloxy group, an optionally substituted phenylalkyl group, an optionally substituted naphthyl group, an optionally substituted naphthoxy group, an optionally substituted naphthoyl group, an optionally substituted naphthoxycarbonyl group, an optionally substituted naphthoyloxy group, an optionally substituted naphthylalkyl group, an optionally substituted heterocyclyl group, an optionally substituted heterocyclyl carbonyl group, an amino group substituted with one or two organic groups, a morpholin-1-yl group, and a piperazin-1-yl group. Specific examples thereof are the same as those described for $R^{D23}$. Furthermore, as $R^{D26}$, a cycloalkyl alkyl group, a phenoxy alkyl group which may have a substituent on an aromatic ring, and a phenylthioalkyl group which may have a substituent on an aromatic ring are also preferable. The phenoxy alkyl group and substituents which the phenylthioalkyl group may have are the same as the substituents which the phenyl group included in $R^{D23}$ may have.

Among the organic groups, as $R^{D26}$, an alkyl group, a cycloalkyl group, an optionally substituted phenyl group, or a cycloalkyl alkyl group, a phenylthioalkyl group which may have a substituent on an aromatic ring, are preferable. As an alkyl group, an alkyl group having 1 to 20 carbon atoms is preferable, an alkyl group having 1 to 8 carbon atoms is more preferable, alkyl group having 1 to 4 carbon atoms are particularly preferable, and a methyl group is the most preferable. Among the optionally substituted phenyl groups, a methylphenyl group is preferable, and a 2-methylphenyl group is more preferable. The number of carbon atoms of the cycloalkyl group included in the cycloalkyl alkyl group is preferably 5 to 10, more preferably 5 to 8, and particularly preferably 5 or 6. The number of carbon atoms of the alkylene group included in the cycloalkyl alkyl group is preferably 1 to 8, more preferably 1 to 4, and particularly preferably 2. Among the cycloalkyl alkyl groups, a cyclopentyl ethyl group is preferable. The number of carbon atoms of the alkylene group included in the phenylthioalkyl group which may have a substituent on the aromatic ring is preferably 1 to 8, more preferably 1 to 4, and particularly preferably 2. Among the phenylthioalkyl group which may have a substituent on the aromatic ring, a 2-(4-chlorophenylthio)ethyl group is preferable.

Furthermore, as $R^{D26}$, a group represented by -$A^{D3}$-CO—O-$A^{D4}$, is also preferable. $A^{D3}$ represents a divalent organic group, preferably a divalent hydrocarbon group, and preferably an alkylene group. $A^{D4}$ represents a monovalent organic group, and preferably a monovalent hydrocarbon group.

In a case where $A^{D3}$ represents an alkylene group, the alkylene group may be a straight chain or branched chain, and preferably a straight chain. In a case where $A^{D3}$ represents an alkylene group, the number of carbon atoms of the alkylene group is preferably 1 to 10, more preferably 1 to 6, and particularly preferably 1 to 4.

Suitable examples of $A^{D4}$ include an alkyl group having 1 to 10 carbon atoms, an aralkyl group having 7 to 20 carbon atoms, and an aromatic hydrocarbon group having 6 to 20 carbon atoms. Suitable specific examples of these $A^{D4}$ include a methyl group, an ethyl group, an n-propyl group, an isopropyl group, an n-butyl group, an isobutyl group, a sec-butyl group, a tert-butyl group, an n-pentyl group, an n-hexyl group, a phenyl group, a naphthyl group, a benzyl group, a phenethyl group, an α-naphthyl methyl group, a β-naphthyl methyl group, and the like.

Suitable specific examples of the group represented by -$A^{D3}$-CO—O-$A^{D4}$ include a 2-methoxy carbonyl ethyl group, a 2-ethoxy carbonyl ethyl group, a 2-n-propyloxycarbonyl ethyl group, a 2-n-butyloxycarbonyl ethyl group, a 2-n-pentyloxycarbonyl ethyl group, 2-n-hexyloxycarbonyl ethyl group, a 2-benzyloxycarbonyl ethyl group, a 2-phenoxycarbonyl ethyl group, a 3-methoxy carbonyl-n-propyl group, a 3-ethoxy carbonyl-n-propyl group, a 3-n-propyloxycarbonyl-n-propyl group, a 3-n-butyloxycarbonyl-n-propyl group, a 3-n-pentyloxycarbonyl-n-propyl group, a 3-n-hexyloxycarbonyl-n-propyl group, a 3-benzyloxycarbonyl-n-propyl group, and a 3-phenoxycarbonyl-n-propyl group, and the like.

As mentioned above, $R^{26}$ is described, as $R^{D26}$, groups represented by the following formula (R4-1) or (R4-2) is preferable.

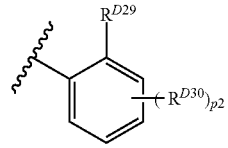

(R4-1)

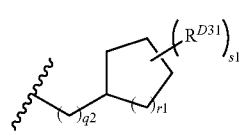

(R4-2)

(In the formulae (R4-1) and (R4-2), $R^{D29}$ and $R^{D30}$ each represents an organic group, p2 is an integer from 0 to 4, when $R^{D29}$ and $R^{D3}$ are present at adjacent positions on a benzene ring, $R^{D29}$ and $R^{D30}$ may be bonded to each other to from a ring, q2 is an integer from 1 to 8, r1 is an integer from 1 to 5, s1 is an integer from 0 to (r+3), and $R^9$ is an organic group.)

Examples of the organic group as to $R^{D29}$ and $R^{D30}$ in the formula (R4-1) are the same as those for $R^{23}$. As $R^{29}$, an alkyl group or a phenyl group is preferable. In a case where $R^{D29}$ is an alkyl group, the number of carbon atoms is preferably 1 to 10, more preferably 1 to 5, particularly preferably 1 to 3, and the most preferably 1. In other words, it is the most preferable that $R^{D29}$ is a methyl group. In a case where $R^{D29}$ and $R^{D3}$ are bonded to each other to from a ring, the ring may be an aromatic ring, or an aliphatic ring. Suitable examples of the group, which is represented by the formula (R4-1) and in which $R^{D29}$ and $R^{D30}$ are bonded to each other to from a ring, include a naphthalene-1-yl group, a 1,2,3,4-tetrahydro naphthalene-5-yl group, and the like. In the above formula (R4-1), p2 is an integer from 0 to 4, preferably 0 or 1, and more preferably 0.

In the above formula (R4-2), $R^9$ is an organic group. Examples of the organic group include groups similar to the organic groups described for $R^{23}$. Among the organic groups, an alkyl group is preferable. The alkyl group may be a straight chain or a branched chain. The number of carbon atoms of the alkyl group is preferably 1 to 10, more preferably 1 to 5, and particularly preferably 1 to 3. Preferable examples of $R^9$ include a methyl group, an ethyl group, a propyl group, an isopropyl group, and a butyl group. Among them, a methyl group is more preferable.

In the above formula (R4-2), r1 is an integer from 1 to 5, preferably an integer from 1 to 3, and more preferably 1 or 2. In the above formula (R4-2), s1 is 0 to (r1+3), preferably an integer from 0 to 3, more preferably an integer from 0 to 2, and particularly preferably 0. In the above formula (R4-2), q2 is an integer from 1 to 8, preferably an integer from 1 to 5, more preferably an integer from 1 to 3, and particularly preferably 1 or 2.

In the formula (d15), $R^{D27}$ represents a hydrogen atom, an optionally substituted alkyl group having 1 to 11 carbon atoms, or an optionally substituted aryl group. Preferable examples of substituents which an alkyl group may have in a case where v is an alkyl group include a phenyl group, a naphthyl group, and the like. Furthermore, preferable examples of substituents which an aryl group may have when $R^{D23}$ is an aryl group include an alkyl group having 1 to 5 carbon atoms, an alkoxy group, a halogen atom, and the like.

In the formula (d15), preferable examples of $R^{D27}$ include a hydrogen atom, a methyl group, an ethyl group, an n-propyl group, an isopropyl group, an n-butyl group, a phenyl group, a benzyl group, a methylphenyl group, a naphthyl groups, and the like. Among them, a methyl group or a phenyl group are more preferable.

A method of manufacturing the compound represented by the formula (d15) is not particularly limited. The compound represented by the formula (d15) is produced by a method including a step of converting an oxime ester group (═N—OH) included in the compound represented by the following formula (d16) into an oxime ester group represented by ═N—O—COR$^{D27}$. $R^{D27}$ is the same as $R^{D27}$ in the formula (d15).

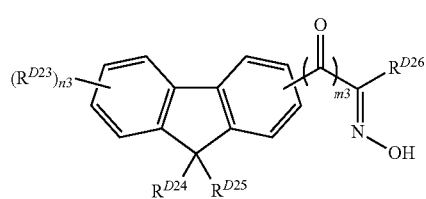

(d16)

($R^{D23}$, $R^{D24}$, $R^{D25}$, $R^{D26}$, m3, and n3 are similar to those in the formula (d15). n3 is an integer from 0 to 4, and m3 is 0 or 1.)

Therefore, the compound represented by the above formula (d16) is useful for an intermediate for synthesis of the compound represented by the formula (d15).

A method for converting an oxime group (═N—OH) into an oxime ester group represented by ═N—O—COR$^{D27}$ is not particularly limited. Typical examples of the method include a method of reacting an acylating agent that gives an acyl group represented by —COR$^{D27}$ with a hydroxyl group in an oxime group. Examples of the acylating agent include acid anhydride represented by (R$^{D27}$CO)$_2$O, and acid halide represented by R$^{D27}$COHal (Hal is a halogen atom).

The compound represented by the general formula (d15) can be synthesized according to, for example, the following scheme 1 when m3 is 0. In the scheme 1, fluorene derivative represented by the following formula (d1-1) is used as raw material. When $R^{D23}$ is a nitro group or a monovalent organic group, the fluorene derivative represented by the formula (d1-1) can be obtained by introducing a substituent $R^{D23}$ into fluorene derivative substituted at position 9 with $R^{D24}$ and $R^{D25}$ by a well-known method. The fluorene derivative substituted at position 9 with $R^{D24}$ and $R^{D25}$, for example, when $R^{D24}$ and $R^{D25}$ are an alkyl group, can be obtained by reacting fluorene and an alkylating agent with each other in an aprotic polar organic solvent in the presence of alkali metal hydroxide as described in Japanese Unexamined Patent Application, Publication No. H06-234668. Furthermore, 9,9-alkyl substituted fluorene can be obtained by carrying out an alkylating reaction by adding an alkylating agent such as halogenated alkyl, an aqueous solution of alkali metal hydroxide, and phase transfer catalyst such as tetrabutylammonium iodide and potassium tert-butoxide in the organic solvent solution of fluorene.

Fluorene derivatives represented by the formula (d1-3) are obtained by introducing an acyl group represented by —CO—R$^{D26}$ into fluorene derivatives represented by the formula (d1-1) by Friedel-Crafts acylation reaction. The acylating agent for introducing the acyl group represented by —CO—R$^{D26}$ may be a halocarbonyl compound, or may be an acid anhydride. As the acylating agent, a halocarbonyl compound represented by the formula (d1-2) is preferable. In the formula (d1-2), Hal represents a halogen atom. Position in which an acyl group is to be introduced on a fluorene ring can be selected by appropriately changing conditions of the Friedel-Crafts reaction, or carrying out protection and deprotection to a position other than the position to be acylated.

Then, a group represented by —CO—R$^{D26}$ in the resulting fluorene derivative represented by formula (d1-3) is converted into a group represented by —C(═N—OH)—R$^{D26}$ to obtain an oxime compound represented by the formula (d1-4). A method for converting the group represented by —CO—R$^{D26}$ into a group represented by —C(═N—OH)—R$^{26}$ is not particularly limited, but oximation by hydroxylamine is preferable. A compound represented by the following formula (d1-7) can be obtained by reacting an oxime compound in the formula (d1-4) and acid anhydride represented by the following formula (d1-5) ((R$^{D27}$CO)$_2$O) or acid halide represented by the following general formula (d1-6) (R$^{D27}$COHal, wherein Hal is a halogen atom) with each other.

Note here that in the formulae (d1-1), (d1-2), (d1-3), (d1-4), (d1-5), (d1-6), and (d1-7), $R^{D23}$, $R^{D24}$, $R^{D25}$, $R^{D26}$, and $R^{D27}$ are similar to those in the formula (d15).

Furthermore, in the scheme 1, $R^{D26}$ included in each of the formula (d1-2), the formula (d1-3), and the formula (d1-4) may be the same as or different from each other. In other words, $R^{D26}$ included in the formula (d1-2), the formula (d1-3), and the formula (d1-4) may be subjected to chemical modification in the synthesis process shown as the scheme 1. Examples of the chemical modification include esterification, etherification, acylation, amidation, halogenation, substitution of a hydrogen atom in an amino group by an organic group, and the like. Chemical modification which $R^{D26}$ may undergo is not limited to these examples.

<Scheme 1>

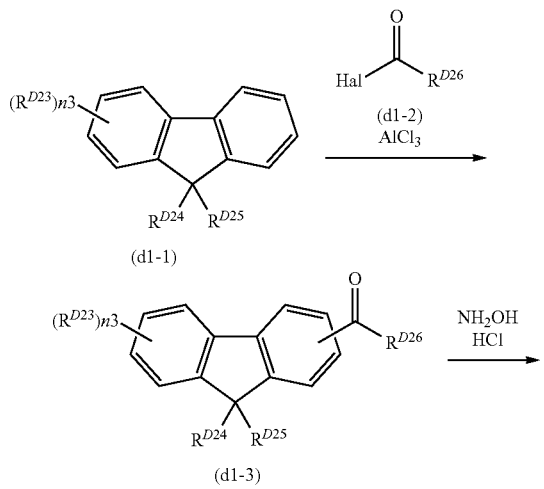

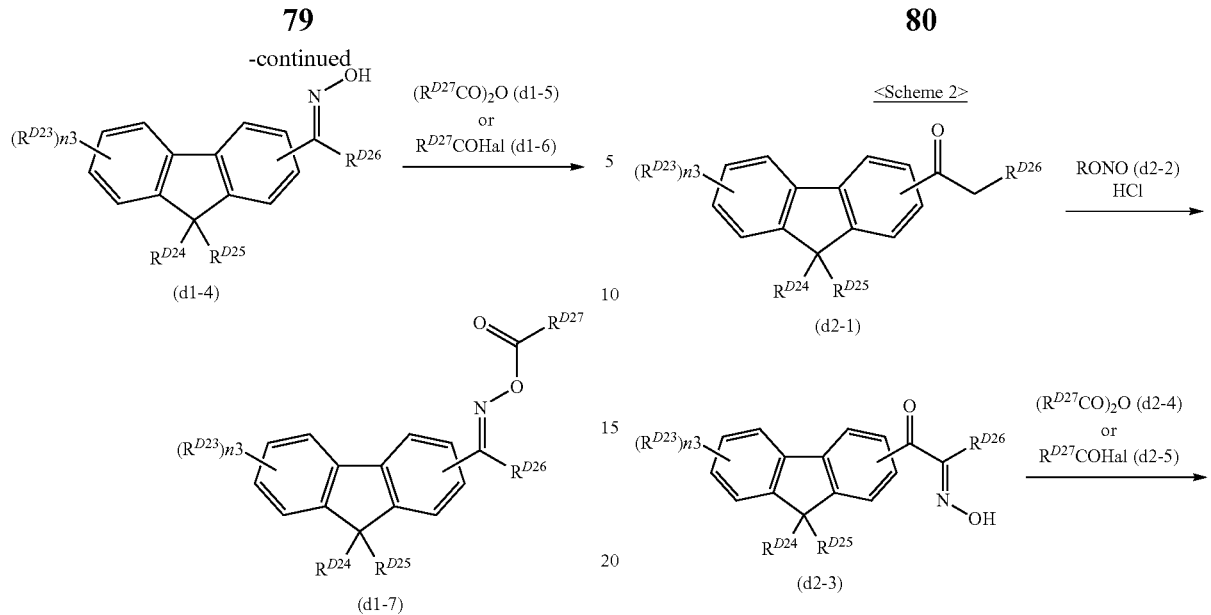

The compound represented by the general formula (d15) can be synthesized according to, for example, the following scheme 2 when m3 is 1. In the scheme 2, a fluorene derivative represented by the following formula (d1-7) is used as raw material. The fluorene derivative represented by the formula (d2-1) is obtained by introducing an acyl group represented by —CO—CH$_2$—R$^{D26}$ into the compound represented by the formula (d1-1) by Friedel-Crafts reaction by the same method as in the scheme 1. As the acylating agent, carboxylic acid halide represented by the formula (d1-8): Hal-CO—CH$_2$—R$^{D26}$ is preferable. Subsequently, a methylene group existing between R$^{D26}$ and a carbonyl group in the compound represented by the formula (d1-7) is made into oxime to obtain a ketoxime compound represented by the following formula (d2-3). A method for making a methylene group into oxime is not particularly limited, but preferred is a method for reacting nitrous ester (RONO, wherein R is an alkyl group having 1 to 6 carbon atoms) represented by the following general formula (d2-2) in the presence of hydrochloric acid. Next, a ketoxime compound represented by the following formula (d2-3), acid anhydride ((R$^{D27}$CO)$_2$O) represented by the following formula (d2-4), or acid halide (R$^{D27}$COHal, wherein Hal is a halogen atom) represented by the following general formula (d2-5) are reacted with each other to be able to obtain a compound represented by the following formula (d2-6). Note here that in the following formulae (d2-1), (d2-3), (d2-4), (d2-5), and (d2-6), R$^{D23}$, R$^{D24}$, R$^{D2}$, R$^{D26}$, and R$^{D27}$ are similar to those in the general formula (d15). In a case where m3 is 1, occurrence of foreign matter in a pattern formed using a photosensitive composition comprising the compound represented by the formula (d15) tends to be able to be reduced.

Furthermore, in the scheme 2, R$^{D26}$ included in each of the formula (d1-8), the formula (d2-1), and the formula (d2-3) may be the same as or different from each other. In other words, R$^{D26}$ included in the formula (d1-8), the formula (d2-1), and the formula (d2-3) may be subjected to chemical modification in the synthesis process shown as the scheme 2. Examples of the chemical modification include esterification, etherification, acylation, amidation, halogenation, substitution of a hydrogen atom in an amino group by an organic group, and the like. Chemical modification which R$^{D26}$ may undergo is not limited to these examples.

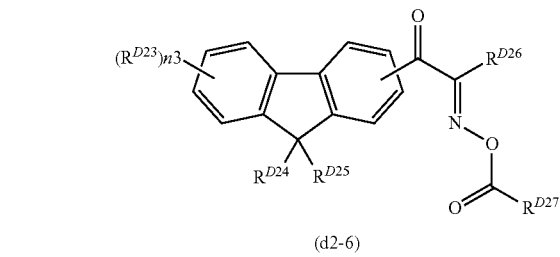

Suitable specific examples of the compound represented by the formula (d15) include the following compounds 1 to 41.

Compound 1

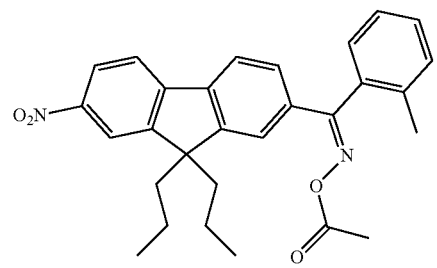

Compound 2

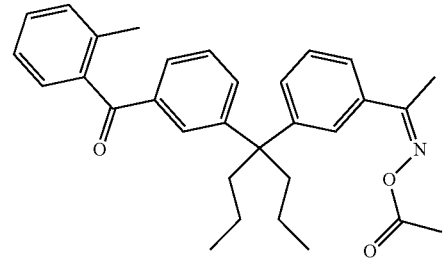

Compound 3
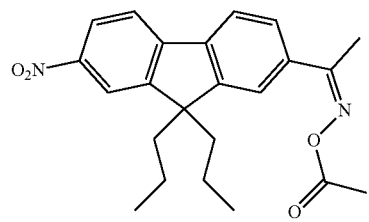
Compound 4
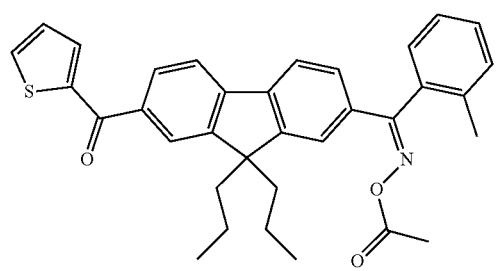
Compound 5
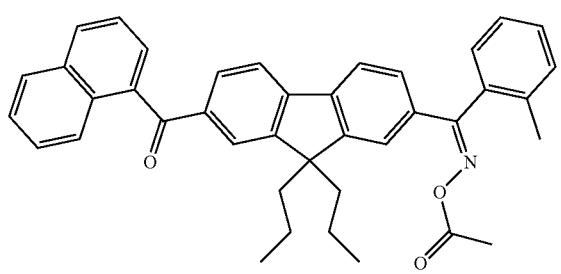
Compound 6
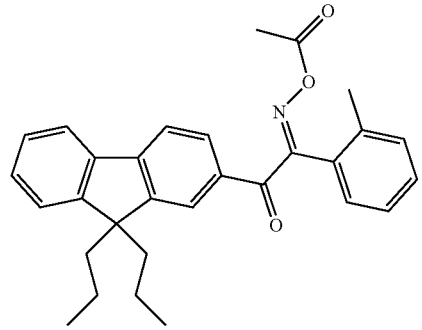
Compound 7
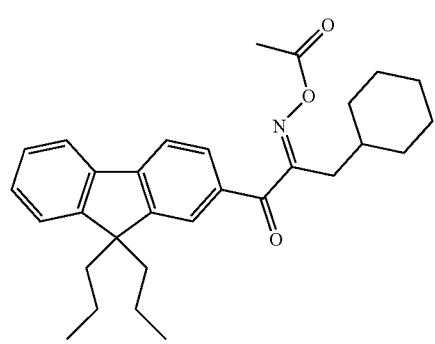
Compound 8
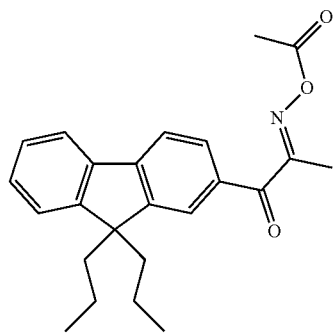
Compound 9
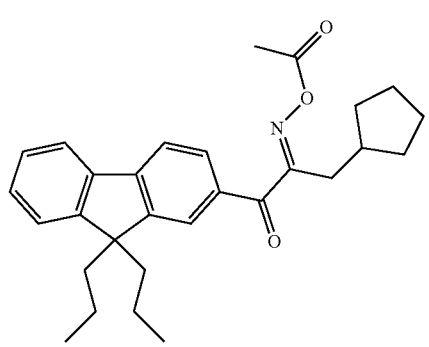
Compound 10
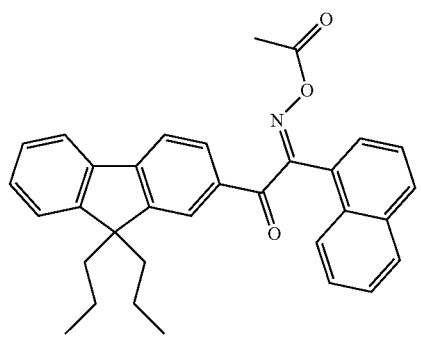
Compound 11
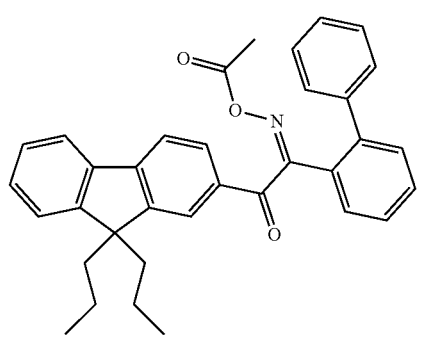

Compound 12
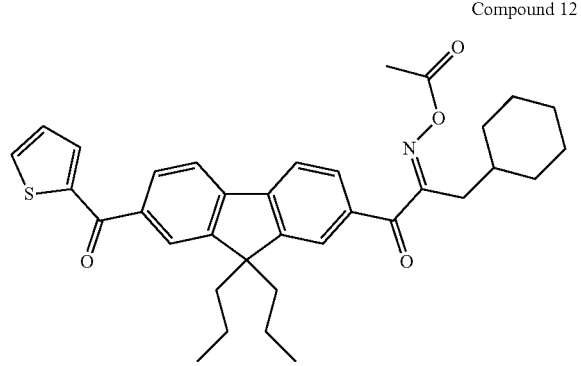
Compound 13
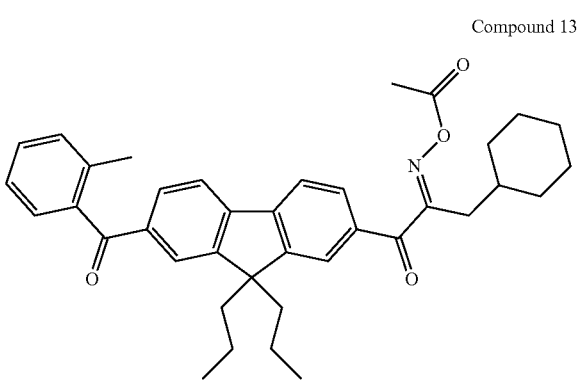
Compound 14
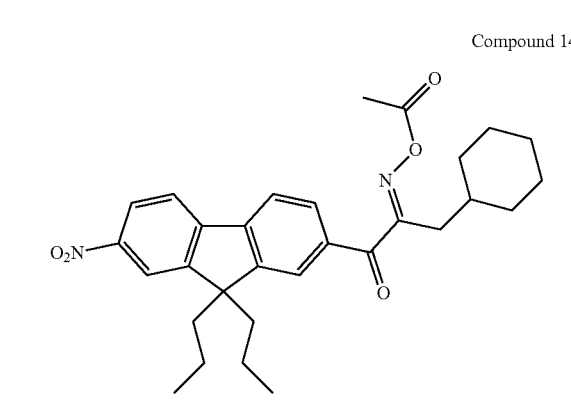
Compound 15
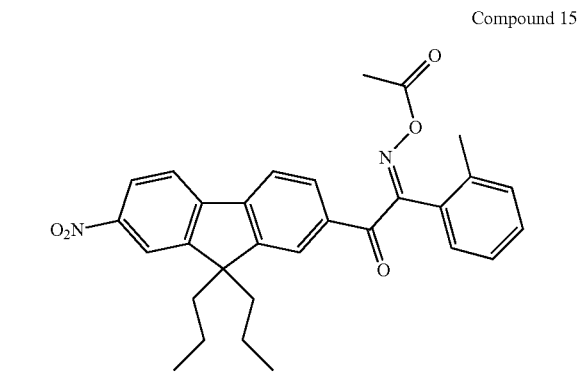
Compound 16
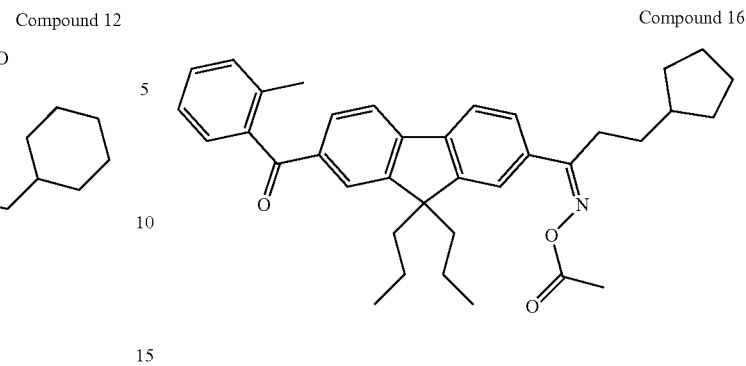
Compound 17
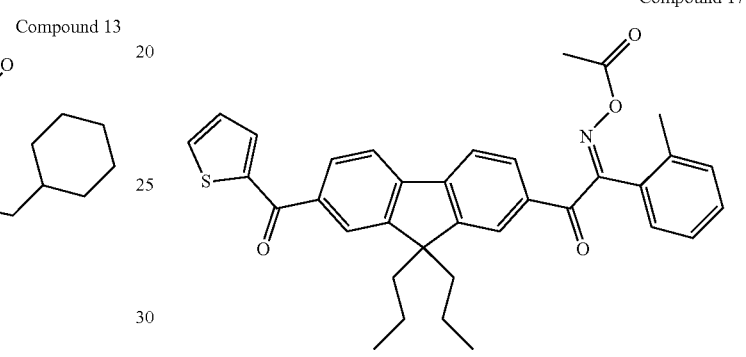
Compound 18
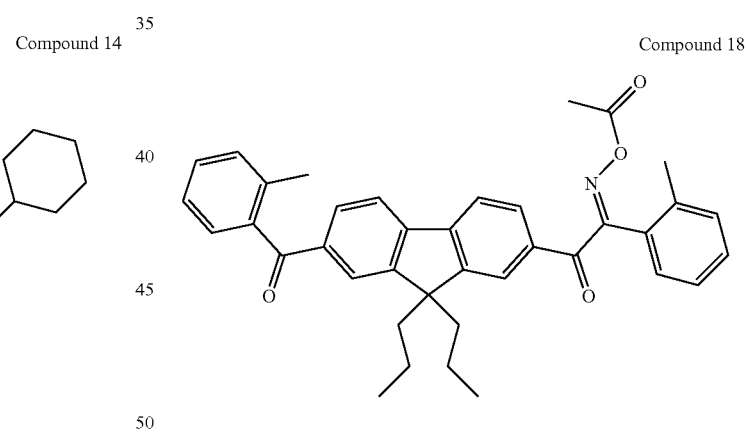
Compound 19
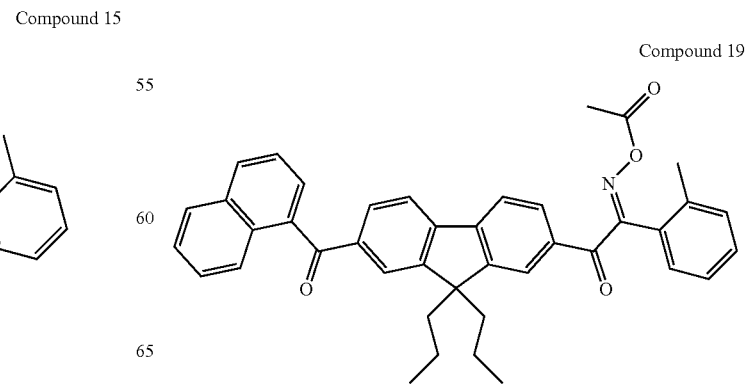

-continued
Compound 20
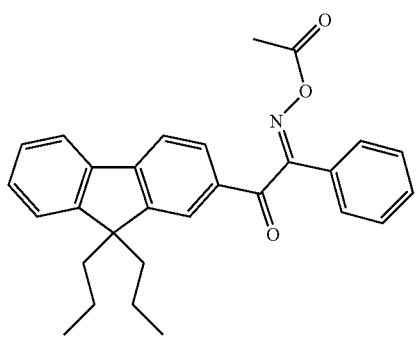
Compound 21
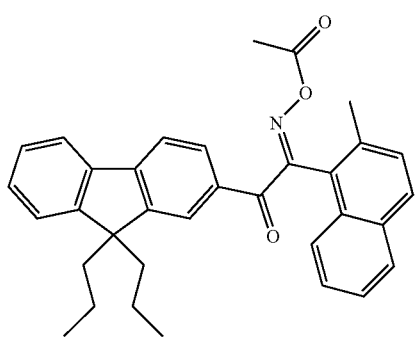
Compound 22
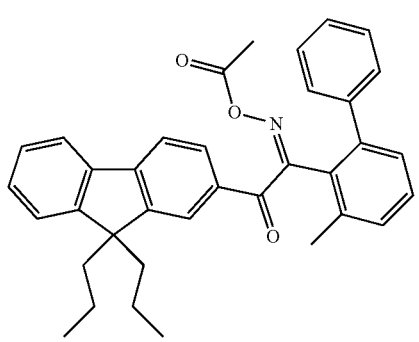
Compound 23
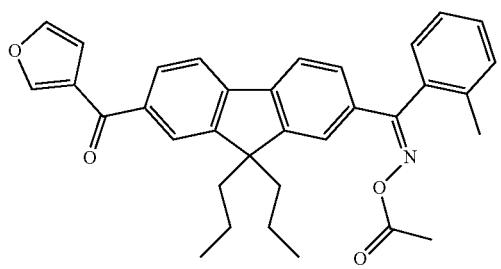
-continued
Compound 24
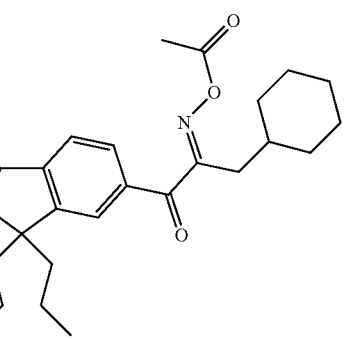
Compound 25
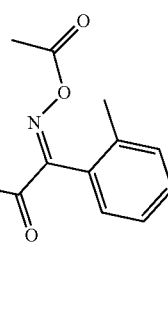
Compound 26
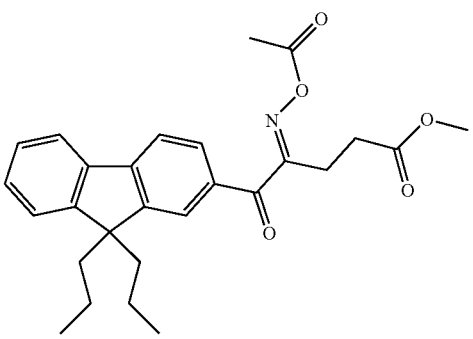
Compound 27
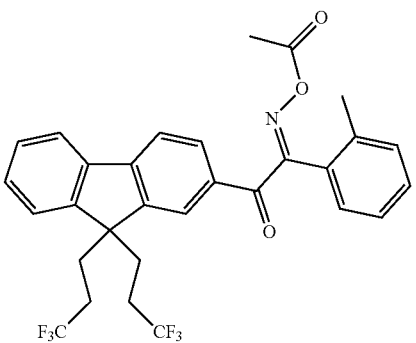

Compound 28
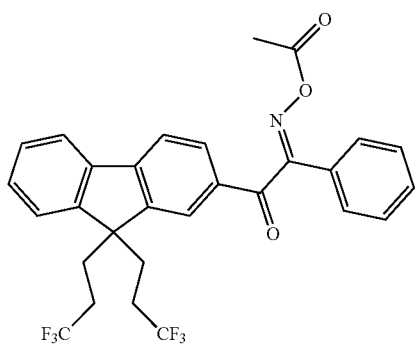
Compound 29
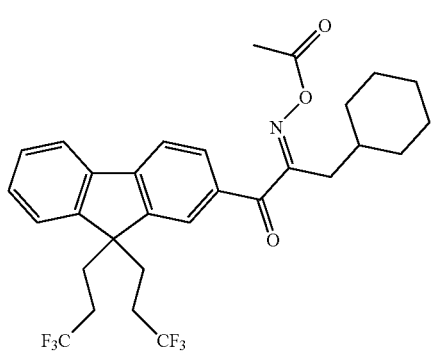
Compound 30
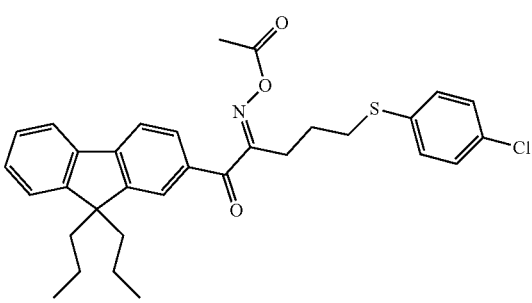
Compound 31
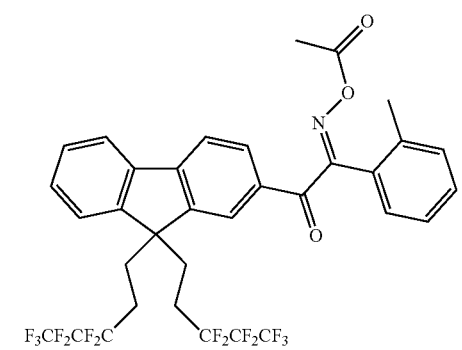
Compound 32
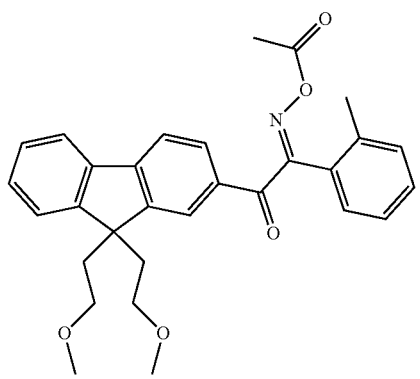
Compound 33
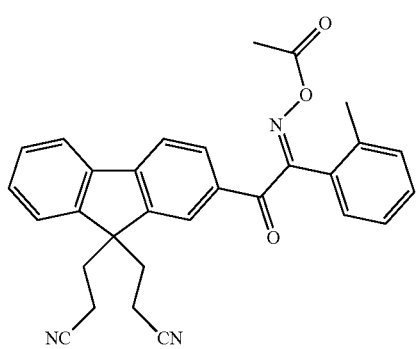
Compound 34
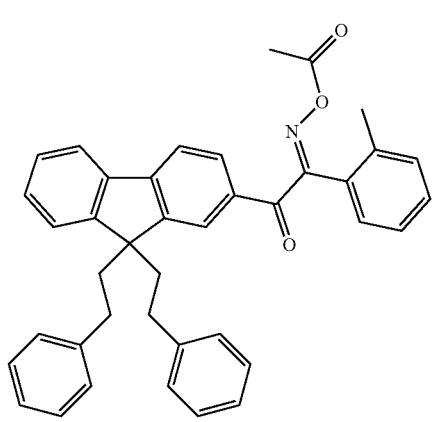
Compound 35
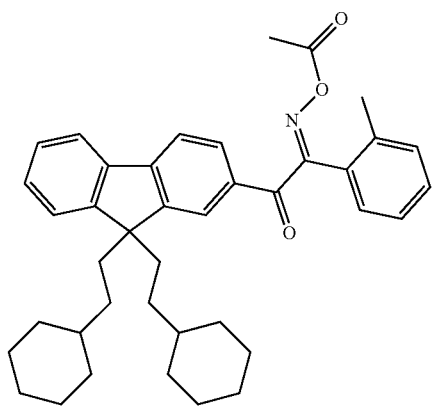

-continued

Compound 36

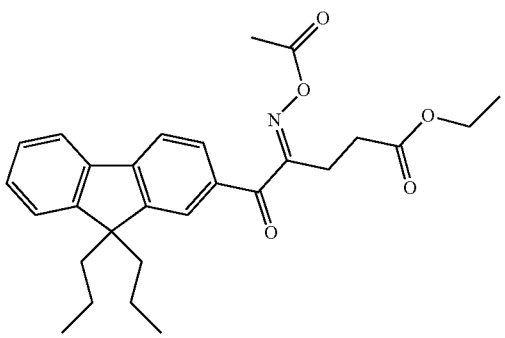

Compound 37

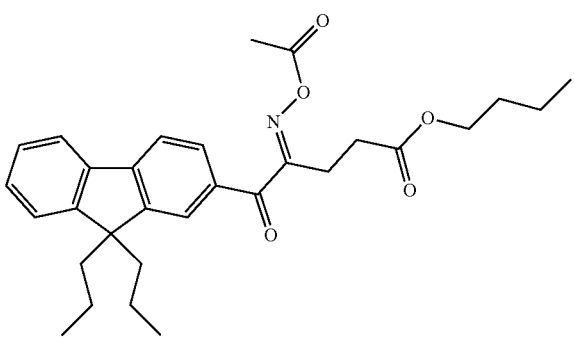

Compound 38

Compound 39

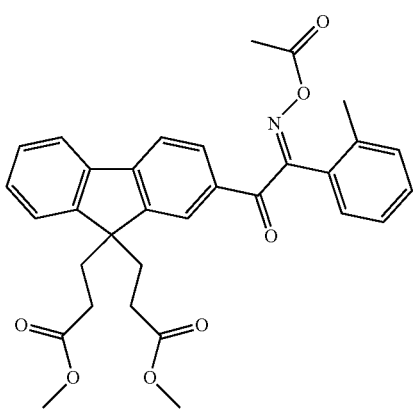

-continued

Compound 40

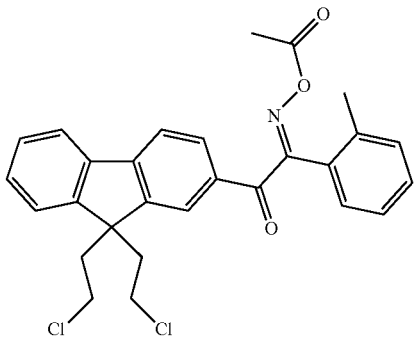

Compound 41

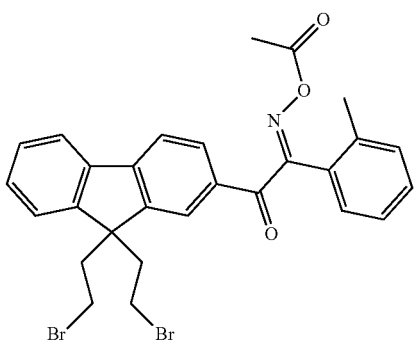

As the base generator component, compounds (D-1) and (D-2) may be used together.

The content of a base generator component in the energy-sensitive resin composition is not particularly limited, within a range that does not inhibit objects of the present invention. The content of a base generator component in the energy-sensitive resin composition is preferably from 1 to 50 parts by mass, more preferably 1 to 30 parts by mass relative to 100 parts by mass of the component (B). Furthermore, the content rate of the base generator component in the energy-sensitive resin composition is preferably 0.5 to 30% by mass, more preferably 1 to 20% by mass, and further preferably 3 to 10% by mass relative to the whole components excluding the component (S).

[Silicon-Containing Compound]

The energy-sensitive resin composition according to the present invention may include one or more silicon-containing compounds selected from the group consisting of a silicon-containing resin, a silicon-containing resin precursor, and a silane coupling agent. Examples of the silicon-containing resin include siloxane resin or polysilane. Examples of the silicon-containing resin precursor include a siloxane resin or silane compound that is a raw material monomer of polysilane.

When the energy-sensitive resin composition includes a silicon-containing compound, adhesiveness between a film obtained from the energy-sensitive resin composition and an object to be coated is good. Adhesion to the object to be coated improves process margin in formation of a coating film. This effect is remarkable when material of the object to be coated is a glass.

Hereinafter, a siloxane resin, polysilane, and a silane coupling agent will be described sequentially.

[Siloxane Resin]

Siloxane resin is not particularly limited as long as it is soluble in the solvent (S). The siloxane resin may be obtained by hydrolyzing and condensing a silane compound composition comprising at least one or more silane compounds selected from the silane compounds described below.

As the siloxane resin, for example, a siloxane resin obtained by hydrolyzing and condensing at least one selected from silane compounds represented by the following formula (c1) can be suitably used.

$$(R^{c1})_{4-p}Si(OR^{c2})_p \quad (c1)$$

In the formula (c1), $R^{c1}$ represents a hydrogen atom, an alkyl group, an alkenyl group, an aryl group, or an aralkyl group, $R^{c2}$ represents an alkyl group or a phenyl group, p is an integer from 2 to 4. When a plurality of $R^{c1}$ is bonded to Si, the plurality of $R^{c1}$ may be the same as or different from each other. Furthermore, a plurality of $(OR^{c2})$ groups bonded to Si may be the same as or different from each other.

Furthermore, an alkyl group as $R^{c1}$ is preferably a straight-chain or a branched alkyl group having 1 to 20 carbon atoms, more preferably straight-chain or branched alkyl group having 1 to 4 carbon atoms. An alkenyl group as $R^{c1}$ is preferably straight-chain or branched alkenyl group having 2 to 20 carbon atoms, more preferably straight-chain or branched alkenyl group having 2 to 4 carbon atoms.

When $R^{c1}$ is an aryl group or an aralkyl group, an aryl group included in these groups is not particularly limited, within a range that does not inhibit the objects of the present invention. Suitable examples of an aryl group include groups of the following formula.

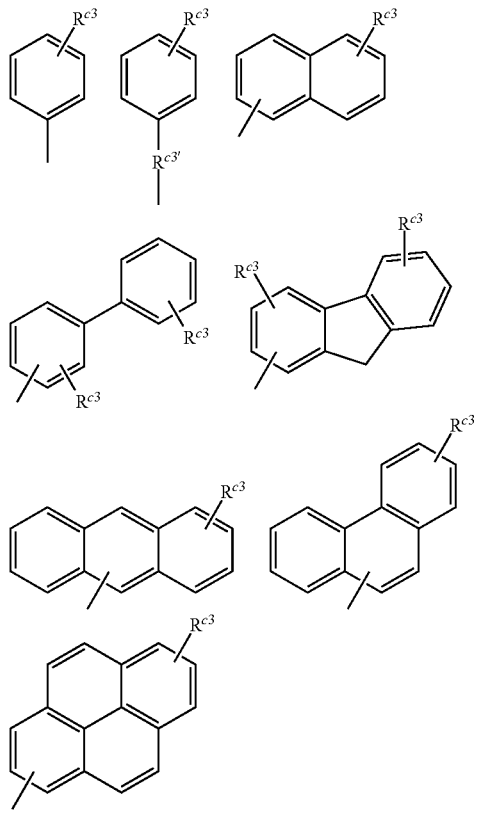

Among the groups of the above formula, a group of the following formula is preferable.

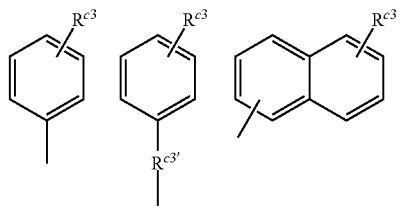

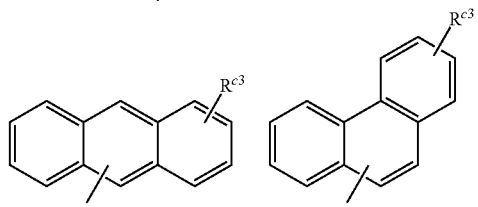

In the above formula, $R^{c3}$ denotes a hydrogen atom; a hydroxyl group; alkoxy groups such as a methoxy group, an ethoxy group, a butoxy group, and a propoxy group; hydrocarbon groups such as a methyl group, an ethyl group, a butyl group, and a propyl group. In the above formula, $R^{c3}$ denotes alkylene groups such as a methylene group, an ethylene group, a propylene group, and a butylene group.

When $R^{c1}$ is an aryl group or an aralkyl group, suitable specific examples thereof include a benzyl group, a phenethyl group, a phenyl group, a naphthyl group, an anthracenyl group, a phenanthryl group, a biphenyly group, a fluorenyl group, a pyrenyl group, and the like.

The number of benzene rings included in the aryl group or the aralkyl group is preferably from 1 to 3. When the number of benzene rings is from 1 to 3, productivity of siloxane resin is excellent, volatilization of siloxane resin during burning is suppressed by the increase in polymerization degree, and film formation becomes easy. The aryl group or the aralkyl group may include a hydroxyl group as a substituent.

Furthermore, an alkyl group as $R^{c2}$ is preferably a straight-chain or a branched alkyl group having 1 to 5 carbon atoms. The number of carbon atoms of the alkyl group as $R^{c2}$ is preferably 1 or 2 particularly from the viewpoint of hydrolysis speed. Silane compound (i) when p of the formula (c1) is 4 is represented by the following formula (c2).

$$Si(OR^{c4})_a(OR^{c5})_b(OR^{c6})_c(OR^{c7})_d \quad (c2)$$

In the formula (c2), $R^{c4}$, $R^{c5}$, $R^{c6}$ and $R^{c7}$ each independently represents an alkyl group or a phenyl group, which is the same as in above-mentioned $R^{c2}$.

a, b, c and d are integers satisfying $0 \le a \le 4$, $0 \le b \le 4$, $0 \le c \le 4$, and $0 \le d \le 4$, and also satisfying the condition of $a+b+c+d=4$.

The silane compound (ii) in which n in the formula (c1) is 3 is represented by the following formula (c3).

$$R^{c8}Si(OR^{c9})_e(OR^{c10})_f(OR^{c11})_g \quad (c3)$$

In the formula (c3), $R^{c8}$ represents a hydrogen atom, an alkyl group, an aryl group, or an aralkyl group, which is the same as in the above-mentioned $R^{c1}$. $R^{c9}$, $R^{c10}$, and $R^{c11}$ each independently represents an alkyl group or a phenyl group, which is the same as in the above-mentioned $R^{c2}$.

e, f, and g are integers satisfying $0 \le e \le 3$, $0 \le f \le 3$, and $0 \le g \le 3$, and also satisfying the condition of $e+f+g=3$.

The silane compound (iii) in which n in the formula (c1) is 2 is represented by the following formula (c4).

$$R^{c12}R^{c13}Si(OR^{c14})_h(OR^{c15})_i \quad (c4)$$

In the formula (c4), $R^{c12}$ and $R^{c13}$ represent a hydrogen atom, an alkyl group, an aryl group, or an aralkyl group, which is the same as in the above-mentioned $R^{c1}$. $R^{c14}$ and $R^{c15}$ each independently represents an alkyl group or a phenyl group, which is the same as in the above-mentioned $R^{c2}$.

h and i are integers satisfying $0 \leq h \leq 2$, $0 \leq i \leq 2$, and also satisfying the condition of $h+i=2$.

Specific examples of the silane compound (i) include tetraalkoxysilane such as tetramethoxysilane, tetraethoxysilane, tetrapropoxysilane, tetrabutoxysilane, tetrapentyloxysilane, tetraphenyloxysilane, trimethoxy monoethoxy silane, dimethoxy diethoxy silane, triethoxy monmethoxy silane, trimethoxy monopropoxy silane, monmethoxy tributoxy silane, monmethoxy tripentyloxy silane, monmethoxy triphenyloxy silane, dimethoxy dipropoxy silane, tripropoxy monmethoxy silane, trimethoxy monobutoxy silane, dimethoxy dibutoxy silane, triethoxy monopropoxy silane, diethoxy dipropoxy silane, tributoxymonopropoxy silane, dimethoxy monoethoxy monobutoxy silane, diethoxy monmethoxy monobutoxy silane, diethoxy monopropoxy monobutoxy silane, dipropoxy monmethoxy monoethoxy silane, dipropoxy monmethoxy monobutoxy silane, dipropoxy monoethoxy monobutoxy silane, dibutoxy monmethoxy monoethoxy silane, dibutoxy monoethoxy monopropoxy silane, and monmethoxy monoethoxy monopropoxy monobutoxy silane. Among them, tetramethoxysilane, and tetraethoxysilane are preferable.

Specific examples of the silane compound (ii) include: hydrosilane compounds such as trimethoxysilane, triethoxysilane, tripropoxy silane, tripentyloxy silane, triphenyloxysilane, dimethoxy monoethoxysilane, diethoxy monmethoxysilane, dipropoxy monmethoxysilane, dipropoxy monoethoxysilane, dipentyloxyl monmethoxysilane, dipentyloxy monoethoxysilane, dipentyloxy monopropoxysilane, diphenyloxyl monmethoxy silane, diphenyloxymonoethoxy silane, diphenyloxymonopropoxy silane, methoxy ethoxy propoxy silane, monopropoxy dimethoxy silane, monopropoxy diethoxy silane, monobutoxydimethoxysilane, monopentyloxydiethoxysilane, and monophenyloxydiethoxy silane;

methyl silane compounds such as methyltrimethoxysilane, methyltriethoxysilane, methyl tripropoxysilane, methyl tripentyloxysilane, methyl triphenyloxysilane, methyl monmethoxy diethoxy silane, methyl monmethoxy dipropoxy silane, methyl monmethoxy dipentyloxysilane, methyl monmethoxy diphenyloxirane, methyl methoxy ethoxy propoxysilane, and methyl monmethoxy monoethoxy monobutoxysilane;

ethyl silane compounds such as ethyl trimethoxysilane, ethyl triethoxysilane, ethyl tripropoxysilane, ethyl tripentyloxysilane, ethyl triphenyloxysilane, ethyl monmethoxy diethoxysilane, ethyl monmethoxy dipropoxysilane, ethyl monmethoxy dipentyloxysilane, ethyl monmethoxy diphenyloxirane, ethyl methoxy ethoxy propoxy silane, and ethyl monmethoxy monoethoxy monobutoxysilane;

propyl silane compounds such as propyl trimethoxysilane, propyl triethoxysilane, propyl tripropoxysilane, propyl tripentyloxysilane, and propyl triphenyloxysilane, propyl monmethoxy diethoxy silane, propyl monmethoxy dipropoxy silane, propyl monmethoxy dipentyloxy silane, propyl monmethoxy diphenyloxirane, propyl methoxy ethoxy propoxy silane, and propyl monmethoxy monoethoxy monobutoxysilane;

butyl silane compounds such as butyl trimethoxysilane, butyl triethoxysilane, butyl tripropoxysilane, butyl tripentyloxysilane, butyl triphenyloxysilane, butyl monmethoxy diethoxysilane, butyl monmethoxy dipropoxysilane, butyl monmethoxy dipentyloxysilane, butyl monmethoxy diphenyloxirane, butyl methoxy ethoxy propoxysilane, and butyl monmethoxy monoethoxy monobutoxysilane;

phenyl silane compound such as phenyl trimethoxysilane, phenyl triethoxysilane, phenyl tripropoxysilane, phenyl tripentyloxysilane, phenyl triphenyloxysilane, phenyl monmethoxy diethoxysilane, phenyl monmethoxy dipropoxysilane, phenyl monmethoxy dipentyloxysilane, phenyl monmethoxy diphenyloxirane, phenyl methoxy ethoxy propoxysilane, and phenyl monmethoxy monoethoxy monobutoxysilane;

hydroxyphenyl silane compounds such as hydroxyphenyl trimethoxysilane, hydroxyphenyl triethoxysilane, hydroxyphenyl tripropoxysilane, hydroxyphenyl tripentyloxysilane, hydroxyphenyl triphenyloxysilane, hydroxyphenyl monmethoxy diethoxysilane, hydroxyphenyl monmethoxy dipropoxysilane, hydroxyphenyl monmethoxy dipentyloxysilane, hydroxyphenyl monmethoxy diphenyloxirane, hydroxyphenyl methoxy ethoxy propoxysilane, and hydroxyphenyl monmethoxy monoethoxy monobutoxysilane;

naphthylsilane compounds such as naphthyl trimethoxysilane, naphthyl triethoxysilane, naphthyl tripropoxysilane, naphthyl tripentyloxysilane, naphthyl triphenyloxysilane, naphthyl monmethoxy diethoxysilane, naphthyl monmethoxy dipropoxysilane, naphthyl monmethoxy dipentyloxysilane, naphthyl monmethoxy diphenyloxirane, naphthyl methoxy ethoxy propoxysilane, and naphthyl monmethoxy monoethoxy monobutoxysilane;

benzyl silane compounds such as benzyl trimethoxysilane, benzyltriethoxysilane, benzyltripropoxysilane, benzyltripentyloxysilane, benzyltriphenyloxysilane, benzylmonmethoxy diethoxysilane, benzylmonmethoxy dipropoxysilane, benzylmonmethoxy dipentyloxysilane, benzylmonmethoxy diphenyloxirane, benzyl methoxy ethoxy propoxysilane, and benzylmonmethoxy monoethoxy monobutoxysilane;

hydroxybenzyl silane compounds such as hydroxybenzyl trimethoxysilane, hydroxybenzyltriethoxysilane, hydroxybenzyltripropoxysilane, hydroxybenzyltripentyloxysilane, hydroxybenzyltriphenyloxysilane, hydroxybenzylmonmethoxy diethoxysilane, hydroxybenzylmonmethoxy dipropoxysilane, hydroxybenzylmonmethoxy dipentyloxysilane, hydroxybenzylmonmethoxy diphenyloxirane, hydroxybenzyl methoxy ethoxy propoxysilane, and hydroxybenzylmonmethoxy monoethoxy monobutoxysilane.

Specific examples of the silane compound (iii) include: hydrosilane compounds such as dimethoxysilane, diethoxysilane, dipropoxysilane, dipentyloxysilane, diphenyloxirane, methoxy ethoxysilane, methoxy propoxysilane, methoxy pentyloxysilane, methoxy phenyloxysilane, ethoxy propoxysilane, ethoxy pentyloxysilane, and ethoxy phenyloxysilane;

methyl hydrosilane compounds such as methyl dimethoxysilane, methyl methoxy ethoxysilane, methyl diethoxysilane, methyl methoxy propoxysilane, methyl methoxy pentyloxysilane, methyl ethoxy propoxysilane, methyl dipropoxysilane, methyl dipentyloxysilane, methyl diphenyloxirane, and methyl methoxy phenyloxysilane;

ethyl hydrosilane compound such as ethyl dimethoxysilane, ethyl methoxy ethoxysilane, ethyl diethoxysilane, ethyl methoxy propoxysilane, ethyl methoxy pentyloxysilane, ethyl ethoxy propoxysilane, ethyl dipropoxysilane, ethyl dipentyloxysilane, ethyl diphenyloxirane, and ethyl methoxy phenyloxysilane;

propyl hydrosilane compounds such as propyl dimethoxysilane, propyl methoxy ethoxysilane, propyl diethoxysilane, propyl methoxy propoxysilane, propyl methoxy pentyloxysilane, propyl ethoxy propoxysilane, propyl dipropoxysilane, propyl dipentyloxysilane, propyl diphenyloxirane, and propyl methoxy phenyloxysilane;

butyl hydrosilane compounds such as butyl dimethoxysilane, butyl methoxy ethoxysilane, butyl diethoxysilane, butyl methoxy propoxysilane, butyl methoxy pentyloxysilane, butyl ethoxy propoxysilane, butyl dipropoxysilane, butyl dipentyloxysilane, butyl diphenyloxirane, and butyl methoxy phenyloxysilane;

phenyl hydrosilane compounds such as phenyl dimethoxysilane, phenyl methoxy ethoxysilane, phenyl diethoxysilane, phenyl methoxy propoxysilane, phenyl methoxy pentyloxysilane, phenyl ethoxy propoxysilane, phenyl dipropoxysilane, phenyl dipentyloxysilane, phenyl diphenyloxy silane, and phenyl methoxy phenyloxysilane;

hydroxyphenyl hydrosilane compound such as hydroxyphenyl dimethoxysilane, hydroxyphenyl methoxy ethoxysilane, hydroxyphenyl diethoxysilane, hydroxyphenyl methoxy propoxysilane, hydroxyphenyl ethoxy pentyloxysilane, hydroxyphenyl ethoxy propoxysilane, hydroxyphenyl dipropoxysilane, hydroxyphenyl dipentyloxysilane, hydroxyphenyl diphenyloxy silane, hydroxyphenyl methoxy phenyloxysilane;

naphthyl hydrosilane compound such as naphthyl dimethoxysilane, naphthyl methoxy ethoxysilane, naphthyl diethoxysilane, naphthyl methoxy propoxysilane, naphthyl methoxy pentyloxysilane, naphthyl ethoxy propoxysilane, naphthyl dipropoxysilane, naphthyl dipentyloxysilane, naphthyl diphenyloxirane, naphthyl methoxy phenyloxysilane; benzylhydrosilane compound such as benzyldimethoxysilane, benzyl methoxy ethoxysilane, benzyldiethoxysilane, benzyl methoxy propoxysilane, benzyl methoxy pentyloxysilane, benzyl ethoxy propoxysilane, benzyldipropoxysilane, benzyldipentyloxysilane, benzyldiphenyloxirane, benzyl methoxy phenyloxysilane;

hydroxybenzylhydrosilane compounds such as hydroxybenzyldimethoxysilane, hydroxybenzyl methoxy ethoxysilane, hydroxybenzyldiethoxysilane, hydroxybenzyl methoxy propoxysilane, hydroxybenzyl methoxy pentyloxysilane, hydroxybenzyl ethoxy propoxysilane, hydroxybenzyldipropoxysilane, hydroxybenzyldipentyloxysilane, hydroxybenzyldiphenyloxirane, hydroxybenzyl methoxy phenyloxysilane;

dimethyl silane compounds such as dimethyl dimethoxysilane, dimethyl methoxy ethoxysilane, dimethyl methoxy propoxysilane, dimethyl diethoxysilane, dimethyl dipentyloxysilane, dimethyl diphenyloxirane, dimethyl ethoxy propoxysilane, dimethyl dipropoxysilane;

diethyl silane compounds such as diethyl dimethoxysilane, diethyl methoxy ethoxysilane, diethyl methoxy propoxysilane, diethyl diethoxysilane, diethyl dipentyloxysilane, diethyl diphenyloxirane, diethyl ethoxy propoxysilane, diethyl dipropoxysilane;

dipropoxysilane compounds such as dipropyl dimethoxysilane, dipropyl methoxy ethoxysilane, dipropyl methoxy propoxysilane, dipropyl diethoxysilane, dipropyl dipentyloxysilane, dipropyl diphenyloxirane, dipropyl ethoxy propoxysilane, dipropyl dipropoxysilane;

dibutyl silane compounds such as dibutyl dimethoxysilane, dibutyl methoxy ethoxysilane, dibutyl methoxy propoxysilane, dibutyl diethoxysilane, dibutyl dipentyloxysilane, dibutyl diphenyloxirane, dibutyl ethoxy propoxysilane, dibutyl dipropoxysilane;

diphenyl silane compounds such as diphenyl dimethoxysilane, diphenyl methoxy ethoxysilane, diphenyl methoxy propoxysilane, diphenyl diethoxysilane, diphenyl dipentyloxysilane, diphenyl diphenyloxy silane, diphenyl ethoxy propoxysilane, diphenyl dipropoxysilane;

di(hydroxyphenyl) silane compounds such as di(hydroxyphenyl)dimethoxysilane, di(hydroxyphenyl)methoxy ethoxysilane, di(hydroxyphenyl) methoxy propoxysilane, di(hydroxyphenyl)diethoxysilane, di(hydroxyphenyl) dipentyloxysilane, di(hydroxyphenyl)diphenyloxirane, di(hydroxyphenyl) ethoxy propoxysilane, di(hydroxyphenyl)dipropoxysilane;

dinaphthylsilane compounds such as dinaphthyl dimethoxysilane, dinaphthyl methoxy ethoxysilane, dinaphthyl methoxy propoxysilane, dinaphthyl diethoxysilane, dinaphthyl dipentyloxysilane, dinaphthyl diphenyloxirane, dinaphthyl ethoxy propoxysilane, dinaphthyl dipropoxysilane;

dibenzyl silane compounds such as dibenzyldimethoxysilane, dibenzyl methoxy ethoxysilane, dibenzyl methoxy propoxysilane, dibenzyldiethoxysilane, dibenzyldipentyloxysilane, dibenzyldiphenyloxirane, dibenzyl ethoxy propoxysilane, dibenzyldipropoxysilane;

di(hydroxybenzyl)silane compounds such as di(hydroxybenzyl)dimethoxysilane, di(hydroxybenzyl) methoxy ethoxysilane, di(hydroxybenzyl) methoxy propoxysilane, di(hydroxybenzyl)diethoxysilane, di(hydroxybenzyl) dipentyloxysilane, di(hydroxybenzyl)diphenyloxirane, di(hydroxybenzyl) ethoxy propoxysilane, di(hydroxybenzyl)dipropoxysilane;

methyl ethyl silane compounds such as methyl ethyl dimethoxysilane, methyl ethyl methoxy ethoxysilane, methyl ethyl methoxy propoxysilane, methyl ethyl diethoxysilane, methyl ethyl dipentyloxysilane, methyl ethyl diphenyloxirane, methyl ethyl ethoxy propoxysilane, methyl ethyl dipropoxysilane;

methyl propyl silane compounds such as methyl propyl dimethoxysilane, methyl propyl methoxy ethoxysilane, methyl propyl methoxy propoxysilane, methyl propyl diethoxysilane, methyl propyl dipentyloxysilane, methyl propyl diphenyloxirane, methyl propyl ethoxy propoxysilane, methyl propyl dipropoxysilane;

methyl butyl silane compounds such as methyl butyl dimethoxysilane, methyl butyl methoxy ethoxysilane, methyl butyl methoxy propoxysilane, methyl butyl diethoxysilane, methyl butyl dipentyloxysilane, methyl butyl diphenyloxirane, methyl butyl ethoxy propoxysilane, methyl butyl dipropoxysilane;

methyl(phenyl) silane compounds such as methyl(phenyl) dimethoxysilane, methyl(phenyl)methoxy ethoxysilane, methyl(phenyl)methoxy propoxysilane, methyl(phenyl)diethoxysilane, methyl(phenyl)dipentyloxysilane, methyl (phenyl)diphenyloxirane, methyl(phenyl)ethoxy propoxysilane, methyl(phenyl)dipropoxysilane;

methyl(hydroxyphenyl)silane compounds such as methyl (hydroxyphenyl)dimethoxysilane, methyl(hydroxyphenyl) methoxy ethoxysilane, methyl (hydroxyphenyl) methoxy propoxysilane, methyl (hydroxyphenyl)diethoxysilane, methyl (hydroxyphenyl)dipentyloxysilane, methyl (hydroxyphenyl)diphenyloxirane methyl(hydroxyphenyl) ethoxy propoxysilane, methyl(hydroxyphenyl)dipropoxysilane;

methyl(naphthyl) silane compounds such as methyl(naphthyl)dimethoxysilane, methyl(naphthyl) methoxy ethoxysilane, methyl(naphthyl) methoxy propoxysilane, methyl (naphthyl)diethoxysilane, methyl(naphthyl) dipentyloxysilane, methyl(naphthyl)diphenyloxirane, methyl(naphthyl)ethoxy propoxysilane, methyl(naphthyl) dipropoxysilane;

methyl(benzyl)silane compounds such as methyl(benzyl) dimethoxysilane, methyl(benzyl) methoxy ethoxysilane, methyl(benzyl) methoxy propoxysilane, methyl(benzyl)diethoxysilane, methyl(benzyl)dipentyloxysilane, methyl(benzyl)diphenyloxirane, methyl(benzyl)ethoxy propoxysilane, methyl(benzyl)dipropoxysilane;

methyl(hydroxybenzyl)silane compounds such as methyl(hydroxybenzyl)dimethoxysilane, methyl(hydroxybenzyl) methoxy ethoxysilane, methyl(hydroxybenzyl)methoxy propoxysilane, methyl(hydroxybenzyl)diethoxysilane, methyl(hydroxybenzyl)dipentyloxysilane, methyl(hydroxybenzyl)diphenyloxirane, methyl(hydroxybenzyl) ethoxy propoxysilane, methyl(hydroxybenzyl)dipropoxysilane;

ethyl propyl silane compounds such as ethyl propyl dimethoxysilane, ethyl propyl methoxy ethoxysilane, ethyl propyl methoxy propoxysilane, ethyl propyl diethoxysilane, ethyl propyl dipentyloxysilane, ethyl propyl diphenyloxirane, ethyl propyl ethoxy propoxysilane, ethyl propyl dipropoxysilane;

ethyl butyl silane compounds such as ethyl butyl dimethoxysilane, ethyl butyl methoxy ethoxysilane, ethyl butyl methoxy propoxysilane, ethyl butyl diethoxysilane, ethyl butyl dipentyloxysilane, ethyl butyl diphenyloxirane, ethyl butyl ethoxy propoxysilane, ethyl butyl dipropoxysilane;

ethyl(phenyl)silane compounds such as ethyl(phenyl)dimethoxysilane, ethyl(phenyl) methoxy ethoxysilane, ethyl(phenyl) methoxy propoxysilane, ethyl(phenyl)diethoxysilane, ethyl(phenyl)dipentyloxysilane, ethyl(phenyl)diphenyloxirane, ethyl(phenyl)ethoxy propoxysilane, ethyl(phenyl)dipropoxysilane;

ethyl(hydrophenyl)silane compounds such as ethyl(hydrophenyl)dimethoxysilane, ethyl(hydrophenyl)methoxy ethoxysilane, ethyl(hydrophenyl)methoxy propoxysilane, ethyl(hydrophenyl)diethoxysilane, ethyl(hydrophenyl)dipentyloxysilane, ethyl(hydrophenyl)diphenyloxirane, ethyl(hydrophenyl)ethoxy propoxysilane, ethyl(hydrophenyl)dipropoxysilane;

ethyl(naphtyl)silane compounds such as ethyl(naphtyl)dimethoxysilane, ethyl(naphtyl) methoxy ethoxysilane, ethyl(naphtyl)methoxy propoxysilane, ethyl(naphtyl)diethoxysilane, ethyl(naphtyl)dipentyloxysilane, ethyl(naphtyl)diphenyloxirane, ethyl(naphtyl)ethoxy propoxysilane, ethyl(naphtyl)dipropoxysilane; ethyl(benzyl)silane compound such as ethyl(benzyl)dimethoxysilane, ethyl(benzyl) methoxy ethoxysilane, ethyl(benzyl)methoxy propoxysilane, ethyl(benzyl)diethoxysilane, ethyl(benzyl)dipentyloxysilane, ethyl(benzyl)diphenyloxirane, ethyl(benzyl)ethoxy propoxysilane, ethyl(benzyl)dipropoxysilane;

ethyl(hydroxybenzyl)silane compounds such as ethyl(hydroxybenzyl)dimethoxysilane, ethyl(hydroxybenzyl) methoxy ethoxysilane, ethyl(hydroxybenzyl)methoxy propoxysilane, ethyl(hydroxybenzyl)diethoxysilane, ethyl(hydroxybenzyl)dipentyloxysilane, ethyl(hydroxybenzyl)diphenyloxirane, ethyl(hydroxybenzyl)ethoxy propoxysilane, ethyl(hydroxybenzyl)dipropoxysilane;

propyl butyl silane compounds such as propyl butyl dimethoxysilane, propyl butyl methoxy ethoxysilane, propyl butyl methoxy propoxysilane, propyl butyl diethoxysilane, propyl butyl dipentyloxysilane, propyl butyl diphenyloxirane, propyl butyl ethoxy propoxysilane, propyl butyl dipropoxysilane;

propyl(phenyl)silane compounds such as propyl(phenyl)dimethoxysilane, propyl(phenyl)methoxy ethoxysilane, propyl(phenyl) methoxy propoxysilane, propyl(phenyl)diethoxysilane, propyl(phenyl)dipentyloxysilane, propyl(phenyl)diphenyloxirane, propyl(phenyl)ethoxy propoxysilane, propyl(phenyl)dipropoxysilane; propyl(hydroxyphenyl) silane compounds such as propyl(hydroxyphenyl)dimethoxysilane, propyl(hydroxyphenyl)methoxy ethoxysilane, propyl(hydroxyphenyl)methoxy propoxysilane, propyl(hydroxyphenyl)diethoxysilane, propyl(hydroxyphenyl)dipentyloxysilane, propyl(hydroxyphenyl)diphenyloxirane, propyl(hydroxyphenyl)ethoxy propoxysilane, propyl(hydroxyphenyl)dipropoxysilane;

propyl(naphthyl)silane compound such as propyl(naphthyl)dimethoxysilane, propyl(naphthyl)methoxy ethoxysilane, propyl(naphthyl)methoxy propoxysilane, propyl(naphthyl)diethoxysilane, propyl(naphthyl)dipentyloxysilane, propyl(naphthyl)diphenyloxirane, propyl(naphthyl)ethoxy propoxysilane, propyl(naphthyl)dipropoxysilane;

propyl(benzyl)silane compounds such as propyl (benzyl)dimethoxysilane, propyl(benzyl)methoxy ethoxysilane, propyl(benzyl)methoxy propoxysilane, propyl (benzyl)diethoxysilane, propyl (benzyl)dipentyloxysilane, propyl(benzyl)diphenyloxirane, propyl(benzyl)ethoxy propoxysilane, propyl(benzyl)dipropoxysilane;

propyl(hydroxybenzyl)silane compounds such as propyl(hydroxybenzyl)dimethoxysilane, propyl(hydroxybenzyl) methoxy ethoxysilane, propyl(hydroxybenzyl)methoxy propoxysilane, propyl(hydroxybenzyl)diethoxysilane, propyl(hydroxybenzyl)dipentyloxysilane, propyl(hydroxybenzyl)diphenyloxirane, propyl(hydroxybenzyl)ethoxy propoxysilane, and propyl(hydroxybenzyl)dipropoxysilane.

Furthermore, the silane compound may be, for example, a silane compound represented by the following formula (c5).

$$(R^{c20}O)_q R^{c18}{}_{3-q}Si—R^{c17}—Si(OR^{c21})_r R^{c19}{}_{3-r} \quad (c5)$$

$R^{c17}$ represents a divalent polycyclic aromatic group. $R^{c18}$ and $R^{c19}$ represent a monovalent group directly bonded to a silicon atom, and, similar to the above-mentioned Rd in the formula (c1), represent a hydrogen atom, an alkyl group, an alkenyl group, and an aryl group, and they may be the same as or different from each other. $R^{c20}$ and $R^{c21}$ represent a hydrogen atom, a methyl group, an ethyl group, a propyl group, or a butyl group, and they may be the same as or different from each other. q and r are each independently an integer from 1 to 3.

The polycyclic aromatic group may be a group in which two or more rings including two or more aromatic rings are condensed, or a group in which two or more rings including two or more aromatic rings are bonded to each other by a single bond or by a divalent coupling group. A partial structure in the polycyclic aromatic group may include a non-aromatic ring. Specific examples of the divalent coupling group include an alkylene group having 1 to 6 carbon atoms, —CO—, —CS—, —O—, —S—, —NH—, —N=N—, —CO—O—, —CO—NH—, —CO—S—, —CS—O—, —CS—S—, —CO—NH—CO—, —NH—CO—NH—, —SO—, —SO$_2$—, and the like. The polycyclic aromatic group may be a hydrocarbon group, or may include one or more heteroatoms. Examples of the heteroatom include N, S, O, P, and the like. The number of rings included in the polycyclic aromatic group is preferably an integer from 2 to 5, and more preferably an integer from 2 to 4. The polycyclic aromatic group may have a substituent. Examples of the substituent include a hydroxyl group, an alkyl group having 1 to 6 carbon atoms, an alkoxy group having 1 to 6 carbon atoms, a halogen atom, a nitro group, an amino group, a cyano group, an aliphatic acyl group having 2 to 6 carbon atoms, and the like. Among these substituents, alkoxy groups such as a methoxy group, an ethoxy group, a butoxy group, and a propoxy group, and alkyl groups such as a methyl group, an ethyl group, a butyl group, and a propyl group, are preferable. When the polycyclic aromatic group includes a substituent, the number of the substituents is not particularly limited. The number of the substituents is typically preferably an integer from 1 to 6, and more preferably an integer from 1 to 3.

Specific examples of the divalent polycyclic aromatic group include a group in which two hydrogen atoms to be bonded to the aromatic ring is excluded from a polycyclic aromatic compound selected from the group consisting of naphthalene, biphenyl, terphenyl, anthracene, phenanthrene, anthraquinone, pyrene, carbazole, N-methyl carbazole, N-ethyl carbazole, N-n-propyl carbazole, N-n-butyl carbazole, dibenzofuran, dibenzothiophene, dibenzothiophene-5,5-dioxide, fluorene, 9,9-dimethyl fluorene, 9,9-diethyl fluorene, 9,9-di-n-propyl fluorene, 9,9-di-n-butyl fluorene, and fluorenone.

Preferable specific examples of the silane compound represented by the formula (c5) are shown below.

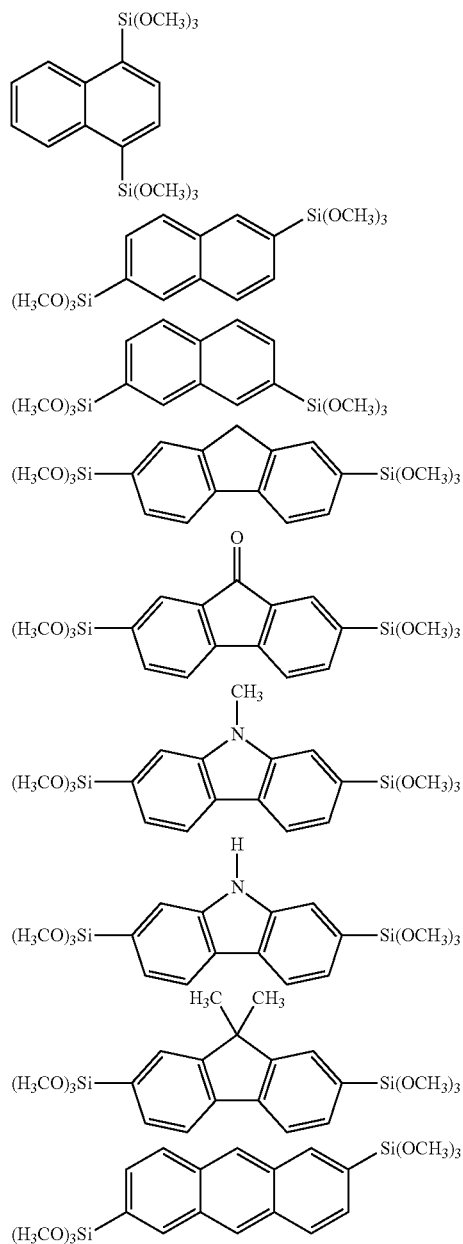

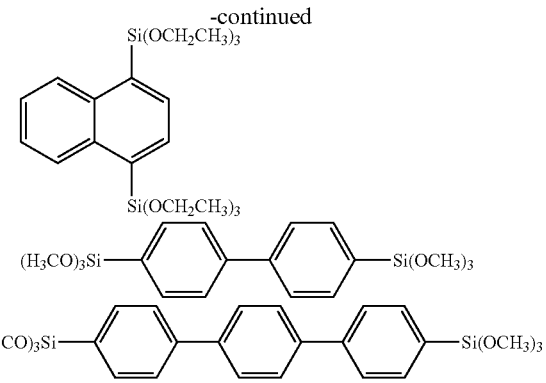

The siloxane resin is obtained by hydrolyzing and condensing the silane compound described above in a routine manner. A mass average molecular weight of the siloxane resin is preferably 300 to 30000, and more preferably 500 to 10000. When a siloxane resin having a mass average molecular weight within this range is blended into an energy-sensitive resin composition, excellent film formation property is achieved.

Suitable examples of the siloxane resin obtained by hydrolyzing and condensing the silane compound described above include siloxane resin having a structural unit shown by the following formula (C-1). In the siloxane resin, the number of carbon atoms per silicon atom is two or more.

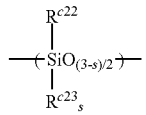

(C-1)

(In the formula (C-1), $R^{c22}$ is an alkyl group, an aryl group, or an aralkyl group, $R^{c23}$ is hydrogen or an alkyl group, an aryl group, or an aralkyl group, and s is 0 or 1.)

An alkyl group, an aryl group, or an aralkyl group in $R^{c22}$ and $R^{c23}$ are the same as the alkyl group, the aryl group, or the aralkyl group in the aforementioned formula (c1).

As the alkyl group, an alkyl group having 1 to 5 carbon atoms is preferable, and examples thereof include a methyl group, an ethyl group, an n-propyl group, i-propyl group, an n-butyl group, a tert-butyl group and the like. Examples of the aryl group and the aralkyl group include a benzyl group, a phenethyl group, a phenyl group, a naphthyl group, an anthracenyl group, a phenanthryl group, a biphenyly group, a fluorenyl group, and a pyrenyl group.

Specifically, as an aryl group and an aralkyl group, groups having the following structure are preferable.

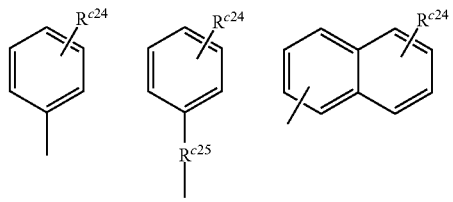

-continued

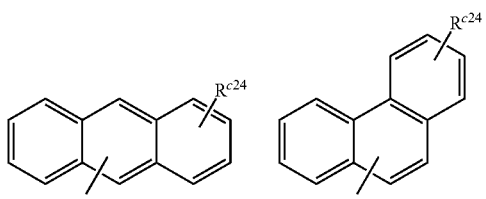

In the above formula, $R^{c24}$ denotes a hydrogen atom; a hydroxyl group; alkoxy groups such as a methoxy group, an ethoxy group, a butoxy group, and a propoxy group; hydrocarbon groups such as a methyl group, an ethyl group, a butyl group, and a propyl group. $R^{c25}$ denotes alkylene groups such as a methylene group, an ethylene group, a propylene group, and a butylene group. Note here that the above-mentioned aromatic hydrocarbon group is only required to have the above-mentioned $R^{c24}$ in at least one aromatic ring in the aromatic hydrocarbon group, and may include a plurality of $R^{c24}$. When a plurality of $R^{c24}$ are included, these $R^{c24}$ may be the same as of different from each other.

As particularly preferable $R^{c22}$, groups having structures represented by the following formulae ($R^{c22}$-a) and ($R^{c22}$-b) are preferable, and ($R^{22}$-b) is particularly preferable.

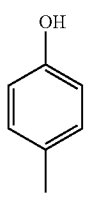

($R^{c22}$-a)

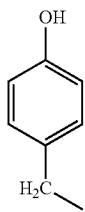

($R^{c22}$-b)

In the formula (C-1), s is preferably 0. In this case, a siloxane resin has a silsesquioxane skeleton. Furthermore, a siloxane resin is more preferably a ladder-type silsesquioxane.

In addition, it is preferable that a structural unit shown by the formula (C-1) (a unit skeleton) has the atomic number ratio of silicon atom to carbon atoms of 1 to 2 or more and 15 or less.

The siloxane resin may include two types or more of structural units shown by the formula (C-1). Furthermore, the siloxane resin may be a mixture of siloxane resins having different structural units shown by the formula (C-1). Specifically, examples of the siloxane resin including two types or more of structural units shown by the formula (C-1) include siloxane resin represented by structural unit shown by the following formulae (C-1-1) to (C-1-3).

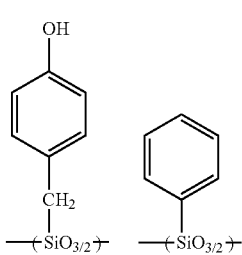

(C-1-1)

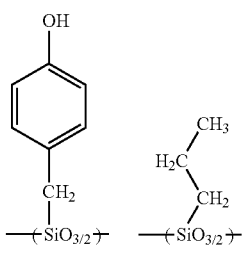

(C-1-2)

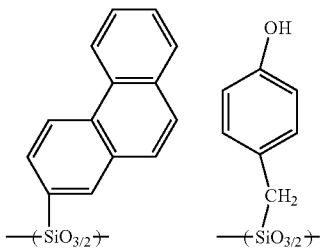

(C-1-3)

[Polysilane]

Polysilane is not particularly limited, as long as it is soluble in the solvent (S), and a structure of polysilane is not particularly limited. Polysilane may be straight-chain or a branched-chain or mesh-structured or cyclic, but straight- or branched-chain structure is preferable.

Examples of suitable polysilane include polysilane essentially including at least one unit represented by the following formulae (C-2) and (C-3), and optionally including at least one unit selected from the units represented by the following formulae (C-4), (C-5) and (C-6). Such polysilane essentially includes an alkoxy group bonded to a silanol group or a silicon atom.

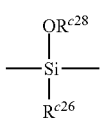

(C-2)

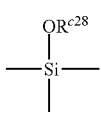

(C-3)

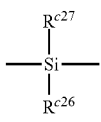

(C-4)

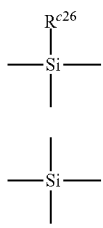
(C-5)

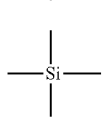
(C-6)

(In the formulae (C-2), (C-4), and (C-5), $R^{c26}$ and $R^{27}$ represent a hydrogen atom, an organic group or a silyl group. $R^{c28}$ represents a hydrogen atom or an alkyl group.)

When $R^{c28}$ is an alkyl group, an alkyl group having 1 to 4 carbon atoms is preferable, and a methyl group and an ethyl group are more preferable.

In $R^{c26}$ and $R^{c27}$, examples of the organic group include hydrocarbon groups such as an alkyl group, an alkenyl group, a cycloalkyl group, a cycloalkenyl group, an aryl group, and an aralkyl group, and an alkoxy group, an alkenyloxy group, a cycloalkoxy group, a cycloalkenyloxy group, an aryloxy group, an aralkyloxy group, and the like. Among these groups, an alkyl group, an aryl group, and an aralkyl group are preferable. Suitable examples of the alkyl group, the aryl group, and the aralkyl group are the same as in the case where $R^{c1}$ in the formula (c1) is an alkyl group, an aryl group, or an aralkyl group.

When $R^{c26}$ and $R^{c27}$ are a silyl group, examples of the silyl group include $Si_{1-10}$ silanyl group ($Si_{1-6}$ silanyl group, etc.) such as a silyl group, a disilanyl group, and a trisilanyl group.

Polysilane comprising the following units (C-7) to (C1-10) is preferable.

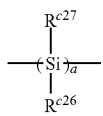
(C-7)

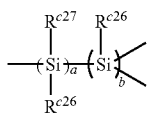
(C-8)

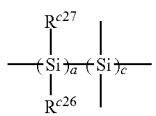
(C-9)

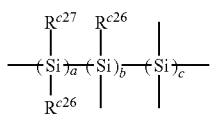
(C-10)

In (C-7) to (C-10), $R^{c26}$ and $R^{c27}$ are the same as $R^{c26}$ and $R^{c27}$ in (C-2), (C-4), and (C-5). Each of a, b, and c is an integer from 2 to 1000. Each of a, b, and c is preferably 10 to 500, and more preferably 10 to 100. Constituent unit in each unit may be included in the unit randomly or in a blocked state.

Among the above-described polysilane, the preferable polysilane includes a combination of a silanol group, an alkyl group, an aryl group or an aralkyl group each bonded to a silicon atom. More specifically, polysilane including a combination of a silanol group, a methyl group, a benzyl group, each bonded to a silicon atom, or polysilane including a combination of a silanol group, a methyl group, and a phenyl group, each bonded to a silicon atom, are preferably used.

A mass average molecular weight of polysilane is preferably 100 to 100000, more preferably 1000 to 50000, and particularly preferably 2000 to 30000.

[Silane Coupling Agent]

A silane coupling agent is bonded to or interacts with various components included in the energy-sensitive resin composition via an alkoxy group bonded to a silicon atom and/or via a reactive group, or is bonded to the surface of a support such as a substrate. Consequently, blending a silane coupling agent in the energy-sensitive resin composition improves adhesiveness between a film to be formed and a support such as a substrate.

The silane coupling agent is not particularly limited. Suitable examples of the silane coupling agent include monoalkyl trialkoxysilane such as methyltrimethoxysilane, methyltriethoxysilane, ethyltrimethoxysilane, ethyltriethoxysilane, n-propyltrimethoxysilane, n-propyltriethoxysilane, n-butyltrimethoxysilane, and n-butyltriethoxysilane; dialkyldialkoxysilane such as dimethyldimethoxysilane, and dimethyldiethoxysilane; monophenyltrialkoxysilane such as phenyltrimethoxysilane and phenyltriethoxysilane; diphenyldialkoxysilane such as diphenyldimethoxysilane and diphenyldiethoxysilane; monovinyltrialkoxysilane such as vinyltrimethoxysilane and vinyltriethoxysilane; (meth)acryloxy alkyl monoalkyl dialkoxysilane such as 3-mathacryloxypropyltrimethoxysilane, 3-methacryloxypropyltriethoxysilane, 3-methacryloxypropylmethyldimethoxysilane, and 3-methacryloxypropylmethyldiethoxysilane; (meth)acryloxyalkyl trialkoxysilane such as 3-acryloxypropyl trimethoxysilane; amino group-containing trialkoxysilane such as 3-aminopropyltrimethoxysilane, 3-aminopropyltriethoxysilane, 3-triethoxysilyl-N-(1,3-dimethyl-butylidene) propylamine, and N-phenyl-3-aminopropyltrimethoxysilane; non-alicyclic epoxy group-containing alkyl trialkoxysilane such as 3-glycidoxypropyltrimethoxysilane, 3-glycidoxypropyltriethoxysilane; non-alicyclic epoxy group-containing alkylmonoalkyldialkoxysilane such as 3-glycidoxypropylmethyldiethoxysilane; alicyclic epoxy group-containing alkyltrialkoxysilane such as 2-(3,4-epoxycyclohexyl) ethyl trimethoxysilane, 2-(3,4-epoxycyclohexyl)ethyl triethoxysilane; alicyclic epoxy group-containing alkyl monoalkyl dialkoxysilane such as 2-(3,4-epoxy cyclohexyl)ethyl methyldiethoxysilane; oxetanyl group-containing alkyltrialkoxysilane such as [(3-ethyl-3-oxetanyl)methoxy]propyl trimethoxysilane, [(3-ethyl-3-oxetanyl) methoxy]propyl triethoxysilane; mercaptoalkyl trialkoxysilane such as 3-mercaptopropyltrimethoxysilane; mercaptoalkyl monoalkyl dialkoxysilane such as 3-mercaptopropyl methyl dimethoxysilane; ureidoalkyltrialkoxysilane such as 3-ureido propyl triethoxysilane; isocyanate alkyl trialkoxysilane such as 3-isocyanate propyl triethoxysilane; acid anhydride group-containing alkyl trialkoxysilane such as 3-trimethoxysilylpropyl succinic anhydride; imide group-containing alkyl trialkoxysilane such as N-t-butyl-3-(3-trimethoxysilylpropyl)succinimide; and the like. These silane coupling agents can be used singly or in combination of two or more.

Furthermore, the compound represented by the following formula (c6) is also suitably used as a silane coupling agent.

$$R^{c29}{}_d R^{c30}{}_{(3-d)}Si\text{—}R^{c31}\text{—}NH\text{—}C(O)\text{—}Y\text{—}R^{c32}\text{—}X \quad (c6)$$

(In the formula (c6), $R^{c29}$ is an alkoxy group, $R^{c30}$ is an alkyl group, d is an integer from 1 to 3, $R^{c31}$ is an alkylene group, Y is —NH—, —O—, or —S—, $R^{c32}$ is a single bond or an alkylene group, X is a nitrogen-containing heteroaryl group which may have a substituent and may be monocyclic or polycyclic, a ring bonded to —Y—$R^{c33}$— in X is a nitrogen-containing 6-membered aromatic ring, and —Y—$R^{c33}$— is bonded to a carbon atom in the nitrogen-containing 6-membered aromatic ring.) In the formula (c6), $R^{c29}$ is an alkoxy group. The number of carbon atoms of alkoxy group of $R^{c29}$ is preferably 1 to 6, more preferably 1 to 4, and particularly preferably 1 or 2 from the viewpoint of reactivity of the silane coupling agent.

Preferable specific examples of the $R^{c29}$ include a methoxy group, an ethoxy group, an n-propoxy group, an isopropoxy group, an n-butoxy group, an isobutoxy group, a sec-butoxy group, a tert-butoxy group, an n-pentyloxy group, and an n-hexyloxy group. Among these alkoxy groups, a methoxy group and an ethoxy group are preferable.

A silanol group generated by hydrolyzing $R^{c29}$ as an alkoxy group is reacted with the surface of the substrate, so that adhesiveness of a coating film formed using an energy-sensitive resin composition to a surface of a support such as substrate tends to be improved. Therefore, d is preferably 3 from the viewpoint that adhesiveness of a coating film to a substrate such as a surface of support is easily improved.

In the formula (c6), $R^{c30}$ is an alkyl group. The number of carbon atoms of alkyl group of $R^{c30}$ is preferably 1 to 12, more preferably 1 to 6, and particularly preferably 1 or 2 from the viewpoint of reactivity of the silane coupling agent. Preferable specific examples of the $R^{c30}$ include a methyl group, an ethyl group, an n-propyl group, an isopropyl group, an n-butyl group, an isobutyl group, a sec-butyl group, a tert-butyl group, an n-pentyl group, an n-hexyl group, an n-heptyl group, an n-octyl group, an n-nonyl group, an n-decyl group, an n-undecyl group, and an n-dodecyl group.

In the formula (c6), $R^{c31}$ is an alkylene group. The number of carbon atoms of alkylene group of $R^{c31}$ is preferably 1 to 12, more preferably 1 to 6, and particularly preferably 2 to 4. Preferable specific examples of the $R^{c31}$ include a methylene group, a 1,2-ethylene group, a 1,1-ethylene group, a propane-1,3-diyl group, a propane-1,2-diyl group, a propane-1,1-diyl group, a propane-2,2-diyl group, a butane-1,4-diyl group, a butane-1,3-diyl group, a butane-1,2-diyl group, a butane-1,1-diyl group, a butane-2,2-diyl group, a butane-2,3-diyl group, a pentane-1,5-diyl group, a pentane-1,4-diyl group, and a hexane-1,6-diyl group, a heptane-1,7-diyl group, an octane-1,8-diyl group, a nonane-1,9-diyl group, a decane-1,10-diyl group, a undecane-1,11-diyl group, and a dodecane-1,12-diyl group. Among these alkylene groups, a 1,2-ethylene group, a propane-1,3-diyl group, and a butane-1,4-diyl group are preferable.

Y is —NH—, —O—, or —S—, and preferably is —NH—. A bond represented by —CO—NH— is less susceptible to hydrolysis than a bond represented by —CO—O—, or —CO—S—. Therefore, when an energy-sensitive resin composition comprising a compound in which Y is —NH— as a silane coupling agent is used, a coating film having excellent adhesiveness to a support such as substrate and the like can be formed.

$R^{c32}$ is a single bond, or an alkylene group, and preferably a single bond. Preferable examples in which $R^{c32}$ is an alkylene group are similar to that for $R^{c31}$.

X is a nitrogen-containing heteroaryl group which may have a substituent and may be monocyclic or polycyclic, and a ring bonded to —Y—$R^{c33}$— in X is a nitrogen-containing 6-membered aromatic ring, and —Y—$R^{c33}$— is bonded to a carbon atom in the nitrogen-containing 6-membered aromatic ring. Although the reason therefor is not known, use of the energy-sensitive resin composition comprising a compound having such X as a silane coupling agent makes it possible to form a coating film having excellent adhesiveness to a support such as a substrate.

In a case where X is a polycyclic heteroaryl group, the heteroaryl group may be a group in which a plurality of monocycles are condensed, or may be a group in which a plurality of monocycles are bonded to each other via a single bond. In a case where X is a polycyclic heteroaryl group, the number of rings included in the polycyclic heteroaryl group is preferably 1 to 3. In a case where X is a polycyclic heteroaryl group, a ring to be condensed or bonded to a nitrogen-containing 6-membered aromatic ring in X may or may not include a heteroatom, and may be an aromatic ring or may not be an aromatic ring.

Examples of the substituent which X as a nitrogen-containing heteroaryl group may have include an alkyl group having 1 to 6 carbon atoms, an alkoxy group having 1 to 6 carbon atoms, an alkenyl group having 2 to 6 carbon atoms, an alkenyloxy group having 2 to 6 carbon atoms, an aliphatic acyl group having 2 to 6 carbon atoms, a benzoyl group, a nitro group, a nitroso group, an amino group, a hydroxy group, a mercapto group, a cyano group, a sulfonic acid group, a carboxyl group, a halogen atom, and the like. The number of the substituents which X has is not particularly limited within a range that does not inhibit the object of the present invention. The number of the substituents which X has is preferably 5 or less, and more preferably 3 or less. In a case where X has a plurality of substituents, the plurality of substituents may be the same as or different from each other.

Preferable examples of X include groups of the following formula.

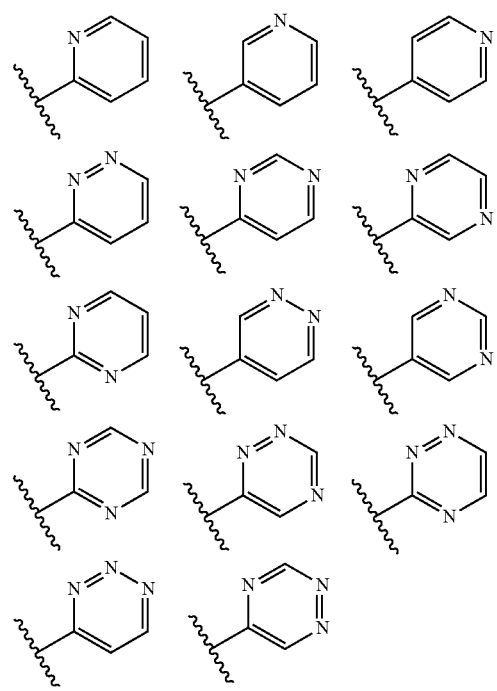

-continued
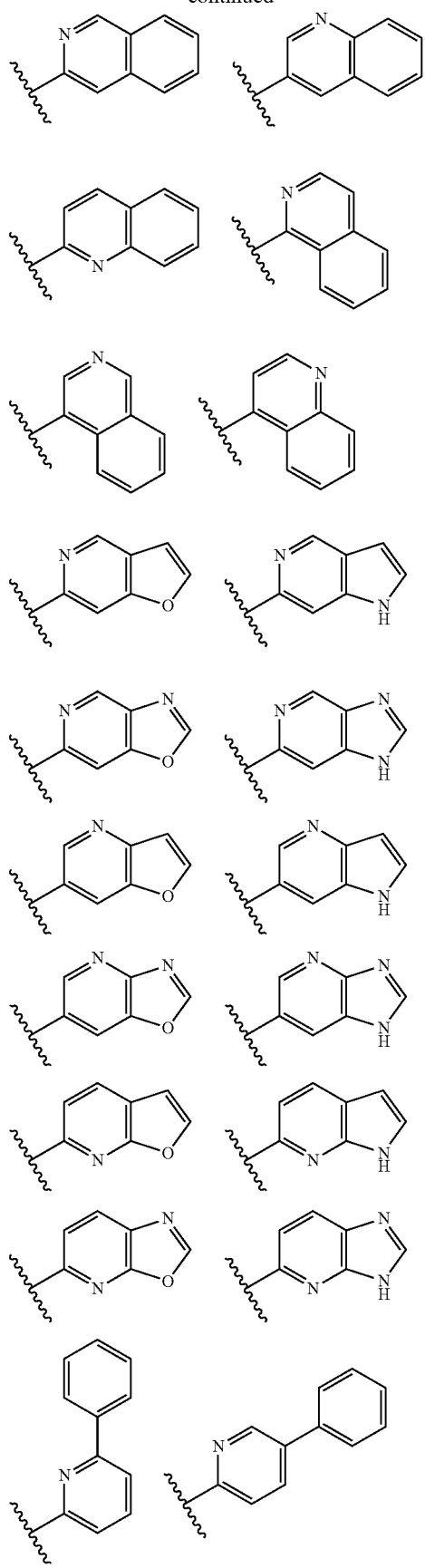
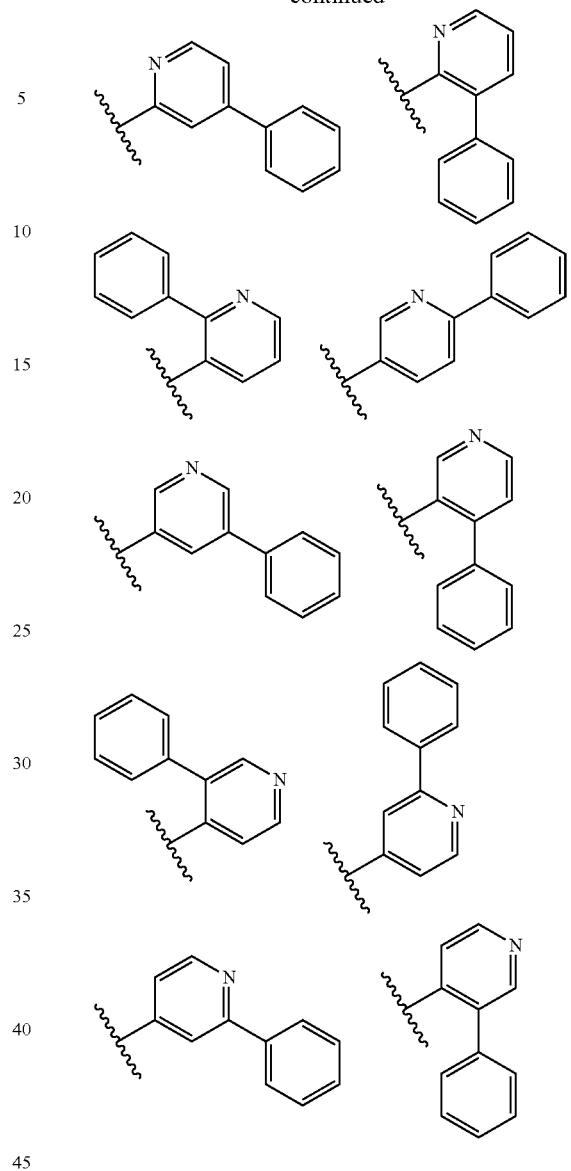
Among the above-mentioned groups, the group of the following formula is more preferable as X.
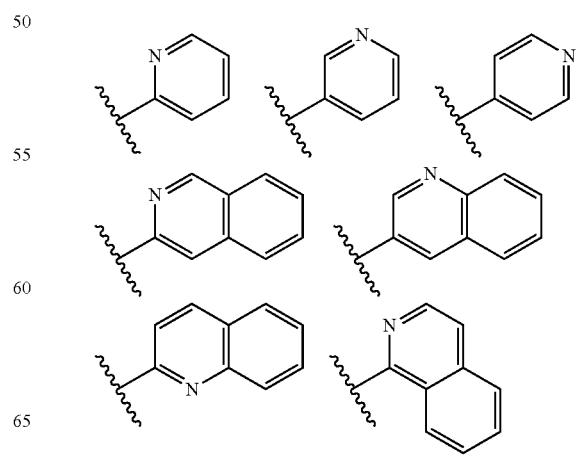

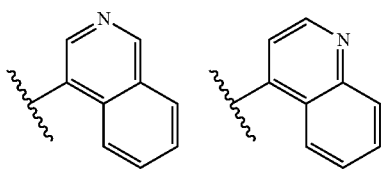

Suitable specific examples of the suitable compounds represented by the formula (c6) described above include the following compounds 1 to 8.

Compound 1
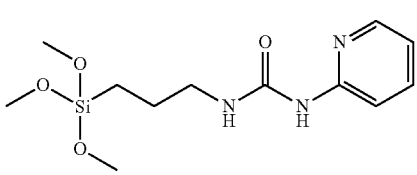

Compound 2
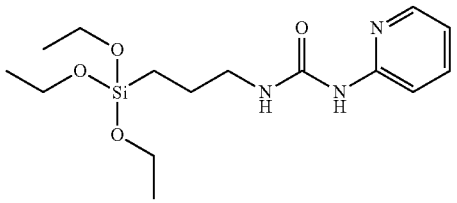

Compound 3
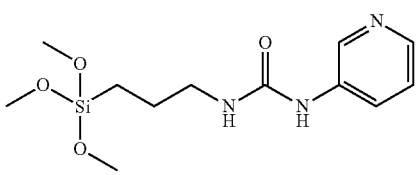

Compound 4
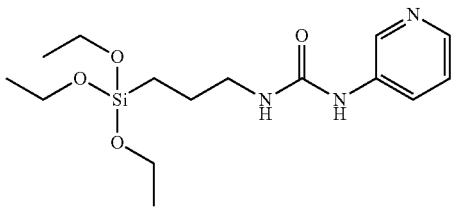

Compound 5
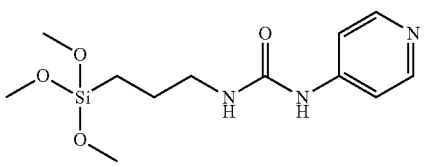

Compound 6
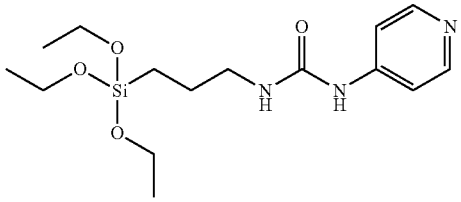

Compound 7
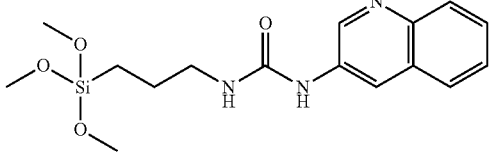

Compound 8
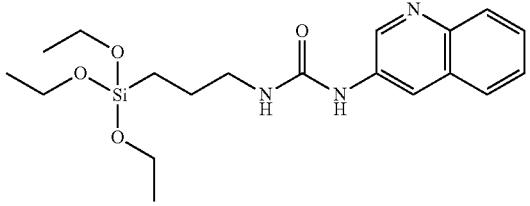

The above-described silicon-containing compound may be used singly or in combination of two or more.

The content of the above described silicon-containing compound in the energy-sensitive resin composition is preferably 0.1 to 20% by mass, more preferably 0.5 to 15% by mass, and preferably 1 to 10% by mass relative to the solid content of the composition. When the content of the silicon-containing compound in the energy-sensitive resin composition is set within the above-mentioned range, effects expected by addition of the silicon-containing compound can be sufficiently exhibited easily.

<Preparation of Energy-Sensitive Resin Composition>

A method for preparing an energy-sensitive resin composition according to the present invention is not particularly limited. For example, the energy-sensitive resin composition can be prepared by blending at least one selected from the group consisting of the above-mentioned various monomer components as a resin precursor component (B) and a precursor polymer, a solvent (S), an imidazole compound (A), and, if necessary, the above-mentioned other components.

As the resin precursor component (B), both a monomer component and a precursor polymer may be blended. However, usually, blending of only a monomer component or only a precursor polymer is sufficient. As mentioned below, it is preferable that a monomer component as the component (B) is blended and then a ring forming polymer is synthesized because the molecular weight of the ring forming polymer can be increased in the presence of an imidazole compound (A). Furthermore, it is preferable that a precursor polymer as the component (B) is blended because the ring closure efficiency of the ring forming polymer can be enhanced in the presence of the imidazole compound (A).

As the monomer component, a diamine compound, a dicarbonyl compound, or tetracarboxylic dianhydride may be used, and a combination of the (B0-1) or (B0-2) may be possible. For each monomer component, depending on the property necessary to the resulting film or molded article, an aromatic compound or an aliphatic compound may be appropriately selected. As the precursor polymer, from the viewpoint of heat resistance, tensile elongation, chemical resistance and low dielectric constant of the resulting film or the molded article, an imide ring forming polymer (B1) or an imide ring-oxazole ring forming polymer (B3) is preferable, and the imide ring forming polymer (B1) is more preferable.

It is preferable that in a case where a monomer component is blended as the resin precursor component (B), an imidazole compound (A) enables a ring forming polymer (a precursor polymer) with narrow molecular weight distribution and high molecular weight, to be obtained. For example, when a diamine compound and a monomer component comprising a dicarbonyl compound and/or a tetracarboxylic dianhydride are blended in a solvent (S), a ring forming polymer is formed by the reaction between the monomer components, but when the imidazole compound (A) is also blended, the reaction can be promoted, thus making it easy to increase a molecular weight of the ring forming polymer. It is preferable that the reaction between monomer components in the presence of the imidazole compound (A) is carried out at a temperature less than a decomposition temperature of the imidazole compound (A). The ring forming polymer can be formed at a temperature less than a decomposition temperature of the imidazole compound (A). In the presence of the imidazole compound (A), since hydrolysis reaction of the amide bond formed by reaction between the monomer components can be suppressed even at a low temperature, for example, at a temperature that is not higher than the boiling point of water, balance of the reaction between monomer components can be achieved stably in the direction of amidation, and the molecular weight of the ring forming polymer can be increased.

The energy-sensitive resin composition according to the present invention has a concept of including even those in which a monomer component as a resin precursor component (B) is blended, and preferably, a ring forming polymer is formed in the presence of an imidazole compound (A). A ring forming polymer formed by a reaction between the monomer components to be blended as the resin precursor component (B) corresponds to a precursor polymer. Therefore, the energy-sensitive resin composition comprising a ring forming polymer formed by the reaction between the monomer components blended as the resin precursor component (B) also corresponds to an energy-sensitive resin composition in which a precursor polymer as the resin precursor component (B) is blended. In other words, in the resulting energy-sensitive resin composition of the present invention, the precursor polymer as the resin precursor component (B) may be manufactured in the presence of the imidazole compound (A) as mentioned above, or may be manufactured in the absence of the imidazole compound (A).

Increase of the molecular weight by the reaction between the monomer components that has been blended as the resin precursor component (B) is applied to the case where a polymer corresponding to an oxazole ring forming polymer (B2) is formed. However, in the case where a polymer corresponding to the imide ring forming polymer (B1) or the imide ring-oxazole ring forming polymer (B3) is formed, higher effect is obtained.

In preparation of the energy-sensitive resin composition according to the present invention, order of blending (adding) of respective components is not particularly limited, and, for example, blending of the imidazole compound (A) may be carried out before or after blending of the resin precursor component (B), and both may be mixed simultaneously.

<<Method of Manufacturing a Film or a Molded Article Comprising an Imide Ring- and/or Oxazole Ring-Containing Polymer>>

The method of manufacturing a film or a molded article comprising an imide ring- and/or oxazole ring-containing polymer according to the second aspect of present invention includes: a forming step of forming a coating film or a molded article comprising the energy-sensitive resin composition according to the first aspect of the present invention; and a ring closure step of subjecting a resin precursor component (B) in the coating film or the molded article to ring closure by exposing or heating the coating film or the molded article. Below, each of the steps will be explained.

<Forming Step>

In the forming step, the energy-sensitive resin composition according to the present invention is applied to the surface of an object to be coated or molded in an appropriate molding method to form a coating film or a molded article comprising the energy-sensitive resin composition. Examples of application methods include a dipping method, a spraying method, a bar coating method, a roll coating method, a spin coating method, and a curtain coating method and the like. The thickness of a coating film is not particularly limited. Typically, the thickness of the coating film is, for example, between 0.1 to 1000 μm, preferably between 2 to 100 μm, and more preferably 3 to 50 μm. The thickness of a coating film can be appropriately controlled by means of application method or by adjusting a solid content concentration or a viscosity of an energy-sensitive resin composition. Furthermore, when a glass substrate is used as an object to be coated or a support in the below-mentioned ring closure step, a film obtained by using the energy-sensitive resin composition according to the present invention may be peeled off by, for example, UV laser. Use of UV laser at the time of peeling is a different step from exposure of a film or a molded article in the below-mentioned ring closure step.

After forming the coating film or molded article and before proceeding to a ring closure step, the coating film or the molded article may be heated in order to remove the solvent included in the coating film or the molded article. The heating temperature or the heating time is not particularly limited, as far as no heat deterioration or thermal decomposition is caused in the components comprised in the energy-sensitive resin composition. In a case where the boiling point of a solvent in the coating film or the molded article is high, the coating film or the molded article may be heated under reduced pressure.

<Ring Closure Step>

In the ring closure step, the coating film or the molded article formed in the forming step is exposed or heated so that the resin precursor component (B) in the coating film or the molded article is subjected to ring closure. Specifically, when monomer component is blended as the resin precursor component (B), a precursor polymer including a repeating unit represented by the formula (4) as a main component, in other words, the imide ring and/or oxazole ring forming polymer is formed by exposure or heating, and preferably molecular weight of these ring forming polymers is increased. A precursor polymer formed from such a monomer component is successively subjected to ring closure in the ring closure step to be changed into an imide ring- and/or oxazole ring-containing polymer. In a case where a precursor polymer is blended as the resin precursor component (B), similarly, it is subjected to ring closure and changed into an imide ring- and/or oxazole ring-containing polymer.

As mentioned above, in the ring closure step, the imide ring and/or oxazole ring forming polymer is changed into an imide ring- and/or oxazole ring-containing polymer. In other words, the imide ring forming polymer (B1) is changed into the imide ring-containing polymer (B1), the oxazole ring forming polymer (B2) is changed into the oxazole ring-containing polymer (B2), and the imide ring-oxazole ring forming polymer is changed into imide ring-oxazole ring-containing polymer, respectively. As a result of such conversion of the imide ring- and/or oxazole ring-containing polymer, a film or a molded article comprising an imide ring- and/or oxazole ring-containing polymer is formed.

Examples of radiation used for the exposure of the coating film or the molded article include ultraviolet rays, electron beams, laser beams and the like emitted from a low-pressure mercury lamp, a high-pressure mercury lamp, a metal halide lamp, a g-line stepper, an i-line stepper and the like. The amount of exposure may vary depending on the light source to be used or the thickness of a coating film or the like, but is usually 1 to 1000 mJ/cm$^2$, and preferably 10 to 500 mJ/cm$^2$. Note here that when exposure is carried out as the ring closure step, ring closure reaction of a precursor polymer (a ring forming polymer) may not be completely carried out, and may be, for example, a process to such a degree that contrast can be obtained in the below-mentioned developing step.

When the coating film or the molded article is heated, the heating temperature is set to, for example, 100 to 500° C., preferably, 120 to 350° C., and more preferably 150 to 350° C. By heating resin precursor component (B) at a temperature in such a range, it is possible to form a film or a molded article while suppressing the heat deterioration or thermal decomposition of the resulting imide ring- and/or oxazole ring-containing polymer.

Further, when the resin precursor component (B) is heated at a high temperature, a large amount of energy may be consumed or aging deterioration of treatment equipment may be accelerated at a high temperature. Therefore, it is also preferable to heat the resin precursor component (B) at relatively low temperatures also referred to as "low-temperature baking"). Specifically, the upper limit of the temperature at which the resin precursor component (B) is heated can set to be, for example, 220° C. or lower, preferably 200° C. or lower, more preferably 180° C. or lower, further preferably 160° C. or lower, and still further preferably 150° C. or lower. Even when heating is carried out at such relatively low temperatures, the present invention enables sufficient conversion into an imide ring- and/or oxazole ring-containing polymer by heating for relatively short time. Although depending on composition, thickness, and the like, of the coating film or the molded article, the lower limit value of the heating time can be set to, for example, 0.5 hours, preferably 1 hour, and more preferably 1.5 hours; and the upper limit value can be set to, for example, 4 hours, preferably 3 hours, and more preferably 2.5 hours. Such heating time can be applied to a case where heating is carried out at, for example, 130 to 150° C., typically, at 140° C.

Low-temperature baking makes is possible to increase a molecular weight of a ring forming polymer, and preferably to increase molecular weight without so much widening the molecular weight distribution. Increasing of a molecular weight of the ring forming polymer by low-temperature baking is particularly preferable in increasing a molecular weight of the ring forming polymer formed when a monomer component is blended as the resin precursor component (B). When the low-temperature baking is carried out, an imidazole compound (A) usually remains, the molecular weight of the ring forming polymer is increased by the imidazole compound (A). Thus, the resulting film or the molded article can be provided with heat resistance, tensile elongation, and chemical resistance, especially, excellent tensile elongation.

Even when heating is carried out such a relatively low temperatures, since the energy-sensitive resin composition of the present invention comprises an imidazole compound (A) represented by the formula (1a) or the formula (1), it is possible to obtain a film or a molded article comprising an imide ring-containing polymer having more excellent heat resistance, tensile elongation and chemical resistance, and lower dielectric constant than conventional imide resin, and a film or a molded article comprising an oxazole ring-containing polymer or an imide ring-oxazole ring-containing polymer having more excellent heat resistance, tensile elongation and chemical resistance than conventional benzoxazole resin. It is considered that the imidazole compound (A) represented by the formula (1a) or the formula (1) acts as a catalyst. It is considered that since the resulting film or molded article is excellent in tensile elongation, it is excellent in mechanical property.

Also as heating of the coating film or the molded article, gradual heating (also referred to as "step baking") in which low-temperature baking is carried out and then heating at a temperature higher than a heating temperature in the low-temperature baking is carried out (also referred to as "high temperature baking") may be carried out. In the high temperature baking, the upper limit of the heating temperature can be set to, for example, 500° C. or lower, preferably 450° C. or lower, more preferably 420° C. or lower, and further preferably 400° C. or lower, and the lower limit of the heating temperature can be set to, for example, more than 220° C., preferably 250° C. or higher, more preferably 300° C. or higher, further preferably 350° C. or higher, and still further preferably 380° C. or higher. Heating time in the high temperature baking depends on composition, thickness, and the like, of a coating film or a molded article, but the lower limit value may be set to, for example, 10 minutes or more, preferably about 20 minutes or more, if necessary, one hour or more, and the upper limit value can be set to, for example, 4 hours, preferably 3 hours, more preferably 2.5 hours. Such heating time can be applied to a case where heating is carried out at, for example, 390 to 410° C., typically, at 400° C. Decomposition of the imidazole compound (A) is accelerated at least in high temperature baking, and substantially complete decomposition and sublimate are also possible. Therefore, substantially no imidazole compound (A) remains in the resulting film or the molded article. Thus, a film or a molded article that is excellent in heat resistance can be obtained. Furthermore, a film or a molded article obtained by high temperature baking is preferable because it has low outgas. Furthermore, the high temperature baking is preferable because the obtained film or molded article tends to have low dielectric constant, and, in particular, such tendency is found when ring forming polymer (precursor polymer) is obtained in the presence of the imidazole compound (A). The imidazole compound (A) seems to be decomposed into imidazole and cinnamic acid.

In a case where gradual heating is carried out, low-temperature baking may be omitted. In particular, when a monomer component is blended as the resin precursor component (B), a molecular weight of a ring forming polymer can be increased in the presence of an imidazole compound (A). Even when low-temperature baking is not carried out, a sufficiently high molecular weight of ring forming polymer can be obtained.

Conversion into an imide ring- and/or oxazole ring-containing polymer can be also carried out by low-temperature baking in a manner sufficiently for the problem of the invention to be solved. For example, the ring closure reaction can be substantially completed by eliminating a not-closed ring structure, but after low-temperature baking, a not-closed ring structure may partially remain. High temperature baking enables ring closure reaction to be substantially completed.

Exposure of a coating film or a molded article formed in the forming process can be carried out in, for example, an exposure step in the below-mentioned method of manufacturing pattern. Furthermore, a coating film or a molded article can be heated in, for example, a heating step in the below-mentioned method of manufacturing pattern.

A film or a molded article obtained by using an energy-sensitive resin composition according to the present invention comprises an imide ring-containing polymer having excellent heat resistance, tensile elongation and chemical resistance, and having low dielectric constant. The film or the molded article comprises an oxazole ring-containing polymer or an imide ring-oxazole ring-containing polymer having excellent heat resistance, tensile elongation and chemical resistance. Therefore, such a film or a molded article is suitable for applications that require, in particular, heat resistance, tensile elongation and/or chemical resistance. Examples of such applications include electronic circuit board member, semiconductor device, lithium ion battery member, solar battery member, fuel battery member, motor windings, engine peripheral member, coatings, optical components, heat dissipation and electromagnetic shielding base material, an adhesive or sealant at the surge components, and the like, insulating material, substrate material, or protective material, and the like, and the application also include substitution of glass used for display material and the like, and suitable for, for example, in addition to an automotive reflector, a flexible film for display or foldable display, low moisture-permeable film or the like. A film or a molded article obtained by using the energy-sensitive resin composition according to the present invention can be formed into specific forms depending on these applications. For example, specific forms can be formed by the following method of manufacturing patterns, and the like, and formed minute patterns can be used as, for example, a microfluidic device such as a microfluidic chip and a microfluidic reactor, etc.

<<Method of Manufacturing Pattern>>

The method of manufacturing a pattern according to the third aspect of the present invention includes: a forming step of forming a coating film or a molded article comprising the energy-sensitive resin composition according to the first aspect of the present invention; an exposure step of exposing the coating film or the molded article selectively; a development step of developing the coating film or the molded article after the exposing, and a heating step of heating the coating film or the molded article after the developing.

<Forming Step>

The forming step in the method of manufacturing patterns is the same as that explained regarding the forming step in the manufacturing method of a film or a molded article comprising the imide ring- and/or oxazole ring-containing polymer, in the energy-sensitive resin composition according to the present invention.

<Exposure Step>

In the exposure step, the coating film or the molded article obtained in the forming step is exposed selectively to a predetermined pattern. Selective exposure is generally performed using a mask of predetermined patterns. The radiation used in the exposure or an amount of exposure is the same as that explained regarding the case where the coating film or the molded article is exposed in the ring closure step in the method of manufacturing the film or the molded article comprising the imide ring- and/or oxazole ring-containing polymer.

<Development Step>

In the development step, the unexposed portions are removed from the coating film or the molded article which has been exposed selectively to a predetermined pattern in the exposure step, so as to develop the coating film or the molded article. The unexposed portions are usually removed by dissolving in an alkaline developing solution. Examples of developing methods include a shower developing method, a spray developing method, a dipping developing method, and a paddle developing method. As an alkaline developing solution, an aqueous solution comprising one or more alkali compounds selected from inorganic alkali compounds and organic alkali compounds can be used. The concentration of an alkali compound in a developing solution is not particularly limited, as long as the developing solution can satisfactorily develop a coating film or a molded article after the exposing. Typically, the concentration of the alkali compound in the developing solution is preferably between 1 and 10% by mass. Examples of the inorganic alkali compounds include lithium hydroxide, sodium hydroxide, potassium hydroxide, diammonium hydrogen phosphate, dipotassium hydrogen phosphate, disodium hydrogen phosphate, lithium silicate, sodium silicate, potassium silicate, lithium carbonate, sodium carbonate, potassium carbonate, lithium borate, sodium borate, potassium borate, ammonia and the like. Examples of the organic alkali compounds include tetramethylammonium hydroxide, tetraethylammonium hydroxide, trimethylhydroxyethylammonium hydroxide, methylamine, dimethylamine, trimethylamine, monoethylamine, diethylamine, triethylamine, n-propylamine, di-n-propylamine, isopropylamine, diisopropylamine, methyldiethylamine, dimethylethanolamine, ethanolamine, triethanolamine and the like.

Further, in the developing solution, appropriate amounts of water-soluble organic solvents such as methanol, ethanol, propanol or ethylene glycol, a surfactant, a preservation stabilizer and a resin-dissolution suppressing agent can be added, as needed.

<Heating Step>

In the heating step, a coating film or a molded article in which unexposed portions have been removed so as to be developed in a predetermined pattern in the development step, is heated. Thereby, conversion from the imide ring and/or oxazole ring-containing polymer which has remained in the coating film or the molded article even after the exposure step into the imide ring- and/or oxazole ring-containing polymer is further promoted, so that such conversion becomes more sufficient. The heating temperature is similar to that explained for the case where the coating film or the molded article is heated in the ring closure step in the method of manufacturing the film or the molded article comprising the imide ring- and/or oxazole ring-containing polymer.

Even when heating is carried out at such relatively low temperatures, since an imidazole compound (A) represented by the formula (1a) or the formula (1) is comprised, it is possible to form a pattern comprising an imide ring-containing polymer having more excellent heat resistance, tensile elongation and chemical resistance and having lower dielectric constant than conventional imide resins, and a pattern comprising an oxazole ring-containing polymer or an imide ring-oxazole ring-containing polymer having more excellent heat resistance, tensile elongation and chemical resistance than conventional benzoxazole resin.

<<Permanent Film>>

A permanent film of the fourth aspect of the present invention comprises an imidazole compound (A) represented by the formula (1a) or the formula (1), and an imide ring- and/or oxazole ring-containing polymer obtained by ring-closing a precursor polymer including a repeating unit represented by the formula (4) as a main component and. When the permanent film of the present invention is formed by low-temperature baking without carrying out high-temperature baking, an imidazole compound (A) may remain. However, when the permanent film is formed by high-temperature baking, the imidazole compound (A) is decomposed by high-temperature baking, and further may be sublimated, the imidazole compound (A) does not substantially remain. The permanent film of the present invention can be suitably obtained by the method of manufacturing a film or a molded article comprising an imide ring- and/or oxazole ring-containing polymer according to the second aspect of the present invention, and by the method of forming a pattern according to the third aspect of the present invention. Even when high-temperature baking is carried in formation, a decomposition product from the component (A) (for example, the following formula (a1'-2)) is bonded to a part of an imide ring- and/or oxazole ring-containing polymer, in which a precursor polymer is reacted with the component (B) to be ring-closed, may be comprised in the permanent film. The case where a film or a molded article manufactured according to the second aspect, a pattern formed according to the third aspect, and a permanent film according to the fourth aspect comprises (A) also includes a case where it is bonded to a part of the imide ring- and/or oxazole ring-containing polymer.

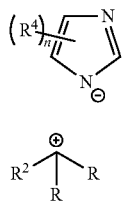

(a1'-1)

(a1'-2)

The permanent film of the present invention comprises an imidazole compound (A). Consequently, even when the permanent film is obtained by subjecting a precursor polymer to ring-closing at a relatively low temperature, the permanent film is a film comprising an imide ring-containing polymer having more excellent heat resistance, tensile elongation and chemical resistance, and lower dielectric constant than conventional imide resin, and also is a film comprising an oxazole ring-containing polymer or an imide ring-oxazole ring-containing polymer having more excellent heat resistance, tensile elongation and chemical resistance than conventional benzoxazole resin.

Therefore, the permanent film of the present invention can be used, for example, as a permanent film for liquid crystal elements or organic EL elements, and suitably as a permanent film for an organic EL element. Suitable examples of the permanent film include an insulation film, a flattened film, a partition, and the like. A partition is particularly suitable.

Suitable examples of partitions include partitions for organic EL elements, and partitions when pixels are formed by an inkjet method.

EXAMPLES

Hereinafter, the present invention will be described more specifically by way of Examples, but the present invention is not limited to these Examples.

Examples 1 to 27 and Comparative Examples 1 to 14

In the Examples and the Comparative Examples, the diamine compounds (2b), the carboxylic anhydrides, the diamine diols, the dicarbonyl compounds, the solvents, the imidazole compounds (A), and the comparative compounds shown below were used.

—Diamine Compounds (2b)
DA1: ODA: 4,4'-diaminodiphenyl ether
DA2: PPD: p-phenylenediamine
DA3: MPD: m-phenylenediamine
DA4: 2,4-TDA: 2,4-diaminotoluene
DA5: BAFL: 9,9-bis(4-aminophenyl)fluorene
DA6: BTFL: 9,9-bis(4-amino-3-methylphenyl)fluorene
DA7: BisA-P: 4,4'-[1,4-phenylenebis(1-methylethane-1,1-diyl)]dianiline
DA8: MDA: 4,4'-diaminodiphenylmethane

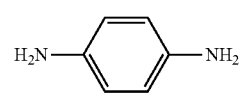

DA2

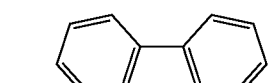

DA5

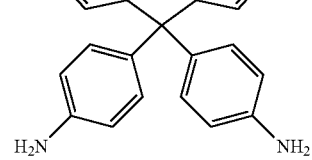

DA6

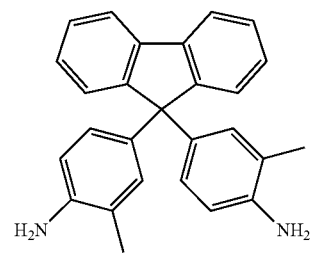

DA7

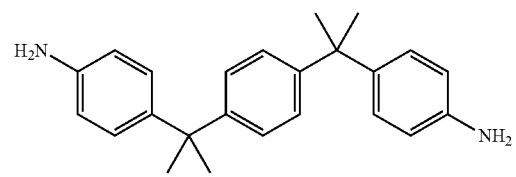

DA8

DA9: 2,2-bis[4-(4-aminophenoxy)phenyl]propane
DA10: 1,4-bis(4-amino-a,α-dimethyl benzyl)benzene
DA11: 1-(4-aminophenyl)-1,3,3-trimethyl-1H-indene-5-amine DA12: 2,2-bis[4-(4-amino phenoxy)phenyl]hexafluoropropane
—Carboxylic Anhydrides
TC1: PMDA: pyromellitic acid dianhydride
TC2: s-BPDA: 3,3',4,4'-biphenyltetracarboxylic dianhydride
TC3: α-BPDA: 2,3,3',4'-biphenyltetracarboxylic dianhydride
TC4: THPA: cis-4-cyclohexane-1,2-dicarboxylic anhydride
TC5: 1,2,4,5-cyclohexane tetracarboxylic dianhydride
PD1: following compound

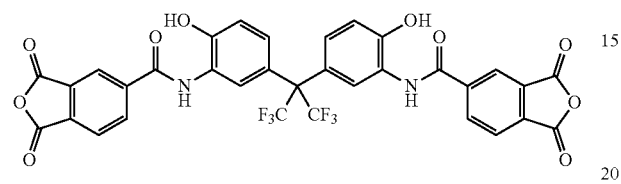

—Diamine Diols
DD1: 2,2'-bis(3-amino-4-hydroxyphenyl)hexafluoropropane
DD2: 3,3'-dihydroxybenzidine

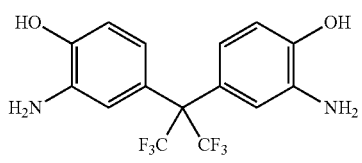

DD1

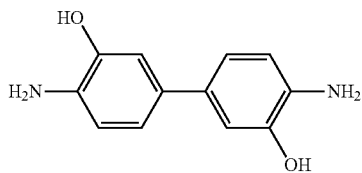

DD2

—Dicarbonyl Compounds
DK1: isophthalaldehyde
DK2: terephthalic acid dichloride

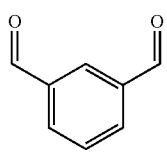

DK1

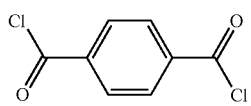

DK2

—Solvent
NMP: N-methyl-2-pyrrolidone
TMU: N,N,N',N'-tetramethylurea
DMAc: N,N-dimethylacetamide
DMIB: N,N,2-tirmethyl propionamide
—Imidazole compounds (A)
Compound 1: following chemical formula
Compound 2: following chemical formula —Comparative Compounds
Compound 3: following chemical formula
Compound 4: 2-ethyl-1-methylimidazole
Compound 5: 1-ethyl-2-methylimidazole

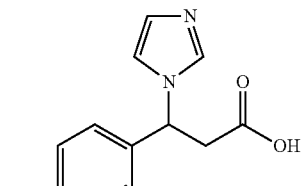

Compound 1

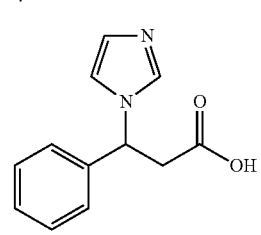

Compound 2

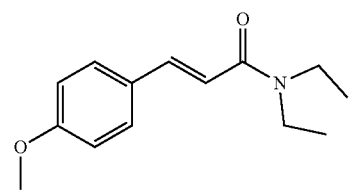

Compound 3

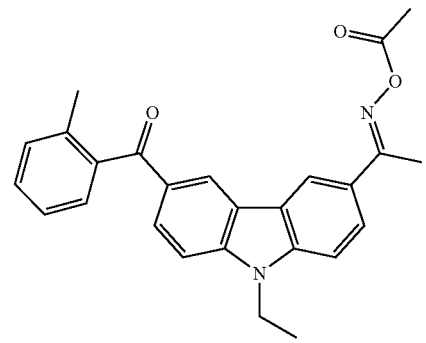

(D1)

Base generator component

Synthesis Examples of Imidazole Compound (A)

1. Synthesis Example of Compound 1

Firstly, 30 g of cinnamic acid derivative having a structure of the following formula was dissolved in 200 g of methanol, and 7 g of potassium hydroxide was added in the methanol. Then, the methanol solution was stirred at 40° C. The methanol was distilled, and residue was suspended in 200 g of water. To the resulting suspension, 200 g of tetrahydrofuran was mixed, and the mixture was stirred, followed by separation of a water phase. Under cooling in ice, 4 g of hydrochloric acid was added, and the mixture was stirred. After stirring, 100 g of ethyl acetate was mixed thereto, and the mixture was stirred. The mixed solution was allowed to stand still, followed by separation of an oil phase. A target product was crystallized from the oil phase, and precipitate was recovered to obtain an imidazole compound having the above-mentioned structure (Compound 1).

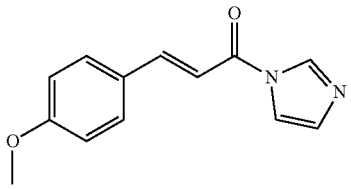 [SMILES: COc1ccc(/C=C/C(=O)n2ccnc2)cc1]

$^1$H-NMR measurement results of the compound 1 follow.
$^1$H-NMR (DMSO): 11.724 (s, 1H), 7.838 (s, 1H), 7.340 (d, 2H, J=4.3 Hz), 7.321 (d, 1H, J=7.2 Hz), 6.893 (d, 2H, J=4.3 Hz), 6.876 (d, 1H, J=6.1 Hz), 5.695 (dd, 1H, J=4.3 Hz, 3.2 Hz), 3.720 (s, 3H), 3.250 (m, 2H)

2. Synthesis Example of Compound 2

Specifically, the same Synthesis Example as for the compound 1 was carried out except that the raw material compound was changed to cinnamic acid derivative having a structure of the following formula to obtain the compound 2.

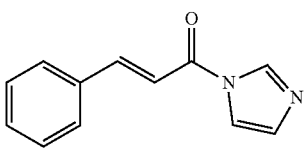 [SMILES: O=C(/C=C/c1ccccc1)n1ccnc1]

Preparation Example of Imide Ring and/or Oxazole Ring Forming Polymer

1. Imide Ring Forming Polymer (B1)

To a 5 L separable flask equipped with a stirrer, impellers, a reflux condenser, and a nitrogen gas inlet tube, carboxylic anhydride and a diamine compound (2b), of types and amounts mentioned in Table 1, respectively, and 2951 g of solvent (however, 73 g of solvent in Examples 30 to 35) were added. Nitrogen gas was introduced into the flask through the nitrogen gas inlet tube to provide the inside of the flask with an atmosphere of nitrogen. Then, the carboxylic anhydride and the diamine compound (2b) were reacted with each other at 50° C. for 20 hours while stirring the reaction mixture in the flask to obtain a solution of imide ring forming polymer (B1) (polyamic acid).

2. Oxazole Ring Forming Polymer (B2)

Preparation was carried out according to the following method. Regarding the preparation method of an oxazole ring forming polymer (B2), reaction between diamine diol and a dialdehyde compound, and the reaction between diamine diol and dicarboxylic acid dihalide are described below.
(Reaction Between Diamine Diol and Dialdehyde Compound)
To an Erlenmeyer flask provided with a rotor, diamine diol of types and amounts mentioned in Table 1, 2951 g of solvent of types and amounts mentioned in Table 1, were added. The content of the flask was stirred for 5 minutes using a magnetic stirrer. Thereafter, a dialdehyde compound (DK1) of an amount mentioned in Table 1 was added into the flask, the content of the flask was refluxed under nitrogen atmosphere for 3 hours, and reaction was performed. Next, a reaction solution was dehydrated by distillation under reduced pressure to obtain a solution of an oxazole ring forming polymer (B2) (polybenzoxazole resin). As one example, in Example 17, a number average molecular weight of the oxazole ring forming polymer (B2) was about 1500.
(Reaction Between Diamine Diol and Dicarboxylic Acid Dihalide)
To an Erlenmeyer flask provided with a rotor, diamine diol of types and amounts mentioned in Table 1, triethylamine of an amount being two times larger than the amount of diamine diol, a solvent of types mentioned in Table 1 (the amount was half of 2951 g) were added. Next, dicarboxylic acid dihalide (DK2) in an amount mentioned in Table 1 was dissolved in a solvent of types mentioned in Table 1 (the amount was half of 2951 g). The resulting solution was dropped into the Erlenmeyer flask under a nitrogen atmosphere at 0° C. for 30 minutes. After dripping, at room temperature, the reaction solution inside the Erlenmeyer flask was stirred for further 5 hours to obtain a solution of the oxazole ring forming polymer (B2).

3. Imide Ring—Oxazole Ring Forming Polymer

A solution of an imide ring-oxazole ring forming polymer was obtained in the same manner as in the preparation method of the above-mentioned "1. Imide ring forming polymer (B1)" except that PD1 was used as the carboxylic anhydride. [Preparation example of energy-sensitive resin composition]

Examples 1 to 25

To the solutions of the imide ring and/or oxazole ring forming polymer obtained in the preparation examples, any of the compounds 1 to 5 in amounts mentioned in Table 1 were added, and the mixture was stirred to prepare energy-sensitive resin compositions.

Example 26

A solution of imide ring forming polymer (B1') (polyamic acid in which component (A) remains) was obtained in the same manner as in "1. imide ring forming polymer (B1)" except that carboxylic anhydride of type and amount in Example 2, and diamine compound (2b), 2951 g of solvent were added, and further, 49.22 g of the compound 1 was added. Note here that in the solution of Example 26, since the compound 1 as the component (A) had been added in advance, unlike the above Examples (Examples 1 to 25), evaluation was carried out without further adding compound 1 after preparation of the imide ring forming polymer (B1).

Example 27

After imide ring forming polymer (B1') solution similar to that of Example 26, a base generator component (D1) was added at 5% by mass relative to the (B1') component.
[Preparation and Evaluation of Film]
Films were formed using energy-sensitive resin compositions obtained in each Example and Comparative Example according to the below-mentioned method, heat resistance, tensile elongation, chemical resistance (NMP), and dielectric constant of films were evaluated. Results are shown in Table 1. Note here that although not shown in Table 1, the energy-sensitive resin compositions of Example 27 and Example 29 are the same and include the (D1) component. The energy-sensitive resin composition of Example 28 is the same as that of Example 2.

(Heat Resistance)

The resulting energy-sensitive resin composition was applied on a wafer substrate using a spin coater (manufactured by Mikasa, 1H-360S). The applied film on the wafer substrate was heated at heating temperatures and conditions mentioned in Table 1 to form a film having a film thickness of about 0.9 μm. From the resulting film, 5 μg of film sample was scraped off for the evaluation of heat resistance. The film sample for the evaluation of heat resistance was measured on a differential thermal/thermogravimetry instrument (TG/DTA-6200, manufactured by Seiko Instruments Inc.) in an air flow, at a temperature increasing rate of 10° C./min. to obtain a TG curve. From the resulting TG curve, a 5% thermogravimetric reduction temperature of the sample was obtained. A case where the 5% thermogravimetric reduction temperature was 350° C. or higher was evaluated as good (A+; a case where it was 300° C. or higher and lower than 350° C. was evaluated as substantially good (A); a case where it was lower than 300° C. was evaluated as bad (B).

(Evaluation of Tensile Elongation)

The resulting energy-sensitive resin composition was applied on a wafer substrate using an applicator (manufactured by YOSHIMITSU SEIKI, TBA-7). The applied film on the wafer substrate was heated under conditions mentioned in Table 1 to form a film having a film thickness of about 10 μm. From the resulting film, a dumbbell test piece having a shape according to IEC450 specification was punched out to obtain a test piece for measurement of tensile elongation. The resulting test piece was subjected to measurement of rupture elongation of a film using a universal testing machine (TENSILON, manufactured by Orientec Corporation) with a distance between chucks of 20 mm and at a drawing speed of 2 mm/min. A case where the rupture elongation was 10% or more was evaluated as "A," and a case where it was less than 10% was evaluated as "B".

(Chemical Resistance/NMP Resistance)

A film thickness of about 0.9 μm was formed in the same manner as in the evaluations of the tensile elongation. On the formed film, 1 cc of NMP was dropped, the film was stood still for one minute and two minutes, and then NMP was removed. The surface state of the film after NMP had been removed was visually observed. A case where the surface of the film was not changed even after the film had been stood still for two minutes was evaluated as "A", a case where depression traces were observed on the surface after two minutes, but no change was found on the surface of the film after one minute was evaluated as "B+", and a case where depression traces remain on the surface even after one minute was evaluated as "B".

(Dielectric Constant)

A case where the dielectric constant was 3.5 or less was evaluated as very good (A+); a case where the dielectric constant was not more than 3.8 and more than 3.5 was evaluated as good (A); a case where the dielectric constant was more than 3.8 and not more than 4.2 was evaluated as slightly bad (B+); and a case where the dielectric constant was more than 4.2 was evaluated as bad (B).

Patterning Characteristic of Example 27

The resulting energy-sensitive resin composition of Example 27 was applied on a wafer substrate using a spin coater (manufactured by Mikasa Co., Ltd., 1H-360S) and pre-baked at 80° C. for 5 minutes to form a coating film having a film thickness of 1 μm. By using a mask with line and space pattern, the coating film was exposed using a high-pressure mercury lamp in the condition of 300 mJ/cm$^2$. The exposed coating film was dipped in a developing solution (a solution in which a 2.38% by mass aqueous solution of tetramethylammonium hydroxide and isopropanol are blended in a ratio of 9:1). As a result, a pattern (5 μm of 1:1 line and space pattern) in which the exposed portions, which did not dissolve in the developing solution, remained was obtained. Next, the resulting pattern was heated at 140° C. for two hours (post baking, described in the heating temperature section in Table 1).

TABLE 1

| | Carboxylic anhydride— Dicarbonyl compound | | Diamine compound— diamine diol | | imidazole compound (A) | | Solvent | Heating | Heat | Tensile | NMP | Dielectric |
|---|---|---|---|---|---|---|---|---|---|---|---|---|
| | Types | (g) | Types | (g) | Types | (g) | Types | temperature | resistance | elongation | resistance | constant |
| Example 1 | TC1 | 653.1 | DA1 | 672.30 | Compound 1 | 49.22 | NMP | 140° C. −2h | A+ | A | A | A |
| Example 2 | TC1 | 653.1 | DA1 | 672.30 | Compound 1 | 49.22 | TMU | 140° C. −2h | A+ | A | A | A |
| Example 3 | TC1 | 653.1 | DA1 | 672.30 | Compound 1 | 49.22 | DMAc | 140° C. −2h | A+ | A | A | A |
| Example 4 | TC1 | 653.1 | DA1 | 672.30 | Compound 1 | 49.22 | DMIB | 140° C. −2h | A+ | A | A | A |
| Example 5 | TC2 | 882.06 | DA1 | 672.30 | Compound 1 | 49.22 | TMU | 140° C. −2h | A+ | A | A | A |
| Example 6 | TC3 | 882.06 | DA1 | 672.30 | Compound 1 | 49.22 | TMU | 140° C. −2h | A+ | A | A | A |
| Example 7 | TC4 + TC2 | 228.07/ 441.03 | DA1 | 672.30 | Compound 1 | 49.22 | TMU | 140° C. −2h | A+ | A | A | A |
| Example 8 | TC1 | 653.1 | DA2 | 363.35 | Compound 1 | 49.22 | TMU | 140° C. −2h | A+ | A | A | A |
| Example 9 | TC1 | 653.1 | DA3 | 363.35 | Compound 1 | 49.22 | TMU | 140° C. −2h | A+ | A | A | A |
| Example 10 | TC1 | 653.1 | DA4 | 410.49 | Compound 1 | 49.22 | TMU | 140° C. −2h | A+ | A | A | A |
| Example 11 | TC1 | 653.1 | DA5 | 1170.75 | Compound 1 | 49.22 | TMU | 140° C. −2h | A+ | A | A | A |
| Example 12 | TC1 | 653.1 | DA6 | 1265 | Compound 1 | 49.22 | TMU | 140° C. −2h | A+ | A | A | A |
| Example 13 | TC1 | 653.1 | DA7 | 1157.48 | Compound 1 | 49.22 | TMU | 140° C. −2h | A+ | A | A | A |
| Example 14 | TC1 | 653.1 | DA8 | 666.15 | Compound 1 | 49.22 | TMU | 140° C. −2h | A+ | A | A | A |
| Example 15 | TC1 | 653.1 | DA1 | 672.3 | Compound 1 | 49.22 | TMU | 140° C. −2h | A | A | A | A |
| Example 16 | TC1 | 653.1 | DA1 | 672.3 | Compound 1 | 49.22 | TMU | 140° C. −2h | A+ | A | A | A |
| Example 17 | DK1 | 402.39 | DD1 | 1230.63 | Compound 1 | 49.22 | TMU | 140° C. −2h | A+ | A | A | — |
| Example 18 | DK1 | 402.39 | DD1 | 1230.63 | Compound 1 | 49.22 | NMP | 140° C. −2h | A+ | A | A | — |
| Example 19 | DK1 | 402.39 | DD1 | 1230.63 | Compound 1 | 49.22 | DMAc | 140° C. −2h | A+ | A | A | — |
| Example 20 | DK1 | 402.39 | DD1 | 1230.63 | Compound 1 | 49.22 | DMIB | 140° C. −2h | A+ | A | A | — |

TABLE 1-continued

| | Carboxylic anhydride—Dicarbonyl compound | | Diamine compound—diamine diol | | imidazole compound (A) | | Solvent | Heating temperature | Heat resistance | Tensile elongation | NMP resistance | Dielectric constant |
|---|---|---|---|---|---|---|---|---|---|---|---|---|
| | Types | (g) | Types | (g) | Types | (g) | Types | | | | | |
| Example 21 | DK2 | 609.06 | DD2 | 726.56 | Compound 1 | 49.22 | TMU | 140° C. −2h | A+ | A | A | — |
| Example 22 | PD1 | 714.07 | DA1 | 224.1 | Compound 1 | 49.22 | TMU | 140° C. −2h | A+ | A | A | — |
| Example 23 | PD1 | 714.07 | DA1 | 224.1 | Compound 1 | 49.22 | NMP | 140° C. −2h | A+ | A | A | — |
| Example 24 | PD1 | 714.07 | DA1 | 224.1 | Compound 1 | 49.22 | DMAc | 140° C. −2h | A+ | A | A | — |
| Example 25 | PD1 | 714.07 | DA1 | 224.1 | Compound 1 | 49.22 | DMIB | 140° C. −2h | A+ | A | A | — |
| Example 26 | TC1 | 653.1 | DA1 | 672.3 | Compound 1 | 49.22 | TMU | 140° C. −2h | A+ | A | A | A |
| Example 27 | TC1 | 653.1 | DA1 | 672.3 | Compound 1 | 49.22 | TMU | 140° C. −2h | A | A | A | A |
| Example 28 | TC1 | 653.1 | DA1 | 672.3 | Compound 1 | 49.22 | TMU | After heating at 140° C. −2h 320° C. −30m | A+ | A | A | A+ |
| Example 29 | TC1 | 653.1 | DA1 | 672.3 | Compound 1 | 49.22 | TMU | After heating at 140° C. −2h 320° C. −30m | A+ | A | A | A+ |
| Example 30 | TC5 | 11.2 | DA9 | 20.5 | Compound 1 | 1 | NMP | 140° C. −2h | A+ | A | A | A |
| Example 31 | TC5 | 11.2 | DA9 | 20.5 | Compound 1 | 1 | TMU | 140° C. −2h | A+ | A | A | A |
| Example 32 | TC5 | 11.2 | DA10 + DA11 | 12.1/4.0 | Compound 1 | 1 | NMP | 140° C. −2h | A+ | A | A | A |
| Example 33 | TC5 | 11.2 | DA10 + DA11 | 12.1/4.0 | Compound 1 | 1 | TMU | 140° C. −2h | A+ | A | A | A |
| Example 34 | TC5 | 11.2 | DA12 | 25.9 | Compound 1 | 1 | NMP | 140° C. −2h | A+ | A | A | A |
| Example 35 | TC5 | 11.2 | DA12 | 25.9 | Compound 1 | 1 | TMU | 140° C. −2h | A+ | A | A | A |
| Comparative Example 1 | TC1 | 653.1 | DA1 | 672.3 | Not Added | | TMU | 140° C. −2h | B | B | B | B |
| Comparative Example 2 | TC1 | 653.1 | DA1 | 672.3 | Compound 3 | | TMU | 140° C. −2h | B | B | B | B |
| Comparative Example 3 | TC1 | 653.1 | DA1 | 672.3 | Compound 4 | 22.03 | TMU | 140° C. −2h | B | B | B | B |
| Comparative Example 4 | TC1 | 653.1 | DA1 | 672.3 | Compound 5 | 22.03 | TMU | 140° C. −2h | B | B | B | B |
| Comparative Example 5 | TC1 | 653.1 | DA1 | 672.3 | Not Added | | TMU | 140° C. −2h | A+ | A | A | B |
| Comparative Example 6 | DK1 | 402.39 | DD1 | 1230.63 | Not Added | | TMU | 140° C. −2h | B | B | B | — |
| Comparative Example 7 | DK1 | 402.39 | DD1 | 1230.63 | Not Added | | NMP | 140° C. −2h | B | B | B | — |
| Comparative Example 8 | DK1 | 402.39 | DD1 | 1230.63 | Not Added | | DMAc | 140° C. −2h | B | B | B | — |
| Comparative Example 9 | DK1 | 402.39 | DD1 | 1230.63 | Not Added | | DMIB | 140° C. −2h | B | B | B | — |
| Comparative Example 10 | DK2 | 609.06 | DD2 | 726.56 | Not Added | | TMU | 140° C. −2h | B | B | B | — |
| Comparative Example 11 | PD1 | 714.07 | DA1 | 224.1 | Not Added | | TMU | 140° C. −2h | B | B | B | — |
| Comparative Example 12 | PD1 | 714.07 | DA1 | 224.1 | Not Added | | NMP | 140° C. −2h | B | B | B | — |
| Comparative Example 13 | PD1 | 714.07 | DA1 | 224.1 | Not Added | | DMAc | 140° C. −2h | B | B | B | — |
| Comparative Example 14 | PD1 | 714.07 | DA1 | 224.1 | Not Added | | DMIB | 140° C. −2h | B | B | B | — |

According to Examples 1 to 25 and Examples 30 to 35, it was shown that addition of the of the imidazole compound (A) enabled a film comprising an imide ring- and/or oxazole ring-containing polymer having excellent heat resistance, tensile elongation, and chemical resistance (NMP) to be obtained from an energy-sensitive resin composition comprising imide ring and/or oxazole ring forming polymer even if heat treatment was carried out at such a low temperature as 140° C. Further, from Examples 1 to 16, it was found that dielectric constant of the film comprising the imide ring-containing polymer (B1) was low. From Example 26, it was shown that also in a case where the imidazole compound (A) had been added in advance, a film comprising an imide ring- and/or oxazole ring-containing polymer having excellent heat resistance, tensile elongation, chemical resistance (NMP) was obtained. Furthermore, from Example 27, it was shown that patterns comprising an imide ring- and/or oxazole ring-containing polymer having excellent heat resistance, tensile elongation, and chemical resistance (NMP) were obtained. It is considered that remaining of component (D1) have an influence on the results of the heat resistance. In Examples 28 and 29 in which further high-temperature baking was carried out, improvement of dielectric constant was verified. From the comparison between Example 28 in which high-temperature baking was carried out after low-temperature baking and Example 2 in which low-temperature baking was carried out and high-temperature baking was not carried out, it was found that dielectric constant was more improved in the former case. The improvement of the dielectric constant seems to be because high-temperature baking promotes ring closure reaction of the resin precursor component (B). From the comparison between Examples 28 and 29 in which high-temperature baking was carried out after low-temperature baking in the presence of the imidazole compound (A) and Comparative Example 5 in which high-temperature baking was carried out in the absence of an imidazole compound (A) without carrying out low-temperature baking, it was shown that the dielectric constant was more improved in the former case. The improvement of the dielectric constant seems to be because low-temperature baking in the presence of an imidazole compound (A) promotes the increase of the molecular weight of the resin precursor component (B).

According to Comparative Examples 1 to 4 and 6 to 14, it was found that when the imidazole compound (A) was not added, a film with inferior heat resistance, tensile elongation, and chemical resistance (NMP) was obtained. Furthermore, from Comparative Examples 1 to 5, it was found that the dielectric constant of the film comprising an imide ring-containing polymer was high. From the comparison between Comparative Example 5 and Example 2, it was found that in order to obtain a film comprising the imide ring-containing polymer (B1) having the same level of the heat resistance, tensile elongation, and chemical resistance (NMP) as those in Example 2 for the same heating time, heating at such a high temperature as 320° C. was required. Furthermore, from Comparative Example 5, it was found that even in a film obtained in such a heating condition, when the imidazole compound (A) was not added, the dielectric constant was high.

The invention claimed is:

1. An energy-sensitive resin composition comprising an imidazole compound (A) represented by the following formula (1a), a resin precursor component (B), and a solvent (S),
wherein the resin precursor component (B) is at least one selected from the group consisting of a monomer component and a precursor polymer, wherein the monomer component comprises (i) a diamine compound represented by the following formula (2) and (ii) a dicarbonyl compound represented by the following formula (3a) and/or a tetracarboxylic dianhydride represented by the following formula (3b), and the precursor polymer is a precursor polymer having a repeating unit represented by the following formula (4):

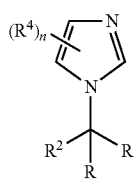

(1a)

wherein one R represents a hydrogen atom and the other R represents a monovalent organic group; $R^2$ represents an optionally substituted aromatic group; each $R^4$ independently represents a halogen atom, a hydroxyl group, a mercapto group, a sulfide group, a silyl group, a silanol group, a nitro group, a nitroso group, a sulfonato group, a phosphino group, a phosphinyl group, a phosphonato group, or an organic group; n is an integer from 0 to 3; and
the R which represents a monovalent organic group may be bonded to $R^2$ to form a cyclic structure;

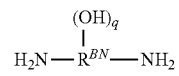

(2)

wherein $R^{BN}$ represents an organic group having a valence of (2+q), and q is an integer from 0 to 2;

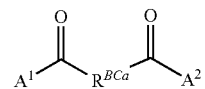

(3a)

wherein $R^{BCa}$ represents a divalent organic group; $A^1$ and $A^2$ each independently represents a hydrogen atom or a halogen atom;

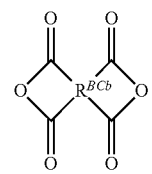

(3b)

wherein $R^{BCb}$ represents a tetravalent organic group;

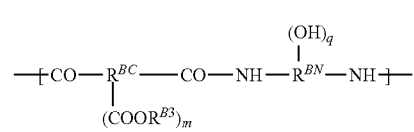

(4)

wherein $R^{BN}$ and q are as defined above; $R^{BC}$ represents an organic group having a valence of (2+m); $R^{B3}$ represents a hydrogen atom or a monovalent organic group having 1 to 20 carbon atoms; and m is an integer from 0 to 2,
wherein m+q>0 is satisfied.

2. The energy-sensitive resin composition according to claim 1, wherein the imidazole compound (A) comprises a compound represented by the following formula (1):

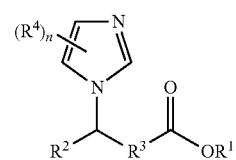

(1)

wherein $R^2$, $R^4$, and n are as defined for the formula (1a); $R^1$ represents a hydrogen atom or an alkyl group; $R^3$ represents an optionally substituted alkylene group, and $R^3$ may be bonded to $R^2$ to form a cyclic structure.

3. The energy-sensitive resin composition according to claim 1, wherein the resin precursor component (B) is at least one selected from the group consisting of:
(B1) an imide ring forming polymer (excluding a polymer of the following (B3)) obtained by reacting the tetracarboxylic dianhydride and the diamine compound with each other;

(B2) an oxazole ring forming polymer (excluding a polymer of the following (B3)) obtained by reacting a diamine diol represented by the following formula (2a) and the dicarbonyl compound represented by the formula (3a) with each other; and
(B3) an imide ring—oxazole ring forming polymer comprising a repeating unit represented by the following formula (4c) as a main component:

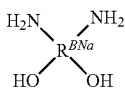
(2a)

wherein $R^{BNa}$ represents a tetravalent organic group having adjacent two carbon atoms to which each pair of an amino group and a hydroxyl group of two pairs of amino groups and hydroxyl groups included in the diamine diol represented by the formula (2a) are bonded;

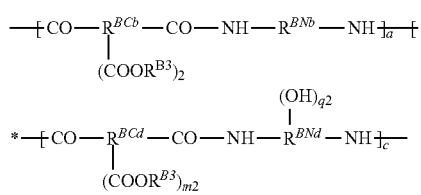
(4c)

wherein $R^{BNa}$, $R^{BCa}$, $R^{BCb}$ and $R^{B3}$ are each independently as defined above; $R^{BNb}$ represents a divalent organic group; $R^{BNd}$ represents an organic group having a valence of (2+q2); $R^{BCd}$ represents an organic group having a valence of (2+m2); m2 and q2 are each independently 1 or 2; a, b, and c are each independently an integer of 0 or more, and a bonding order among repeating units of a pieces of repeating units, b pieces of repeating units, and c pieces of repeating units is not limited to the order described in the formula (4c),
wherein a>0 and b>0 are satisfied, or c>0 is satisfied.

4. The energy-sensitive resin composition according to claim 1, wherein the imidazole compound (A) comprises a compound represented by the following formula (1-1a):

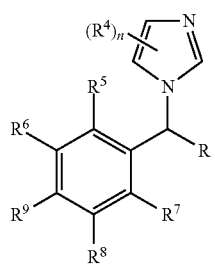
(1-1a)

wherein in the formula (1-1a), $R^4$, and n are as defined for the formula (1a) and R is the monovalent organic group; $R^5$, $R^6$, $R^7$, $R^8$, and $R^9$ each independently represents a hydrogen atom, a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group, an amino group, an ammonio group, or an organic group, wherein at least one of $R^5$, $R^6$, $R^7$, $R^8$, and $R^9$ is a group other than a hydrogen atom;
at least two of $R^5$, $R^6$, $R^7$, $R^8$, and $R^9$ may be bonded to each other to form a cyclic structure; and
R may be bonded to $R^7$ to form a cyclic structure.

5. The energy-sensitive resin composition according to claim 1, wherein the imidazole compound (A) is a compound represented by the following formula (1-1):

(1-1)

wherein in the formula (1-1), $R^1$ represents a hydrogen atom or an alkyl group; $R^3$ represents an optionally substituted alkylene group; each $R^4$ independently represents a halogen atom, a hydroxyl group, a mercapto group, a sulfide group, a silyl group, a silanol group, a nitro group, a nitroso group, a sulfonato group, a phosphino group, a phosphinyl group, a phosphonato group, or an organic group; n is an integer from 0 to 3; $R^7$, $R^8$, and $R^9$ each independently represents a hydrogen atom, a halogen atom, a hydroxyl group, a mercapto group, a sulfide group, a silyl group, a silanol group, a nitro group, a nitroso group, a sulfino group, a sulfo group, a sulfonato group, a phosphino group, a phosphinyl group, a phosphono group, a phosphonato group, an amino group, an ammonio group, or an organic group;
at least two of $R^5$, $R^6$, $R^7$, $R^8$, and $R^9$ may be bonded to each other to form a cyclic structure; and
$R^3$ may be bonded to $R^7$ to form a cyclic structure.

6. The energy-sensitive resin composition according to claim 1, wherein the solvent (S) is a solvent comprising a compound (Si) represented by the following formula (5):

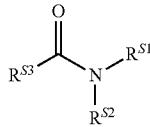
(5)

wherein, in the formula (5), $R^{S1}$ and $R^{S2}$ each independently represents an alkyl group having 1 to 3 carbon atoms; and $R^{S3}$ is a group represented by the following formula (5-1) or the following formula (5-2);

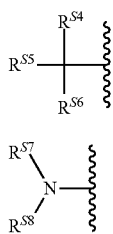
(5-1)

(5-2)

wherein in the formula (5-1), $R^{S4}$ is a hydrogen atom or a hydroxyl group; $R^{S5}$ and $R^{S6}$ each independently represents an alkyl group having 1 to 3 carbon atoms, and in the formula (5-2), $R^{S7}$ and $R^{S8}$ each independently represents a hydrogen atom, or an alkyl group having 1 to 3 carbon atoms.

7. The energy-sensitive resin composition according to claim 1, further comprising a base generator component that generates a base by exposure.

8. A method of manufacturing a film or a molded article comprising an imide ring- and/or oxazole ring-containing polymer, the method comprising:
forming a coating film or a molded article comprising the energy-sensitive resin composition according to claim 1; and
ring-closing the resin precursor component (B) in the coating film or the molded article by exposing or heating the coating film or the molded article;
wherein the resin precursor component (B) is the precursor polymer having a repeating unit represented by formula (4).

9. A method of forming a pattern, the method comprising:
a formation step of forming a coating film or a molded article comprising the energy-sensitive resin composition according to claim 1;
selectively exposing the coating film or the molded article;
developing the coating film or the molded article after the exposing, and
heating the coating film or the molded article after the developing.

10. A permanent film comprising:
an imidazole compound (A) represented by the following formula (1a);
an imide ring- and/or oxazole ring-containing polymer obtained by ring-closing a precursor polymer comprising a repeating unit represented by the following formula (4) as a main component:

(1a)

wherein one R represents a hydrogen atom and the other R represents a monovalent organic group; $R^2$ represents an optionally substituted aromatic group; each $R^4$ independently represents a halogen atom, a hydroxyl group, a mercapto group, a sulfide group, a silyl group, a silanol group, a nitro group, a nitroso group, a sulfonato group, a phosphino group, a phosphinyl group, a phosphonato group, or an organic group; n is an integer from 0 to 3; and
the R which represents a monovalent organic group may be bonded to $R^2$ to form a cyclic structure;

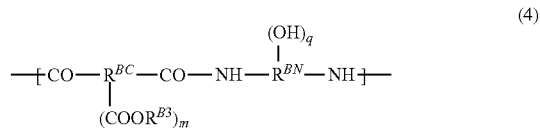
(4)

wherein $R^{BN}$ represents an organic group having a valence of (2+q); q is an integer from 0 to 2; $R^{BC}$ represents an organic group having a valence of (2+m); $R^{B3}$ represents a hydrogen atom or a monovalent organic group having 1 to 20 carbon atoms; and m is an integer from 0 to 2,
wherein m+q>0 is satisfied.

11. The permanent film according to claim 10, wherein the imidazole compound (A) comprises a compound represented by the following formula (1):

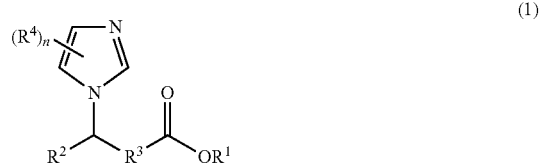
(1)

wherein $R^2$, $R^4$ and n are as defined for the formula (1a), $R^1$ represents a hydrogen atom or an alkyl group, $R^3$ represents an optionally substituted alkylene group; and
$R^3$ may be bonded to $R^2$ to form a cyclic structure.

12. The energy-sensitive resin composition according to claim 1, wherein, in the formula (1a), the monovalent organic group as the other R is an optionally substituted alkyl group or an optionally substituted aromatic group.

13. The energy-sensitive resin composition according to claim 4, wherein the monovalent organic group is an optionally substituted alkyl group or an optionally substituted aromatic group.

14. The energy-sensitive resin composition according to claim 1, wherein, in the formula (1a), the monovalent organic group as the other R is an optionally substituted alkyl group.

15. The energy-sensitive resin composition according to claim 4, wherein the monovalent organic group is an optionally substituted alkyl group.

16. The energy-sensitive resin composition according to claim 1, wherein n is zero.

17. The permanent film according to claim 10, wherein n is zero.

* * * * *